US009496653B2

(12) United States Patent
Little et al.

(10) Patent No.: US 9,496,653 B2
(45) Date of Patent: Nov. 15, 2016

(54) FLIPPABLE ELECTRICAL CONNECTOR

(71) Applicant: FOXCONN INTERCONNECT TECHNOLOGY LIMITED, Grand Cayman (KY)

(72) Inventors: Terrance F. Little, Fullerton, CA (US); Chih-Pi Cheng, New Taipei (TW); (Continued)

(73) Assignee: FOXCONN INTERCONNECT TECHNOLOGY LIMITED, Grand Cayman (KY)

(*) Notice: Subject to any disclaimer, the term of this patent is extended or adjusted under 35 U.S.C. 154(b) by 0 days.

(21) Appl. No.: 14/695,065

(22) Filed: Apr. 24, 2015

(65) Prior Publication Data
US 2015/0229077 A1    Aug. 13, 2015

Related U.S. Application Data

(63) Continuation-in-part of application No. 14/688,993, filed on Apr. 16, 2015, and a continuation-in-part of (Continued)

(30) Foreign Application Priority Data

Apr. 25, 2014    (TW) .............................. 103114986 A

(51) Int. Cl.
*H01R 24/00*    (2011.01)
*H01R 13/6581*    (2011.01)
(Continued)

(52) U.S. Cl.
CPC ...... *H01R 13/6581* (2013.01); *H01R 13/6582* (2013.01); *H01R 13/6658* (2013.01);
(Continued)

(58) Field of Classification Search
CPC .............. H01R 23/7073; H01R 23/725; H01R 23/688; H01R 13/26; H01R 13/658
(Continued)

(56) References Cited

U.S. PATENT DOCUMENTS 5,073,130 A    12/1991 Nakamura
6,755,689 B2    6/2004 Zhang et al.
(Continued)

FOREIGN PATENT DOCUMENTS

CM    CN201868687 U    6/2011
CN    201029143 Y    2/2008
(Continued)

OTHER PUBLICATIONS

Universal Serial Bus Type-C Cable and Connector Specification Revision 0.7 Working Draft Jan. xx, 2014, p. 13-14,20-21,33,38.
(Continued)

*Primary Examiner* — Hien Vu
(74) *Attorney, Agent, or Firm* — Wei Te Chung; Ming Chieh Chang

(57) ABSTRACT

A receptacle connector includes an insulative housing with a mating tongue, a plurality of contacts having front contacting sections exposed upon two opposite surfaces of the mating tongue and rear tail sections extending downwardly outside of the housing for mounting to a printed circuit board. A metallic shield encloses said housing and forms a capsular mating cavity with said mating tongue extending forwardly therein. A metallic shielding plate includes a front horizontal section embedded with the mating tongue to isolate the contacting sections of the contacts which are located on two different opposite surfaces, and a rear vertical section extending downwardly from a rear edge of the front
(Continued)

horizontal section to isolate the tail sections of the contacts which are arranged in two rows with said rear vertical section therebewteen.

9 Claims, 71 Drawing Sheets

(72) Inventors: Chao-Chieh Chen, New Taipei (TW); Chun-Chieh Yang, New Taipei (TW); Hsueh-Lung Hsiao, New Taipei (TW); Yuan Zhang, Rowland-Heights, CA (US); Wei-Hao Su, New Taipei (TW); Stephen Sedio, Valley Center, CA (US); Ming-Ching Chen, New Taipei (TW)

Related U.S. Application Data application No. 14/558,732, filed on Dec. 3, 2014, application No. 14/695,065, which is a continuation-in-part of application No. 14/542,550, filed on Nov. 15, 2014, now Pat. No. 9,350,126, and a continuation-in-part of application No. 14/497,205, filed on Sep. 25, 2014, application No. 14/695,065, which is a continuation-in-part of application No. 14/477,889, filed on Sep. 5, 2014, application No. 14/695,065, which is a continuation-in-part of application No. 14/454,737, filed on Aug. 8, 2014, application No. 14/695,065, which is a continuation-in-part of application No. 14/337,180, filed on Jul. 21, 2014, now Pat. No. 9,318,853, application No. 14/695,065, which is a continuation-in-part of application No. 14/517,941, filed on Oct. 20, 2014.

(60) Provisional application No. 62/002,934, filed on May 26, 2014, provisional application No. 62/021,066, filed on Jul. 4, 2014, provisional application No. 62/026,046, filed on Jul. 18, 2014, provisional application No. 62/035,472, filed on Aug. 10, 2014, provisional application No. 61/981,217, filed on Apr. 18, 2014, provisional application No. 61/989,508, filed on May 6, 2014, provisional application No. 62/001,084, filed on May 21, 2014, provisional application No. 61/940,815, filed on Feb. 17, 2014, provisional application No. 61/943,310, filed on Feb. 22, 2014, provisional application No. 61/949,232, filed on Mar. 6, 2014, provisional application No. 61/917,363, filed on Dec. 18, 2013, provisional application No. 61/926,270, filed on Jan. 11, 2014, provisional application No. 61/916,147, filed on Dec. 14, 2013, provisional application No. 61/919,681, filed on Dec. 20, 2013, provisional application No. 61/875,096, filed on Sep. 8, 2013, provisional application No. 61/863,896, filed on Aug. 8, 2013, provisional application No. 61/866,037, filed on Aug. 14, 2013, provisional application No. 61/867,584, filed on Aug. 19, 2013, provisional application No. 61/856,077, filed on Jul. 19, 2013, provisional application No. 61/857,687, filed on Jul. 23, 2013, provisional application No. 61/899,276, filed on Nov. 3, 2013.

(51) Int. Cl.
*H01R 24/60* (2011.01)
*H01R 13/6582* (2011.01)
*H01R 13/66* (2006.01)
*H01R 107/00* (2006.01)
*H01R 12/72* (2011.01)
*H01R 13/642* (2006.01)
*H01R 24/28* (2011.01)
*H05K 1/11* (2006.01)
*H05K 1/18* (2006.01)

(52) U.S. Cl.
CPC ............ *H01R 24/60* (2013.01); *H01R 12/724* (2013.01); *H01R 13/642* (2013.01); *H01R 24/28* (2013.01); *H01R 2107/00* (2013.01); *H05K 1/117* (2013.01); *H05K 1/184* (2013.01); *H05K 2201/09063* (2013.01); *H05K 2201/10189* (2013.01)

(58) Field of Classification Search
USPC ........................................................ 439/660
See application file for complete search history.

(56) References Cited

U.S. PATENT DOCUMENTS

| | | | |
|---|---|---|---|
| 7,758,379 | B2 | 7/2010 | Chen |
| 8,087,944 | B2 | 1/2012 | Kumamoto et al. |
| 8,517,773 | B2 | 8/2013 | Lee et al. |
| 8,968,031 | B2 | 3/2015 | Simmel et al. |
| 9,281,642 | B1* | 3/2016 | Tseng ............... H01R 24/60 |
| 9,300,095 | B2* | 3/2016 | Lin ................... H01R 24/60 |
| 9,312,641 | B2* | 4/2016 | Wang ............... H01R 13/6585 |
| 9,318,856 | B2* | 4/2016 | MacDougall ...... H01R 13/6581 |
| 9,379,499 | B2* | 6/2016 | Miyoshi ............ H01R 24/60 |
| 2009/0156027 | A1 | 6/2009 | Chen |
| 2010/0267261 | A1 | 10/2010 | Lin |
| 2013/0095702 | A1 | 4/2013 | Golko et al. |
| 2014/0024257 | A1 | 1/2014 | Castillo et al. |
| 2014/0357124 | A1 | 12/2014 | Zhao et al. |
| 2015/0056839 | A1 | 2/2015 | Zhang |
| 2015/0162684 | A1 | 6/2015 | Amini et al. |
| 2015/0171562 | A1 | 6/2015 | Gao et al. |
| 2015/0214673 | A1 | 7/2015 | Gao et al. |
| 2015/0214674 | A1 | 7/2015 | Simmel et al. |
| 2015/0295362 | A1 | 10/2015 | Tziviskos et al. |
| 2015/0340813 | A1 | 11/2015 | Ng et al. |
| 2015/0340815 | A1 | 11/2015 | Gao et al. |
| 2015/0340825 | A1 | 11/2015 | Ng et al. |
| 2016/0118752 | A1 | 4/2016 | Guo et al. |

FOREIGN PATENT DOCUMENTS

| | | |
|---|---|---|
| CN | 201230066 Y | 4/2009 |
| CN | 101573840 A | 11/2009 |
| CN | 201623280 U | 11/2010 |
| CN | 201741935 U | 2/2011 |
| CN | 201741937 U | 2/2011 |
| CN | 102437482 A | 5/2012 |
| CN | 102544812 A | 7/2012 |
| CN | 202423735 | 9/2012 |
| CN | 202737282 | 2/2013 |
| CN | 103081253 A | 5/2013 |
| CN | 203242848 U | 10/2013 |
| CN | 203481540 U | 3/2014 |
| TW | M288035 | 2/2006 |
| TW | M357077 | 5/2009 |
| TW | M391213 | 10/2010 |
| TW | I427870 | 6/2011 |
| TW | M414692 | 10/2011 |
| TW | M443957 | 12/2012 |
| TW | M453995 | 5/2013 |
| TW | M454654 | 6/2013 |
| TW | M471688 | 2/2014 |
| WO | WO2009147791 | 12/2009 |
| WO | WO2013/020359 | 2/2013 |

OTHER PUBLICATIONS

USB Type-C Specification 0.9c05—20140518, p. 24-44,47,53-64,84-86.

(56) References Cited

OTHER PUBLICATIONS

Universal Serial Bus Type-C Cable and Connector Specification Revision 1.0 Aug. 11, 2014, p. 18-19,28-48,51,55,58,59-63,65-67,70,93,96-99.

* cited by examiner

FLIPPABLE ELECTRICAL CONNECTOR

CROSS REFERENCE TO RELATED APPLICATIONS

This application is a continuation-in-part of the co-pending application Ser. No. 14/558,732 filed Dec. 3, 2014, and Ser. No. 14/688,993 filed Apr. 16, 2015, and the instant application further claims the benefit of, and priority to, U.S. Provisional Patent Application No. 62/002,934 filed May 26, 2014, No. 62/021,066 filed Jul. 4, 2014, No. 62/026,046 filed Jul. 18, 2014 and NO. 62/035,472 filed Aug. 10, 2014, the contents of which are incorporated entirely herein by reference.

BACKGROUND OF THE INVENTION

1. Field of the Invention

The present invention relates to an electrical connector, and more particularly to a flippable plug connector used with a receptacle connector.

2. Description of Related Art

In the previously filed provisional applications, the plug connector is "flippable" whereas we turn the plug over and it functions the same top and bottom. In order to be able to handle switching of the super speed signaling, a MUX (or SS switch) is built into the silicon. This can be costly and also cause some additional degredation in the super speed signals. Recently, a proposal for use with the future USB (Universal Serial Bus) was presented.

Hence, a new and simple electrical plug connector and the complementary receptacle connector are desired to improve those disclosed in the aforementioned proposal.

SUMMARY OF THE INVENTION

Accordingly, the object of the present invention is to provide a flippable plug connector and a complementary receptacle connector wherein the receptacle connector includes an insulative housing with a mating tongue, a plurality of contacts having front contacting sections exposed upon two opposite surfaces of the mating tongue and rear tail sections extending downwardly outside of the housing for mounting to a printed circuit board. A metallic shield encloses said housing and forms a capsular mating cavity with said mating tongue extending forwardly therein. A metallic shielding plate includes a front horizontal section embedded with the mating tongue to isolate the contacting sections of the contacts which are located on two different opposite surfaces, and a rear vertical section extending downwardly from a rear edge of the front horizontal section to isolate the tail sections of the contacts which are arranged in two rows with said rear vertical section therebetween. The plug connector forms a capsular front contour and includes an insulative housing defining a rectangular receiving cavity therein and enclosed in the metallic shell. Two upper and lower rows of contacts are disposed in the housing with corresponding contacting sections extending into two opposite upper and lower sides the receiving cavity wherein the upper and lower rows of contacts are diagonally symmetrically arranged with each other in both electrical and mechanical arrangement so as to meet the so-called flappable mating, i.e., the dual orientations. A pair of EMI (Electro-Magnetic Interference) plates are disposed within the shell and each of the EMI plates is sandwiched between the housing and the shell, and has a front region extending inwardly toward the receiving cavity and located in front of the contacting sections of the contacts, a rear region resiliently contacting the shell, and a pair of opposite side regions having a retention structure to retain to side portions of the housing. A metallic latch is assembled to the housing with a pair of locking heads extending into two opposite lateral sides of the receiving cavity. A paddle card is located behind the housing, and the tails of the contacts are mounted to the front region of the paddle card while a cable is linked to a rear region of the paddle card. The metallic latch is optionally electrically and mechanically connected to a grounding area of the paddle card.

Other objects, advantages and novel features of the invention will become more apparent from the following detailed description when taken in conjunction with the accompanying drawings.

DETAILED DESCRIPTION OF THE PREFERRED EMBODIMENT

Figure 1:
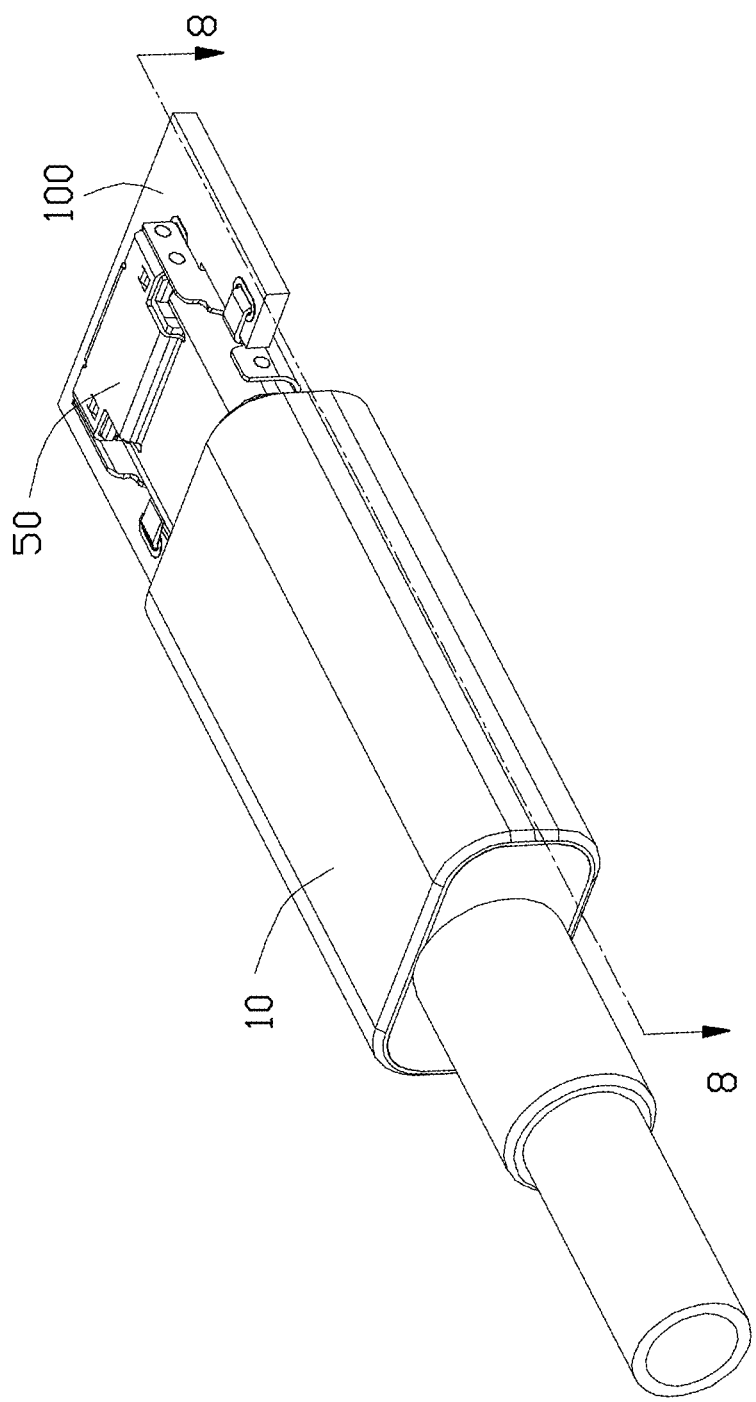
FIG. 1 is an assembled perspective view of a mated receptacle connector on a printed circuit board and a plug connector of a first embodiment of the instant invention.
Figure 2:
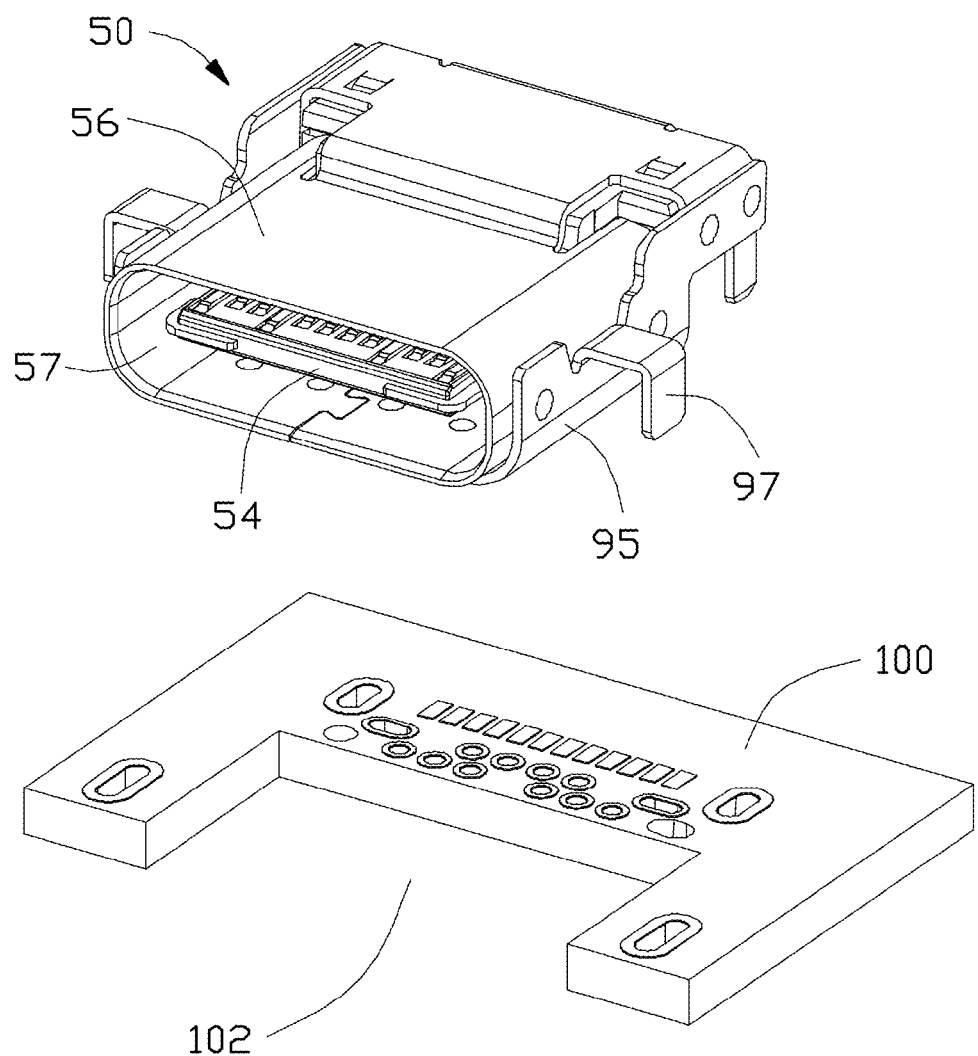
FIG. 2 is a front perspective view of the receptacle connector spaced from the printed circuit board of FIG. 1.
Figure 3:
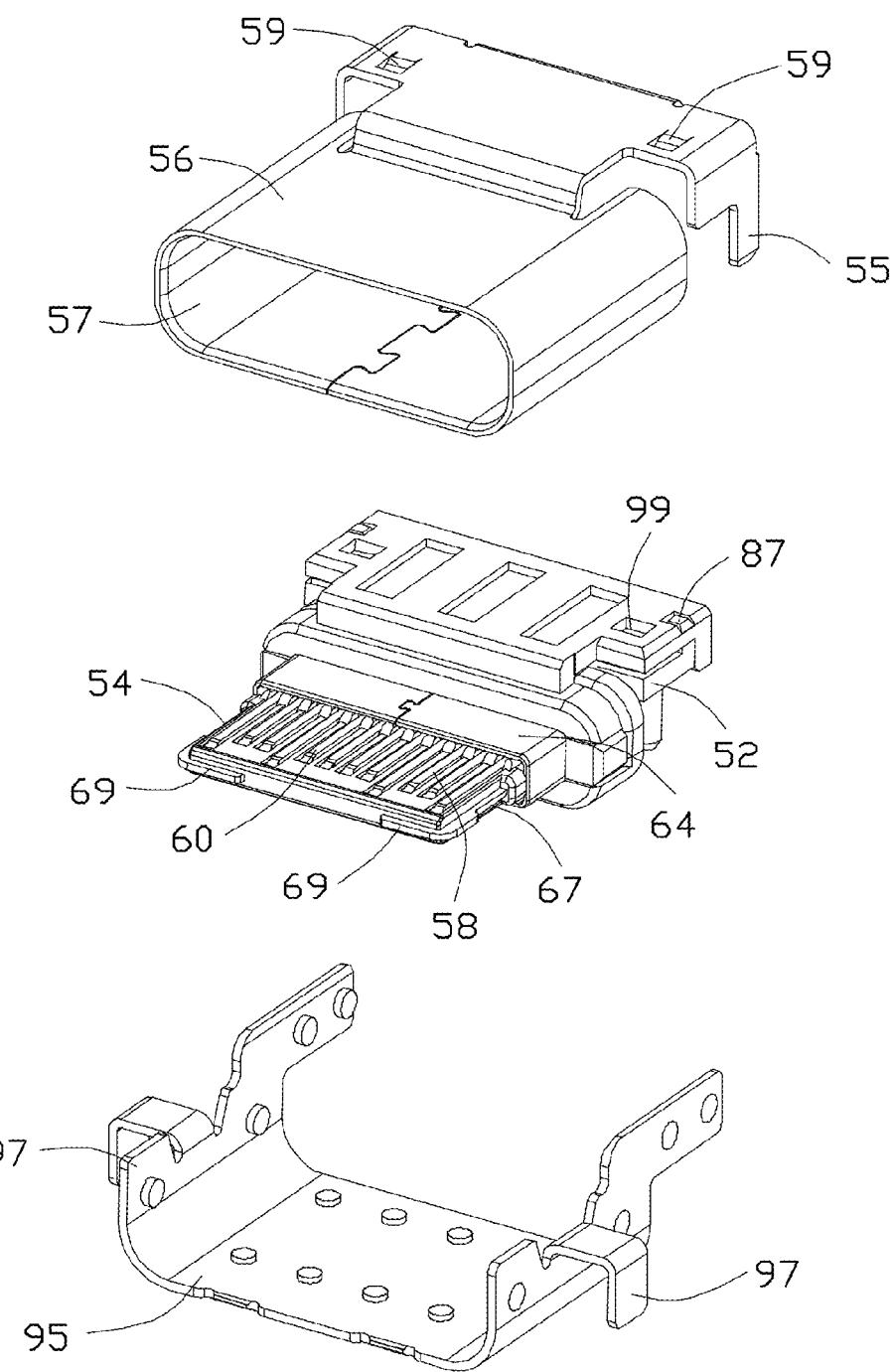
FIG. 3 is a front partially exploded perspective view of the receptacle connector of FIG. 2.
Figure 4:
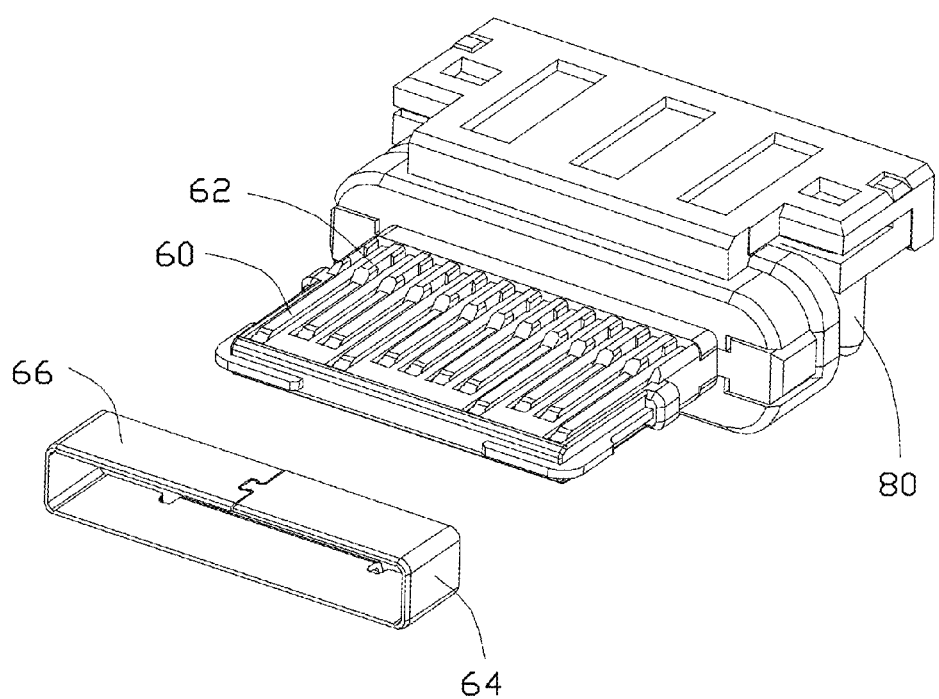
FIG. 4 is a front partially exploded perspective view of the receptacle connector of FIG. 2 without the shield thereof.
Figure 5:
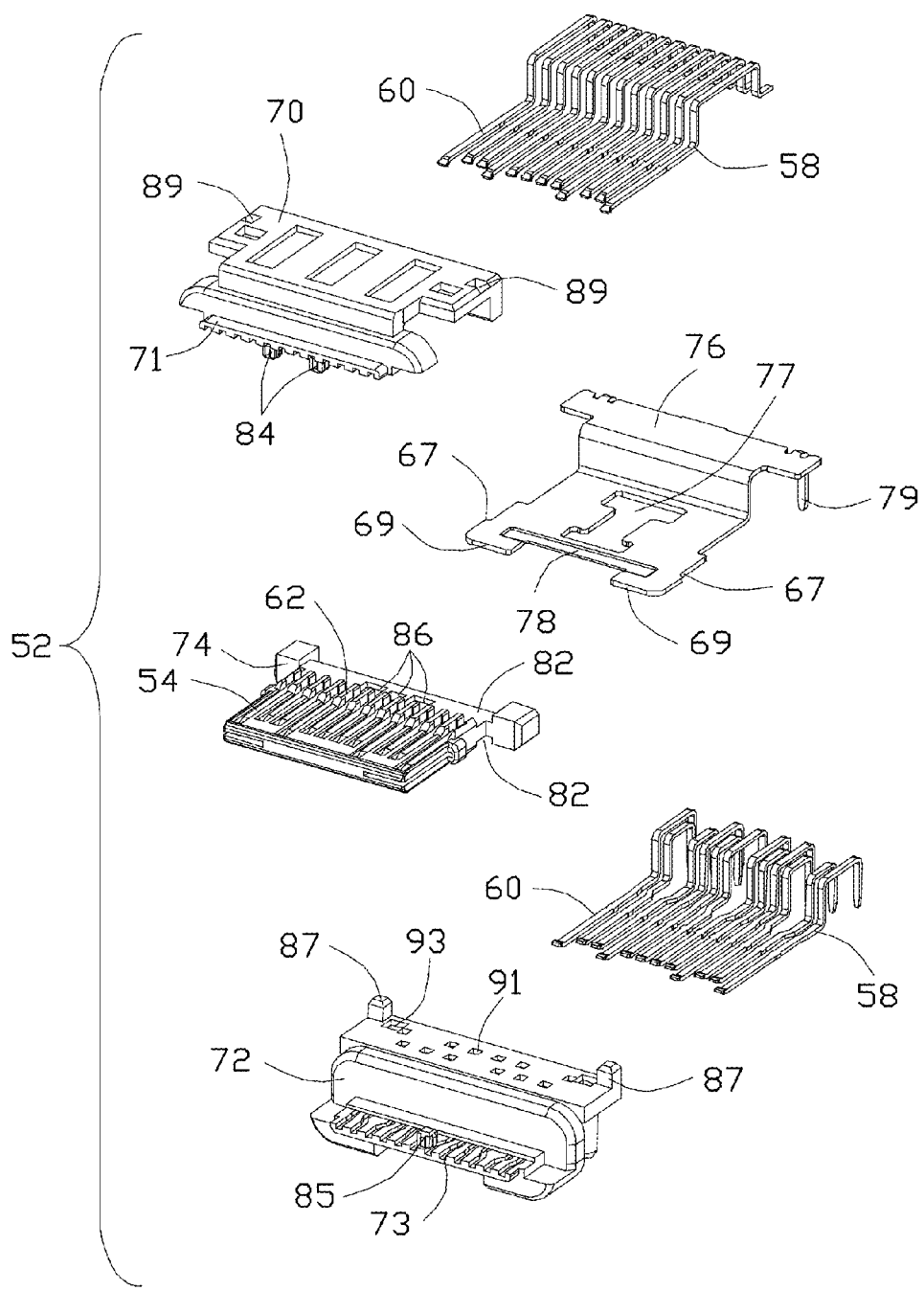
FIG. 5 is a front partially exploded perspective view of the receptacle connector of FIG. 4 to show the housing and the contacts thereof.
Figure 6:
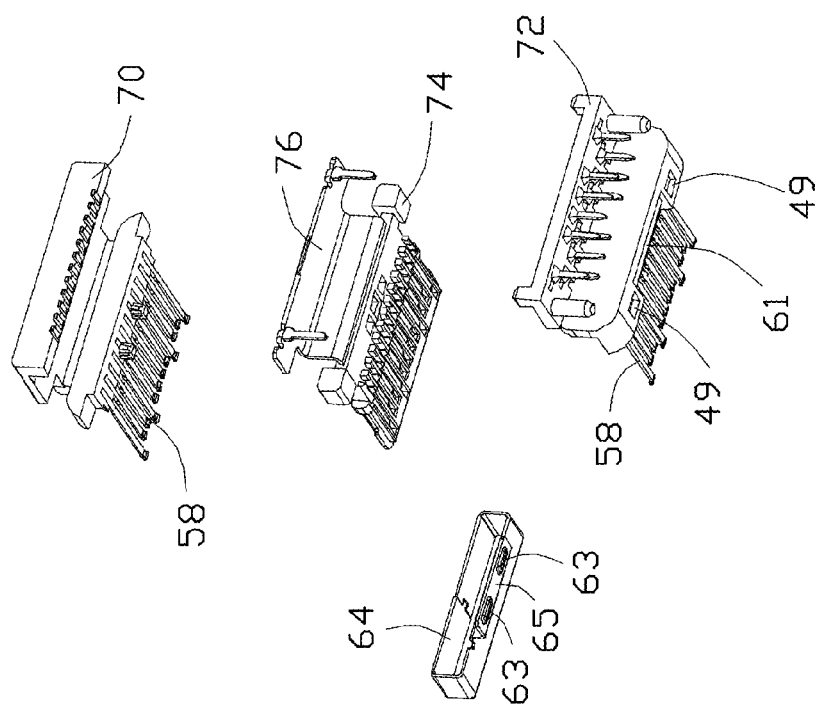
FIG. 6 is a rear partially exploded perspective view of the receptacle connector of FIG. 2 wherein the housing and the contacts are pre-assembled together.
Figure 7:
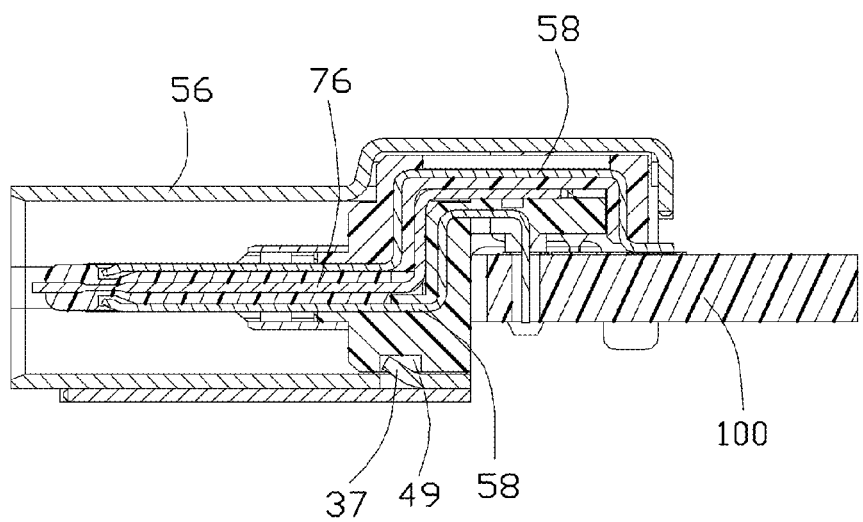
FIG. 7 is a cross-sectional view of the receptacle connector on the printed circuit board of FIG. 2 to show the retention tang of the shield.
Figure 7A:
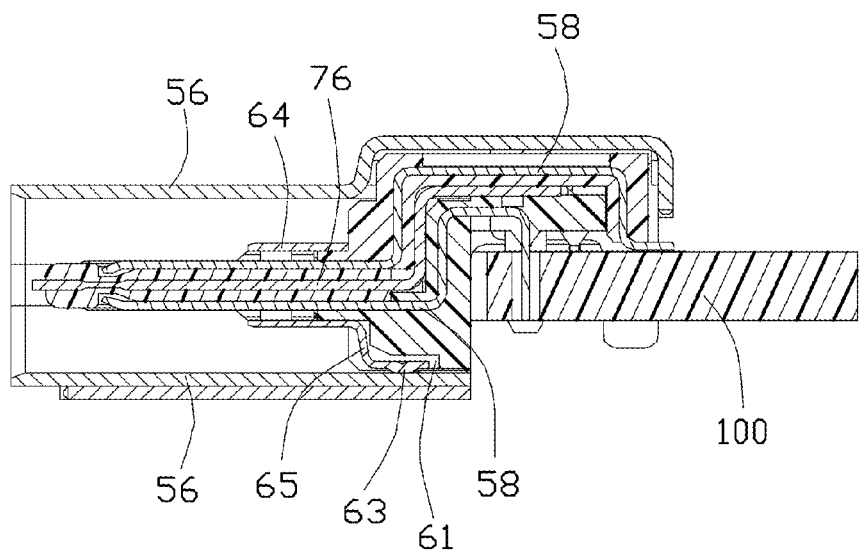
FIG. 7(A) is a cross-sectional view of the receptacle connector to show the extending plate of the collar.
Figure 8:
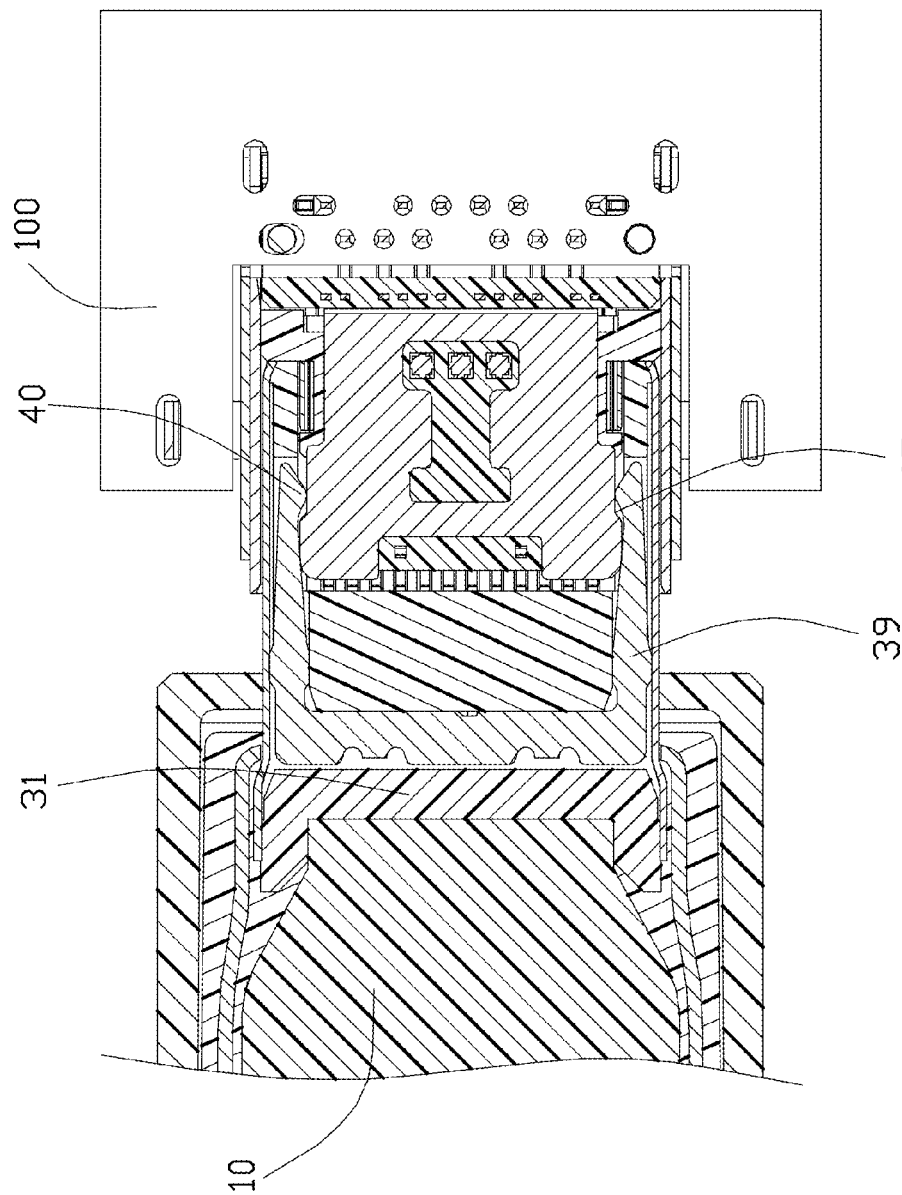
FIG. 8 is a cross-sectional view of the mated plug connector and receptacle connector taken along lines 8-8 of FIG. 1 to show how the latch of the plug connector is lockable engaged with the shielding plate of the receptacle connector.
Figure 9:
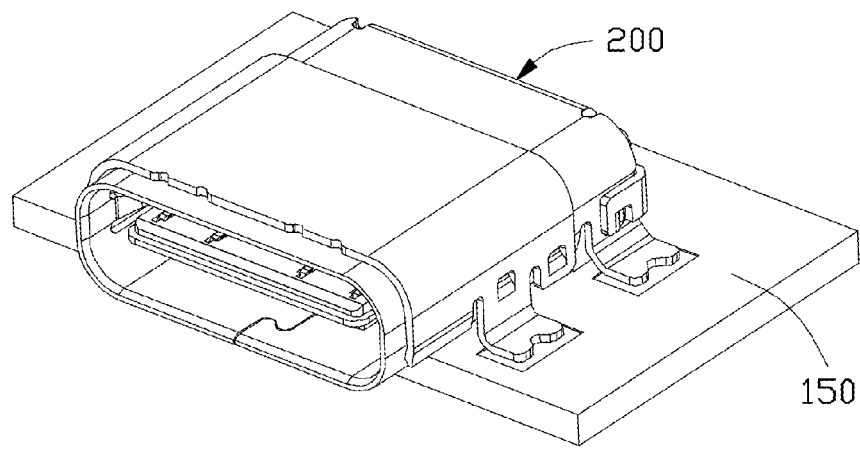
FIG. 9 is a front assembled perspective view of a second embodiment of the receptacle connector mounted to the printed circuit board.
Figure 10A:
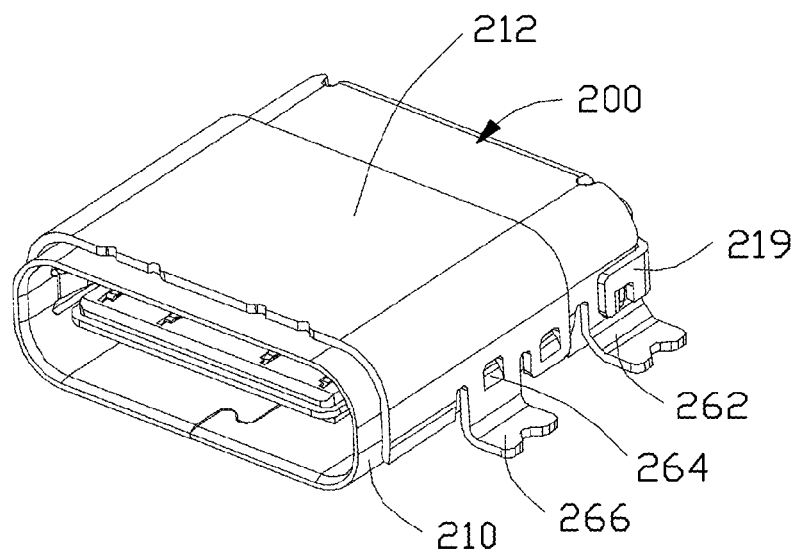
FIG. 10(A) is a front partially exploded perspective view of the receptacle connector moved away from the printed circuit board of FIG. 9.
Figure 10A:
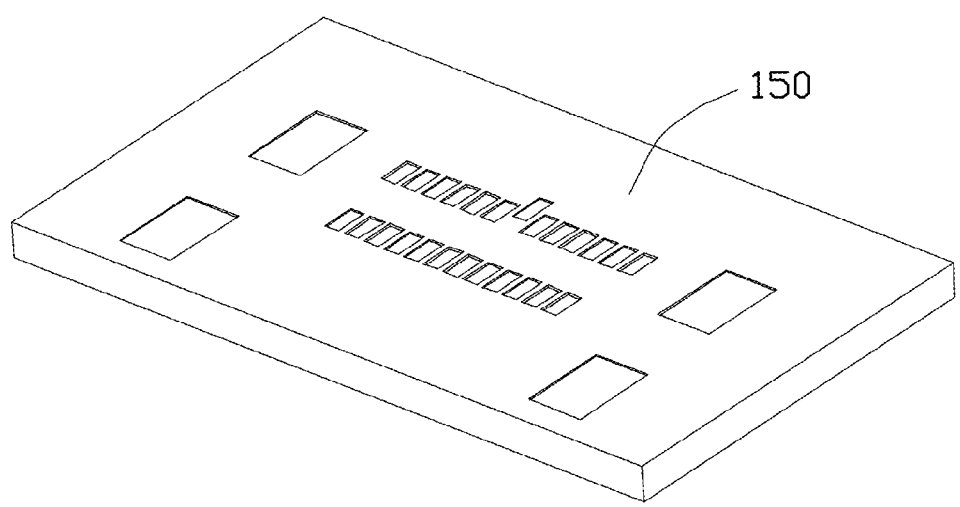
Figure 10B:
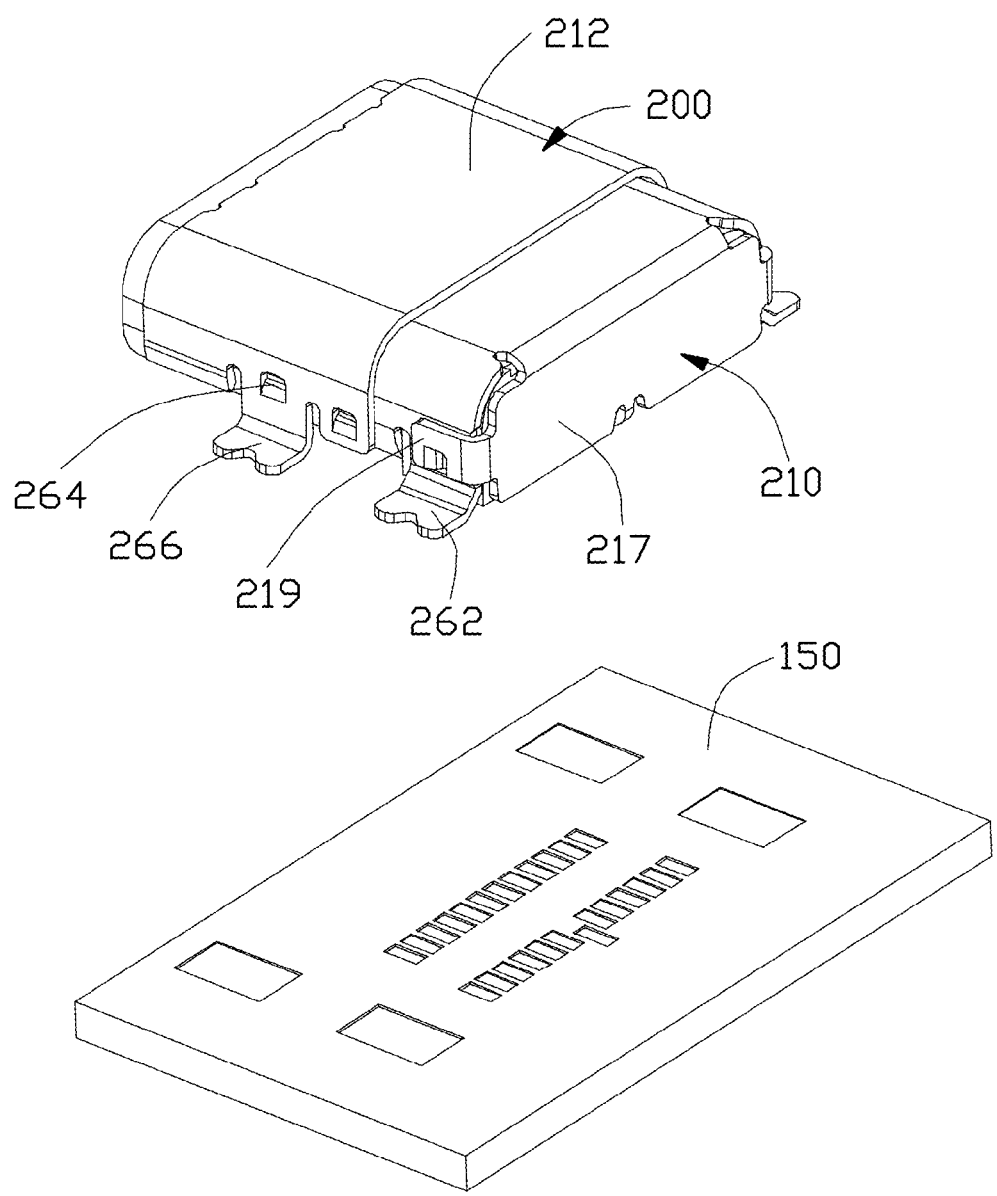
FIG. 10(B) is a rear partially exploded perspective view of the receptacle connector moved away from the printed circuit board of FIG. 9.
Figure 11:
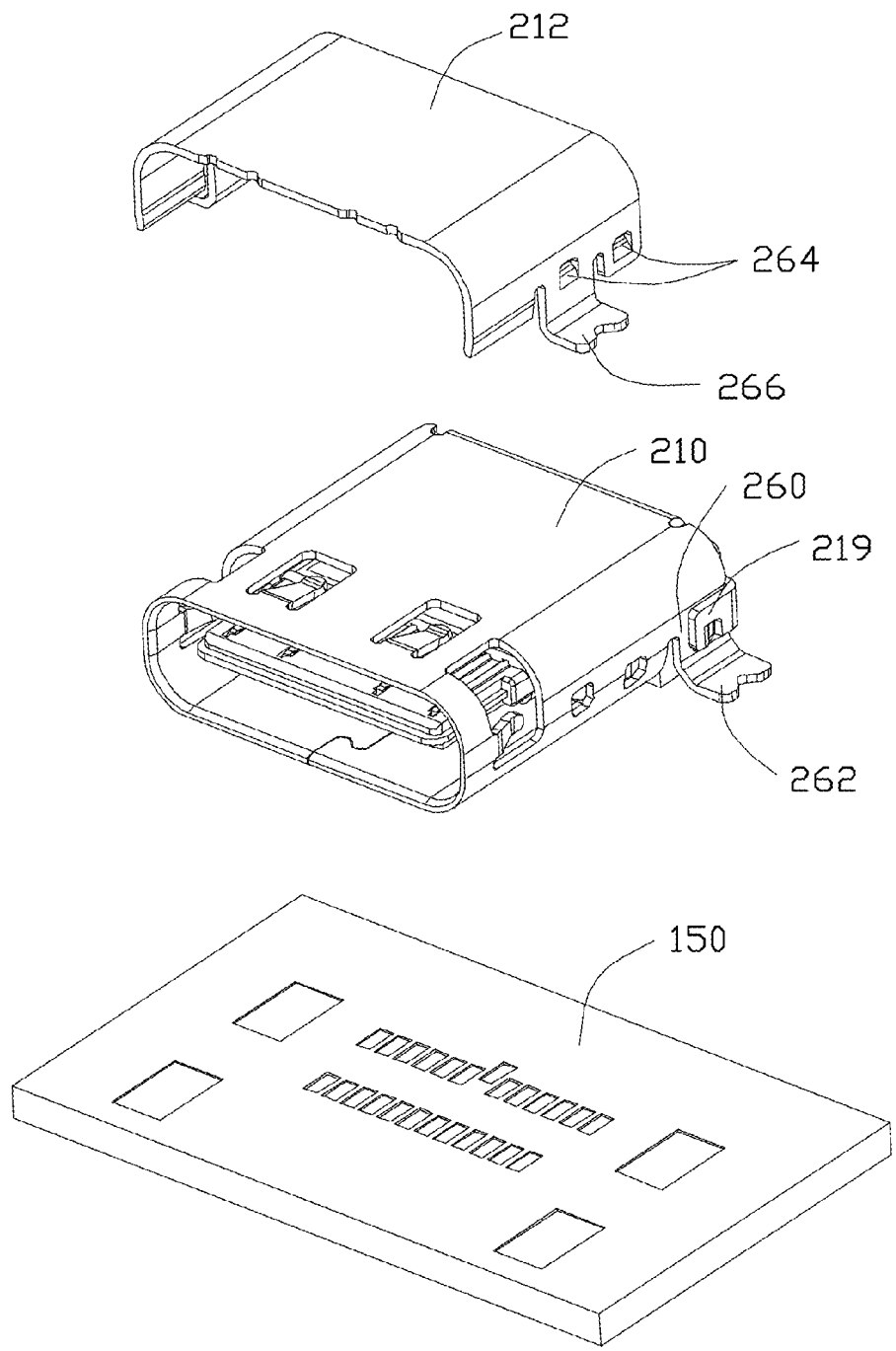
FIG. 11 is a further front partially exploded perspective view of the receptacle connector of FIG. 10(A).
Figure 12A:
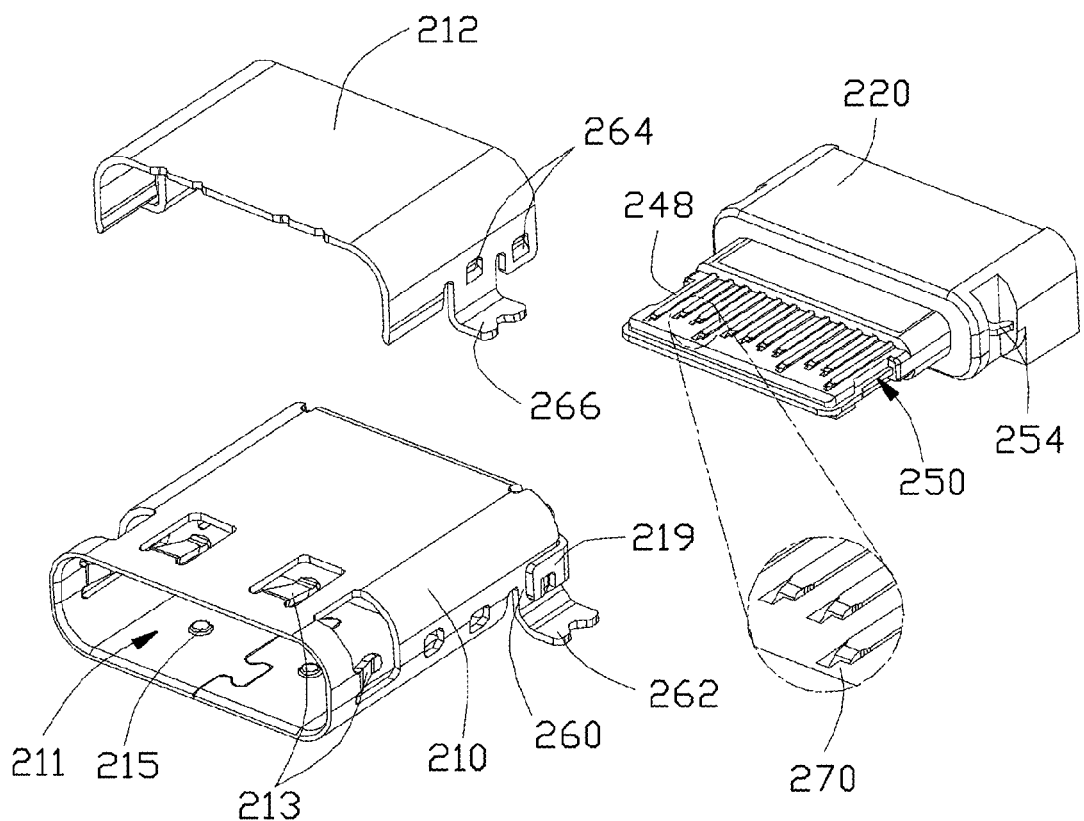
FIG. 12(A) is a further front partially exploded perspective view of the receptacle connector of FIG. 11.
Figure 12B:
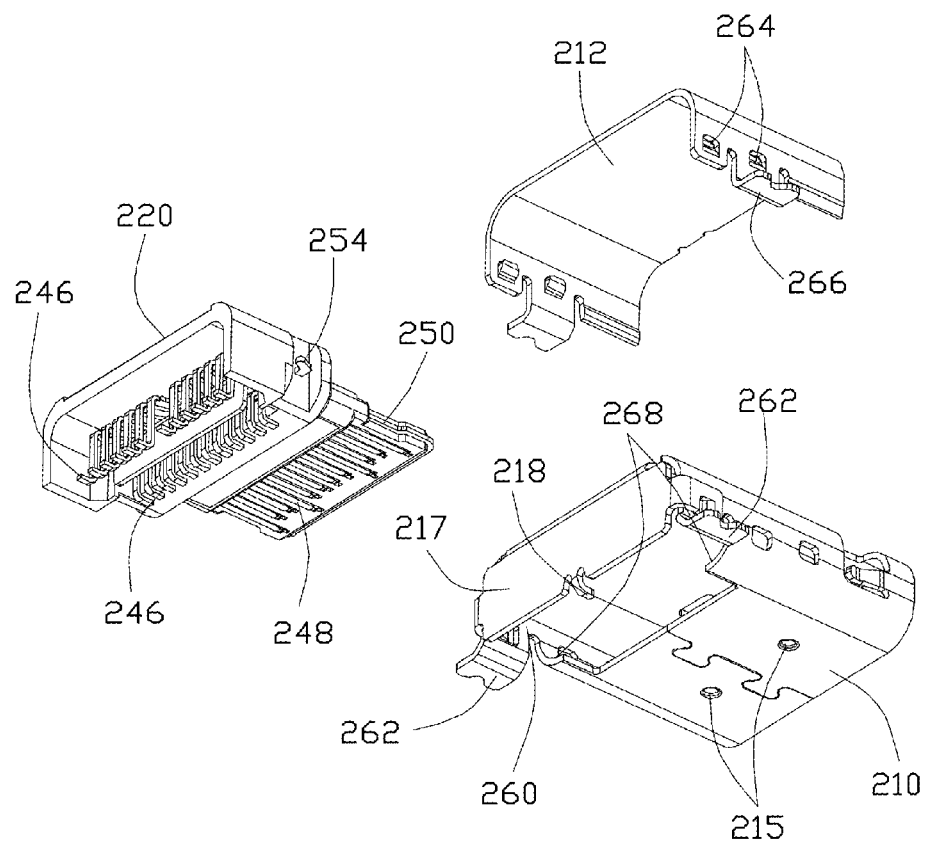
FIG. 12(B) is a further rear exploded perspective view of the receptacle connector of FIG. 11.
Figure 13:
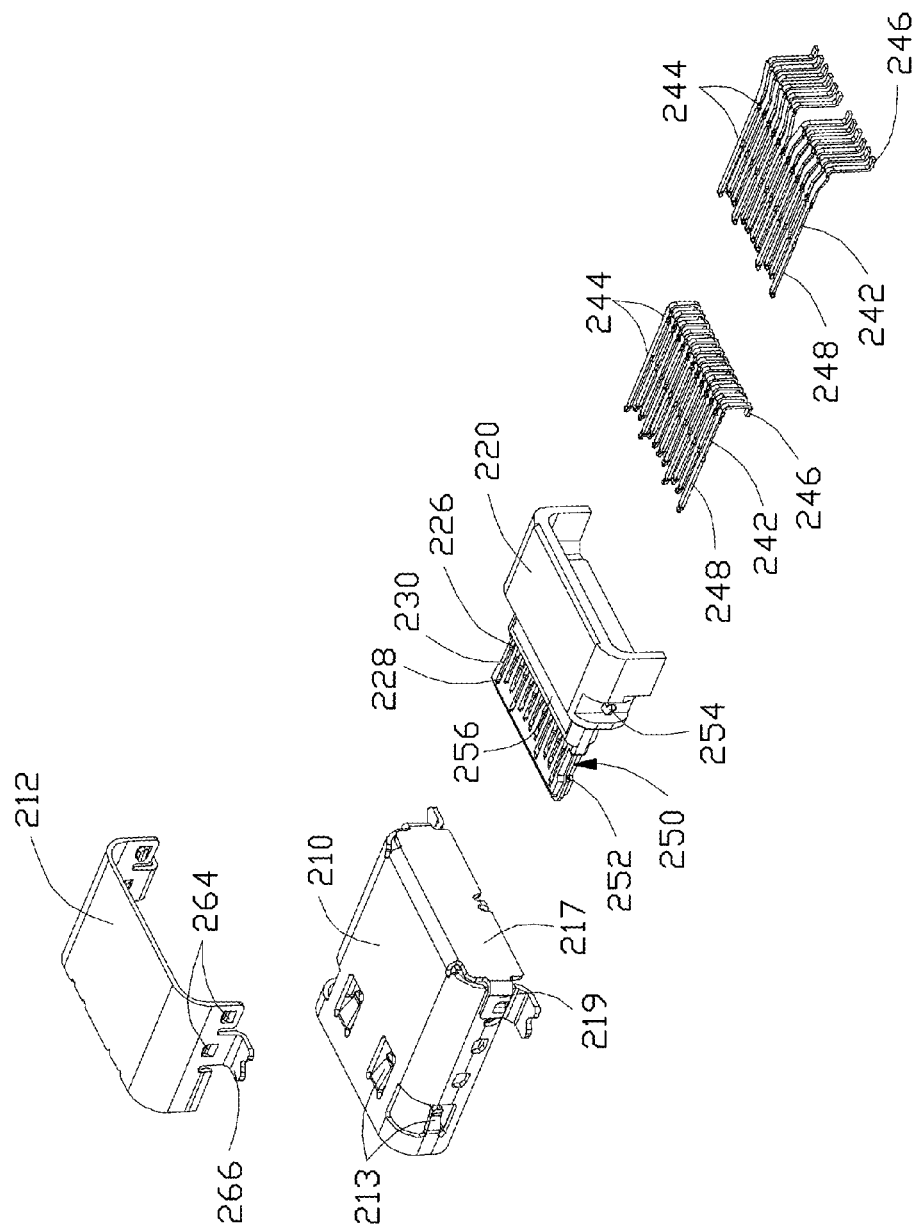
FIG. 13 is a further rear exploded perspective view of the receptacle connector of FIG. 12(B).
Figure 14A:
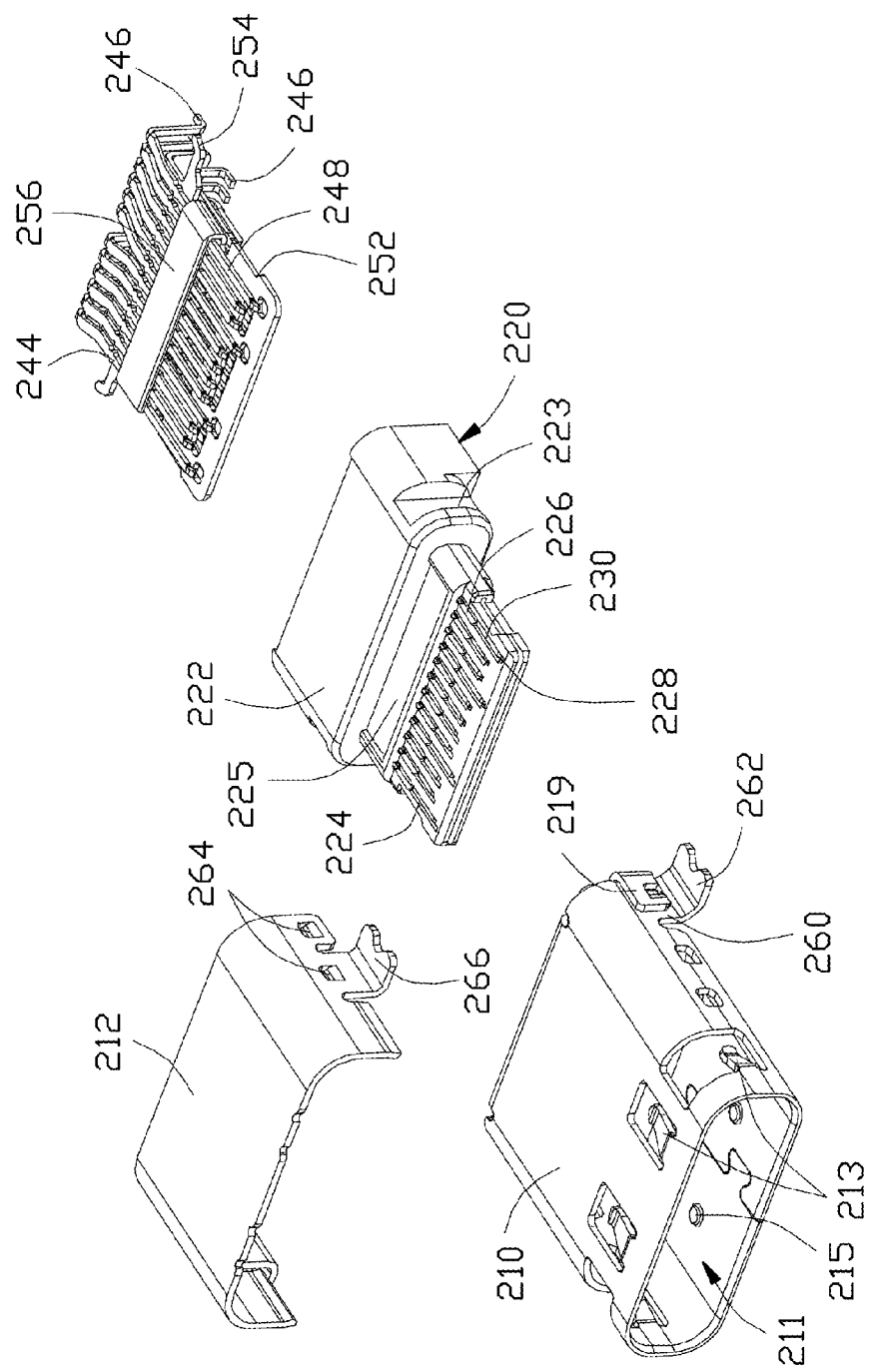
FIG. 14(A) is a further front exploded perspective view of the receptacle connector of FIG. 13.
Figure 14B:
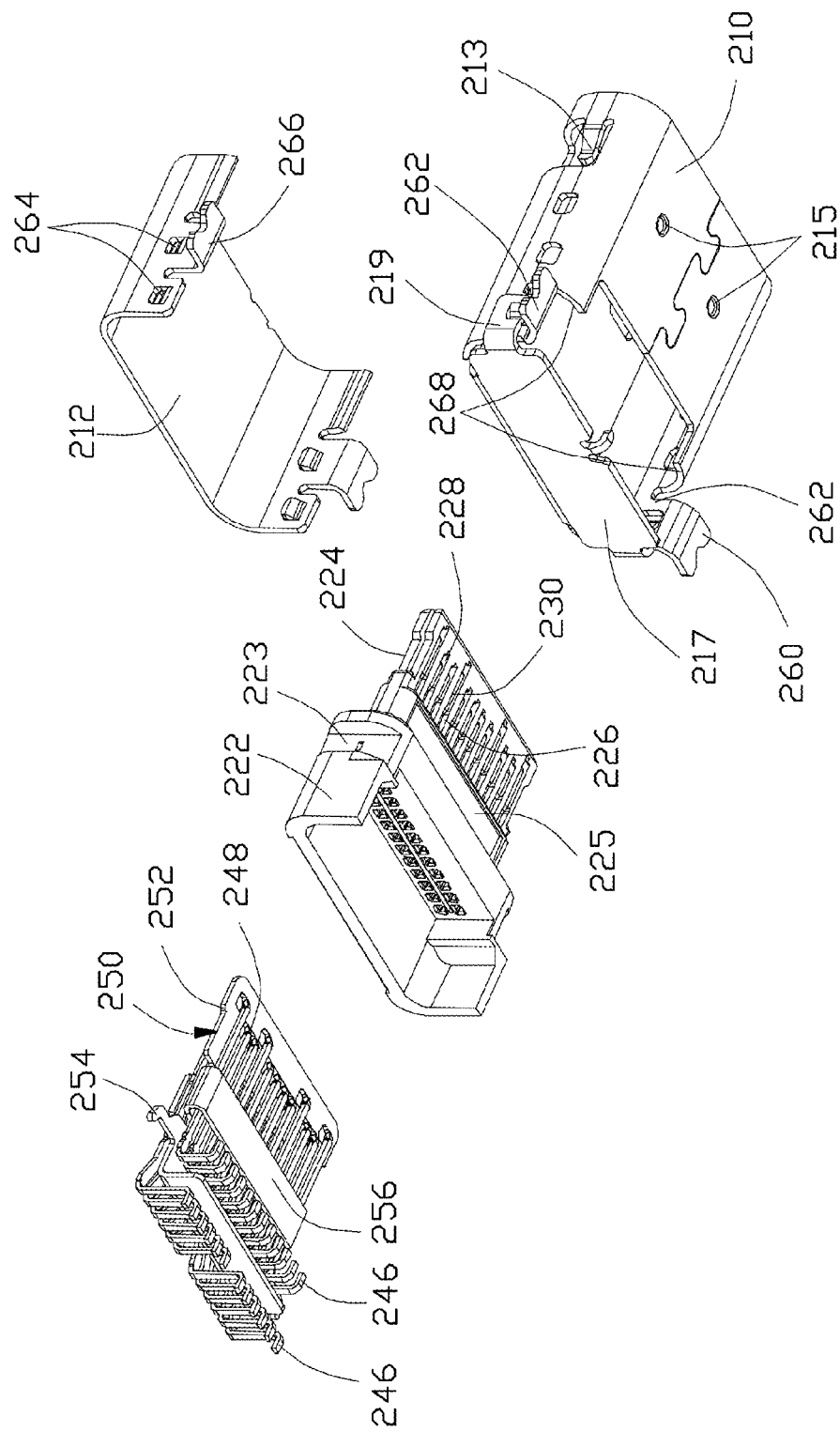
FIG. 14(B) is a further rear exploded perspective view of the receptacle connector of FIG. 13.
Figure 15A:
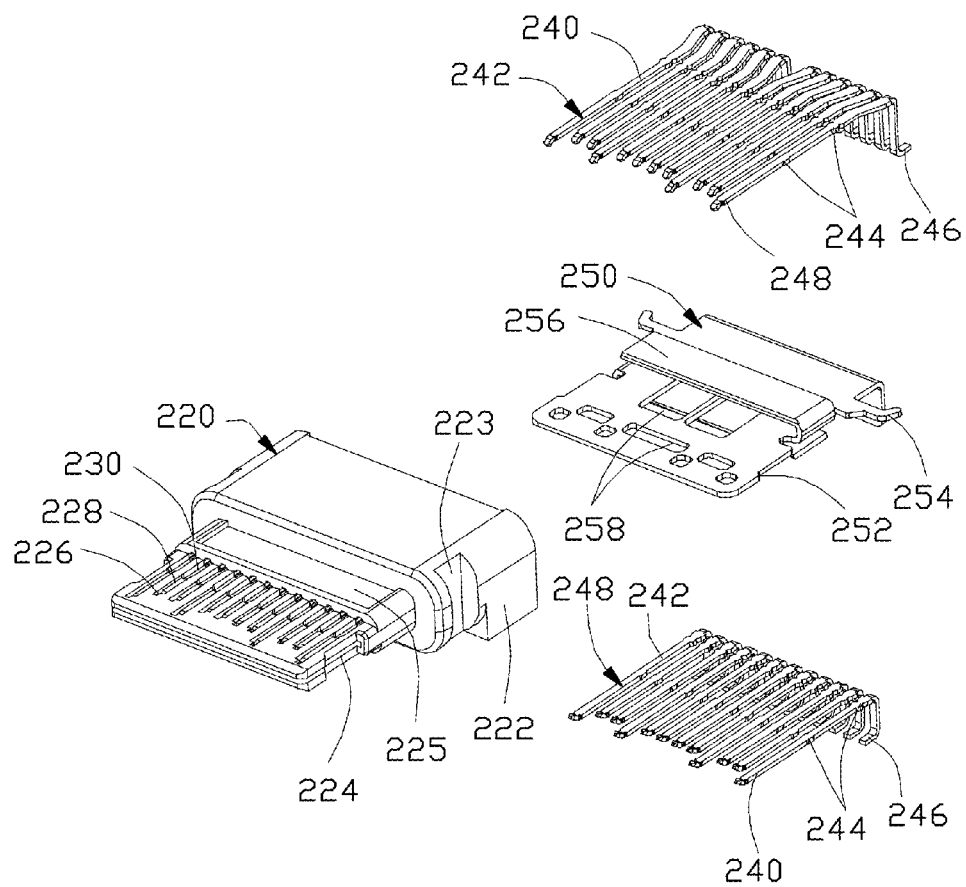
FIG. 15(A) is a further front exploded perspective view of the receptacle connector of FIG. 14(A).
Figure 15B:
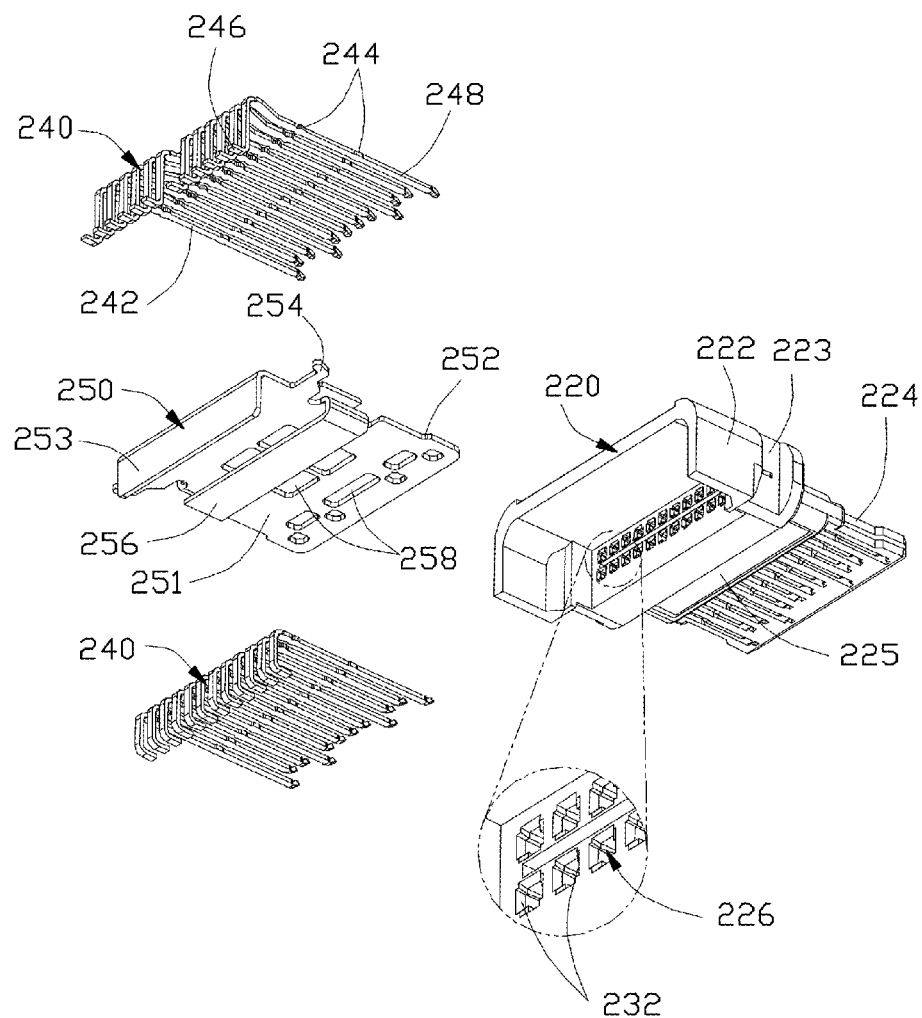
FIG. 15(B) is a further rear exploded perspective view of the receptacle connector of FIG. 15(A).
Figure 16:
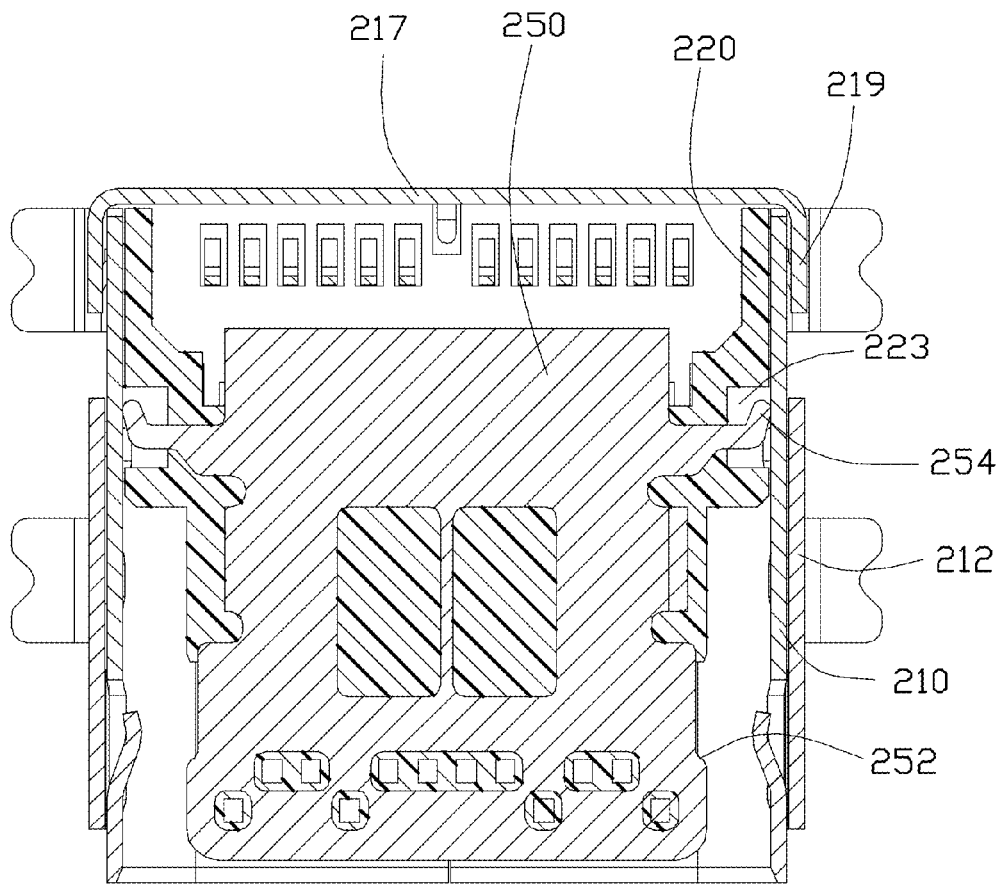
FIG. 16 is a horizontal cross-sectional view of the receptacle connector of FIG. 9
Figure 17:
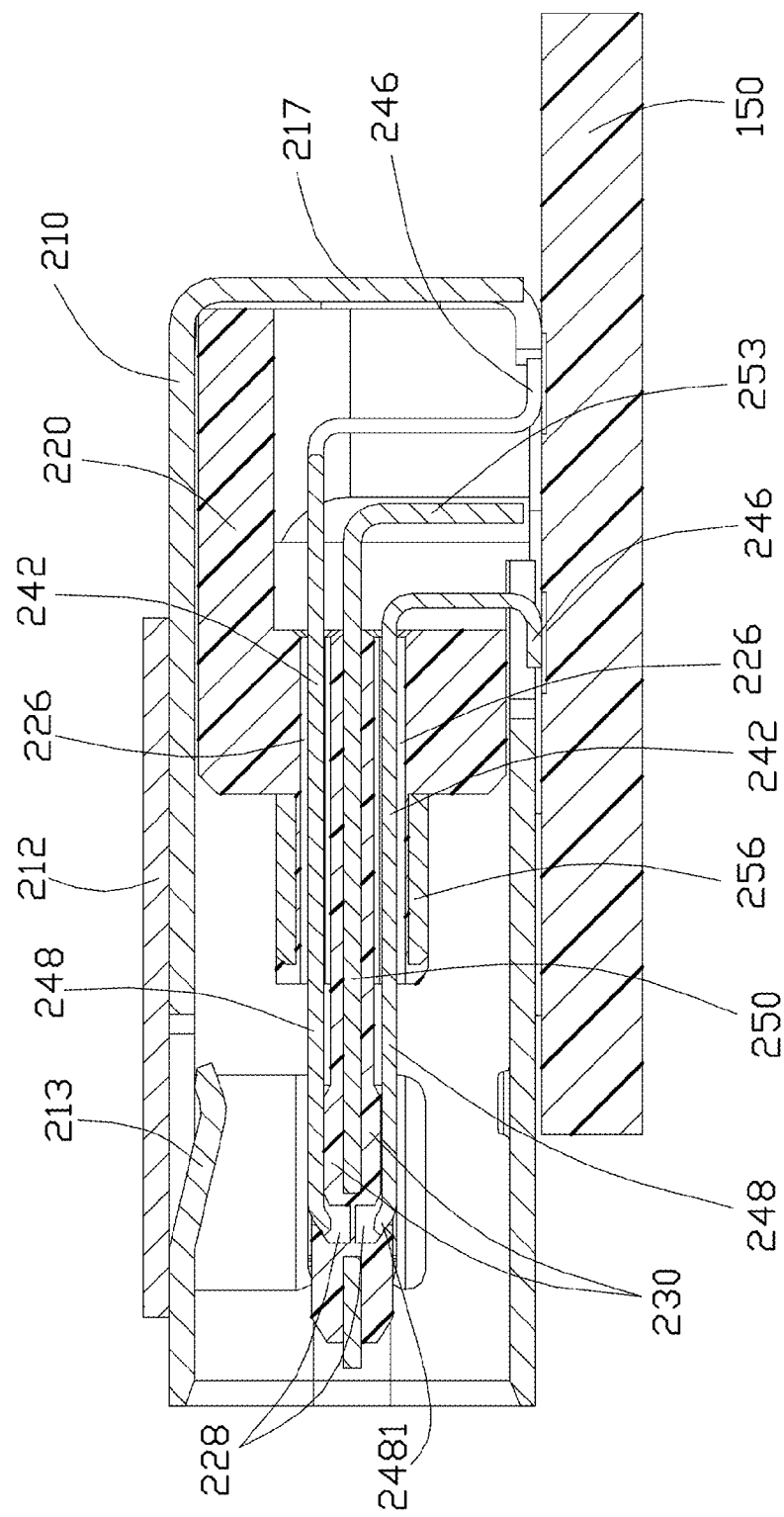
FIG. 17 is a side vertical cross-sectional view of the receptacle connector mounted upon the printed circuit board of FIG. 9.
Figure 18:
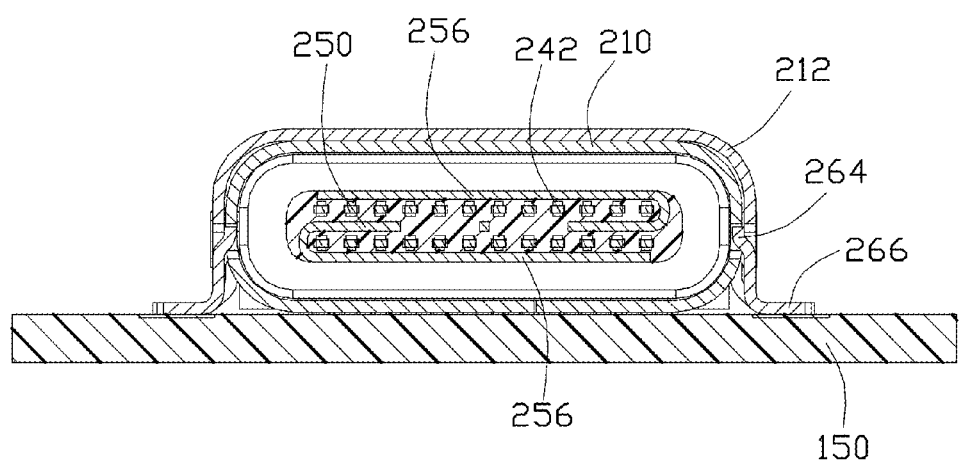
FIG. 18 is a front vertical cross-sectional view of the receptacle connector mounted upon the printed circuit board of FIG. 9.

Reference will now be made in detail to the preferred embodiment of the present invention. FIGS. 1-8 show a plug connector 10 mated with a receptacle connector 50 mounted in a notch 102 of a printed circuit board. 100, of a first embodiment of this present invention. The receptacle connector 50 includes an insulative housing 52 with a mating tongue 54 forwardly extending in a capsular mating cavity 57 of a metallic shield 56 which encloses the housing 52. Opposite upper and lower rows of contacts 58 are disposed in the housing 52 with corresponding contacting sections 60 exposed upon opposite surfaces of the mating tongue 54 in a diagonally symmetrical arrangement mechanically and electrically so as to allow a so-called flappable insertion of the plug connector 10 thereinto. A step structure 62 is formed around a root of the mating tongue 54. A one piece metallic EMI collar 64 includes a loop structure 66 intimately surrounding the step structure 62. The collar 64 further includes an L-shaped extending plate 65 equipped with embossments 63 thereon and received in the recess 61 of the lower piece 72 of the housing 52 (illustrated later) for mechanically and electrically connecting to the shield 56. The detailed structures of EMI collar 64 may be also referred to the embodiment disclosed in FIG. 15.

The housing 52 is composed of the upper piece 70 and a lower piece 72 commonly sandwiching therebetween a middle piece 74 which forms the mating tongue 54. The upper row contacts 58 are associated with the upper piece 70, the lower row contacts 58 are associated with a lower piece 72 and the shielding plate 76 is associated with the middle piece 74 via an insert molding process wherein the contacting sections 60 of the upper row contacts 58 and those of the lower rows contacts 58 are seated upon opposite upper surface and lower surface of the mating tongue 54, respectively, as mentioned before. Understandably, the housing 52 and the associated contacts 58 may be deemed wholly as a so-called terminal module implying the terminals being integrally formed within an insulator. A rear portion of the step structure 62 is removed to have a front edge region 71 of the upper piece 70 and the front edge region 73 of the lower piece 72 sandwiched between the middle piece 74 and the loop structure 66 of the EMI collar 64 so as to enhance the strength during mating under some bending. In this embodiment, the shielding plate 76 defines an opening 77 and a thinner area 78 for both securing and impedance consideration, and further a pair of mounting legs 79 so as to efficiently separate the upper row contacts 58 and the lower row contacts 58 from each other wherein the upper row contacts 58 form the surface mount type tail sections while the lower row contacts 58 form the through hole type tail sections. In an alternate embodiment, the thinner area 78 may be totally removed from the shielding plate 76. The lower piece 72 includes a pair of mounting posts 80 receiving in the corresponding through hole for mounting the housing 52 to the printed circuit board 100. The lower piece 72 further forms a pair of recessions 49 to receive the corresponding retention tangs 37 of the shield 56.

In this embodiment, the middle piece 74 forms a pair of recesses 82 to respectively receive the corresponding protrusions 84 of the upper piece 70 and the lower piece 72 for securing the upper piece 70, the lower piece 72 and the middle piece 74 therebetween in a stacked manner wherein the upper piece 70 further include a pair of downward assembling poles 84 received in the corresponding alignment holes 86 of the middle piece 74, and the lower piece 72 further includes an upward assembling pole 85 received in the corresponding alignment holes 86 of the middle piece 74, and the lower piece 72 further forms a pair of upward locating posts 87 received within the corresponding recesses 89 in the upper piece 70. In this embodiment, the lower piece 72 defines a plurality of through holes 91 and 93 to receive the tail sections of the lower row contacts 58 and the mounting legs 79 of the shielding plate 76 to extend therethough as an alignment spacer. Notably, the shielding plate 76 forms a front edge section 69 extending forwardly beyond a front edge of the mating tongue 54 for anti-mismating consideration, and a pair of lateral edge sections 67 for locking with a latch 39 of the plug connector 10 (illustrated later). In brief, the shielding plate 76 is essentially multifunctional to perform shielding, grounding, reinforcing, anti-mis-mating and locking. A metallic bracket 95 is soldered under the shield 56 and forms a pair of supporting legs 97 mounted into the through hole 103 of the printed circuit board 100 for supporting the receptacle connector 50 within the notch 102 of the printed circuit board 100. The shield 56 further includes an upside-down U-shaped structure (not labeled) on a rear portion covering the rear portion of the housing 52 with a pair of mounting legs 55 received in the through holes 104 for mounting to the printed circuit board 100 and a pair of locking tabs 59 received in the recesses 99 of the upper piece 70 after the shield 56 is rearwardly assembled to the housing 52 in a front-to-back direction. Notably, the mounting leg 79 of the shielding plate 76 share the same through hole with the neighboring grounding contact tail for enhancing grounding effect.

Referring to FIGS. 9-18, according to a second embodiment of the invention the receptacle connector 200 mounted upon the printed circuit board 150, includes an insulative housing 220 enclosed in the metallic shield 210 which is attached to a metallic bracket 212 which is surface-mounted upon the printed circuit board 150. The housing 220 essentially includes a base 222 and a mating tongue 224 extending forwardly therefrom. Two rows of passageways 226 extends along a front-to-back direction in the housing 220, and each passageway 226 forms an inward recession 228 at a front end with a protection flange 270 thereabouts, and a platform 230 behind the recession 228. A pair of opposite grooves 232 are located on two lateral sides of each passageway 226. A plurality of contacts 240 are forwardly inserted to the corresponding passageways 226, respectively. Each contact 240 includes a horizontal main body 242 with two pairs of barbs 244 on two lateral edges to be engaged within the corresponding grooves 232 in an interference fit, a surface mount tail 246 behind the main body 242, and a contacting section 248 in front of the main body 242 with a tip 2481 inwardly embedded with the recession 228. The tails 246 are laterally offset from the main bodies 242 of the corresponding contacts 240 of the upper row with two opposite group while the those of the corresponding contacts of the lower row are still densely arranged with one another without offsetting. On the other hand, the tails 246 of the contacts 240 in the upper row and those in the lower row extend in opposite directions. Notably, the front section of the contacting section 248 is supported by the platform 230 while the remaining contacting section 248 and the main body 242 are spaced from the housing 220 in the vertical direction with support by the pair of barbs 244 in the grooves 232.

A metallic shielding plate 250 is insert molded within the housing 220 and between the two rows of the contacts 240 before the contacts 240 are inserted into the housing 220. The shielding plate 250 includes a first shielding portion 251 located between the contacts portions 248 of the upper and lower rows of contacts 240 and a second shielding portion 253 located between the tails 246 of the upper and lower rows of the contacts. The shielding plate 250 forms a pair of locking side edges 252 for locking with the internal latch of the corresponding plug, a pair of spring arms 254 located on two lateral sides thereof and in corresponding recesses 223 in opposite two lateral sides of the housing 220 to mechanically and electrically connect to the shield 210, and a pair of contacting regions 256 unitarily extending respectively from two opposite lateral sides of the shielding plate 250 in a folded/parallel manner and exposed upon the root portion 225 of the mating tongue 224 for coupling to the corresponding spring plates on the plug connector. Notably, the shielding plate 250 forms a plurality of through openings 258 to be filled with material of the housing 220 after the insert molding process for securing consideration.

The shield 210 forms a mating cavity 211 into which the mating tongue 224 forwardly extending, and a plurality of spring tangs 213 extending rearwards and a plurality of dimples 215 for holding the plug connector. A rear wall 217 unitarily extends from a rear edge of the shield 210 to cover the back of the housing 220 with two ears 219 locked to the two lateral sides of the shield 210 and surface mounting type tail 218. Notably, the shield 210 essentially constitutes a capsular form with two vertical side walls 260 for locking the corresponding ears 219 where a pair of horizontal mounting pads 262 are formed for surface mounting to the printed circuit board 150. The shield 210 includes a curved rear edge 268 rearwardly abuts against the base 222 of the housing 220. The bracket 212 is attached to the shield 210 via tabs 264 and mounted to the printed circuit board via mounting pads 266.

Different from the previous first embodiment, this second embodiment discloses the receptacle connector 200 completely mounted upon the printed circuit board 150 rather than partially sunk in the notch of the printed circuit board as shown in the previous embodiment. The contacts 240 are assembled into the corresponding passageways 226 rather than via an insert-molding process. On the other hand, the rear wall 217 may efficient block an EMI in the front-to-back direction. The tip 2481 of the contacting section 248 is inward formed and received in the recession 228 and partially protectively covered by the flange 270 above the recession 228 for superior protection without a risk of pup-up. Understandably, in this embodiment the housing 220 is restrained in the shield 210 via the rear wall 217 which forwardly abuts against a back side of the base 222 for blocking the rearward movement and via the rear edge 268 which rearward abuts against a forwardly facing vertical face of the base 222 for blocking the forward movement.

Figure 19:
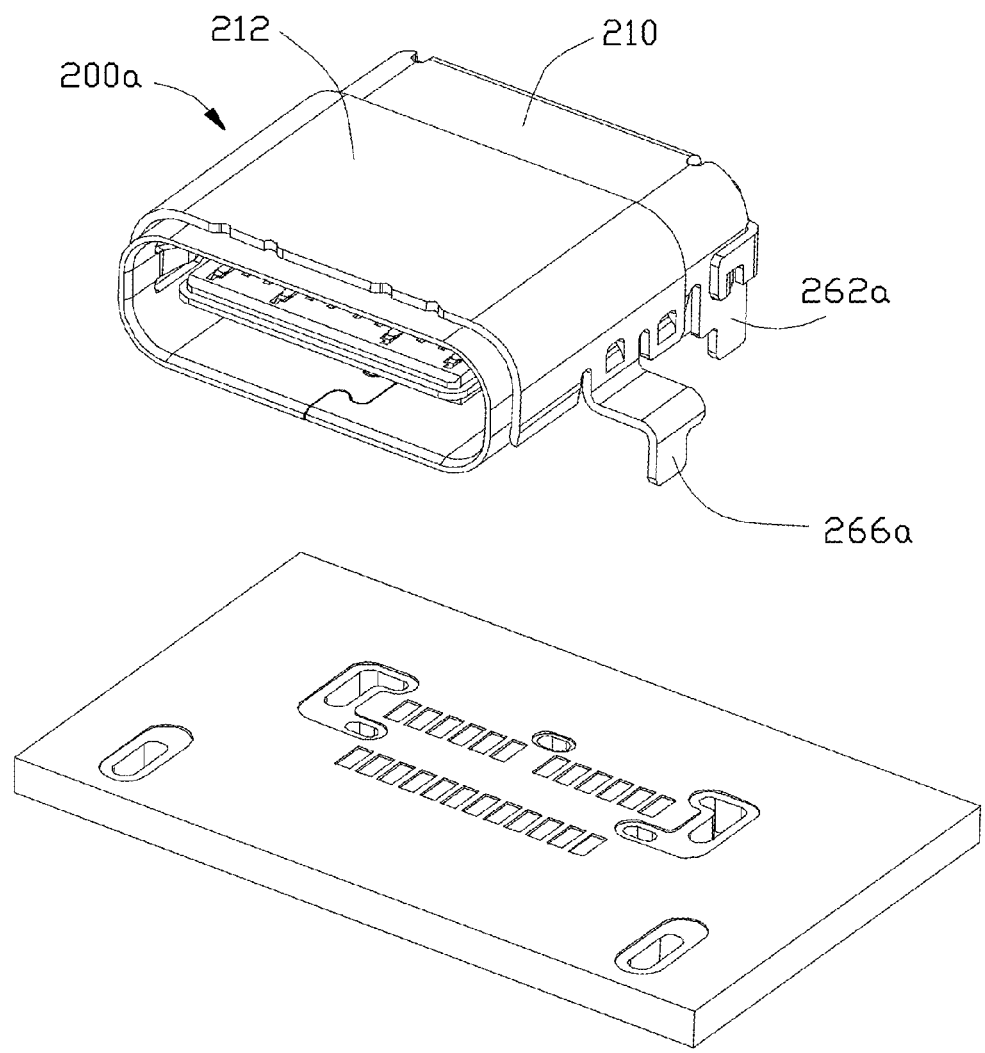
FIG. 19 is a front perspective view of the receptacle connector moved away from the printed circuit board of a third embodiment.
Figure 20:
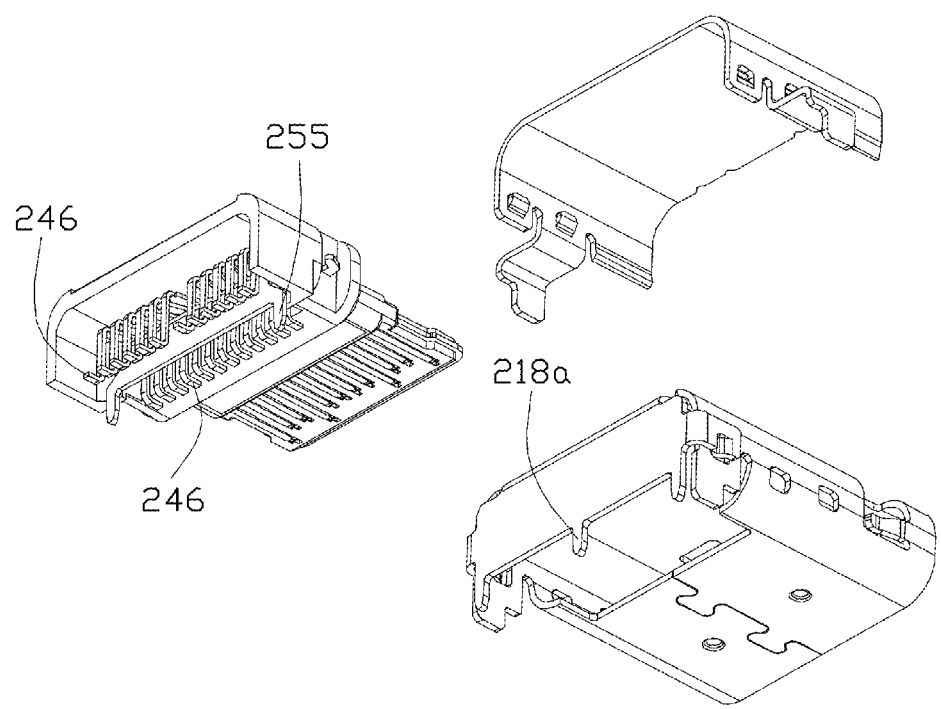
FIG. 20 is a rear exploded perspective view of the receptacle connector of FIG. 19.
Figure 21:
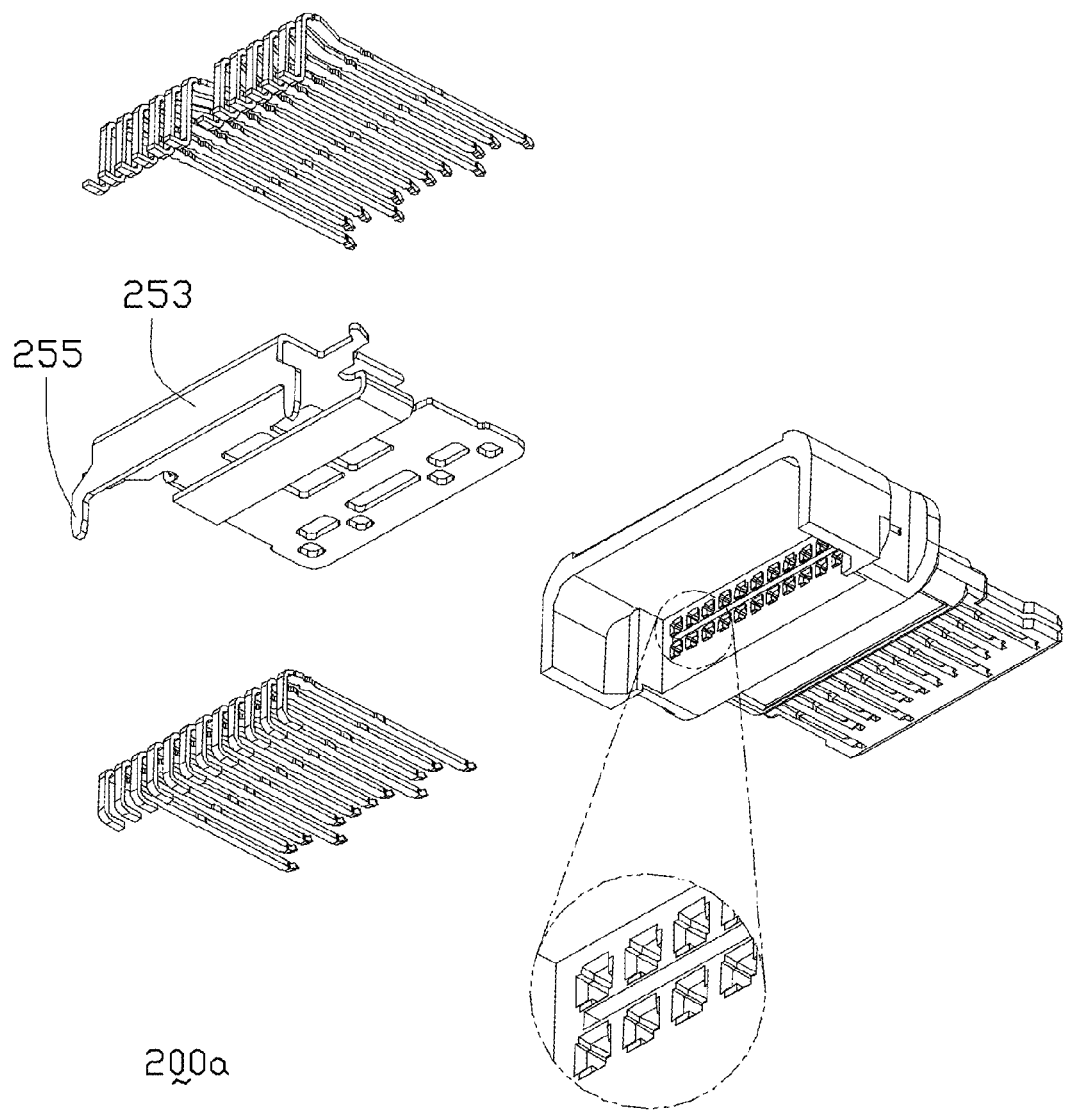
FIG. 21 is a further rear exploded perspective view of the receptacle connector of FIG. 20.
Figure 22:
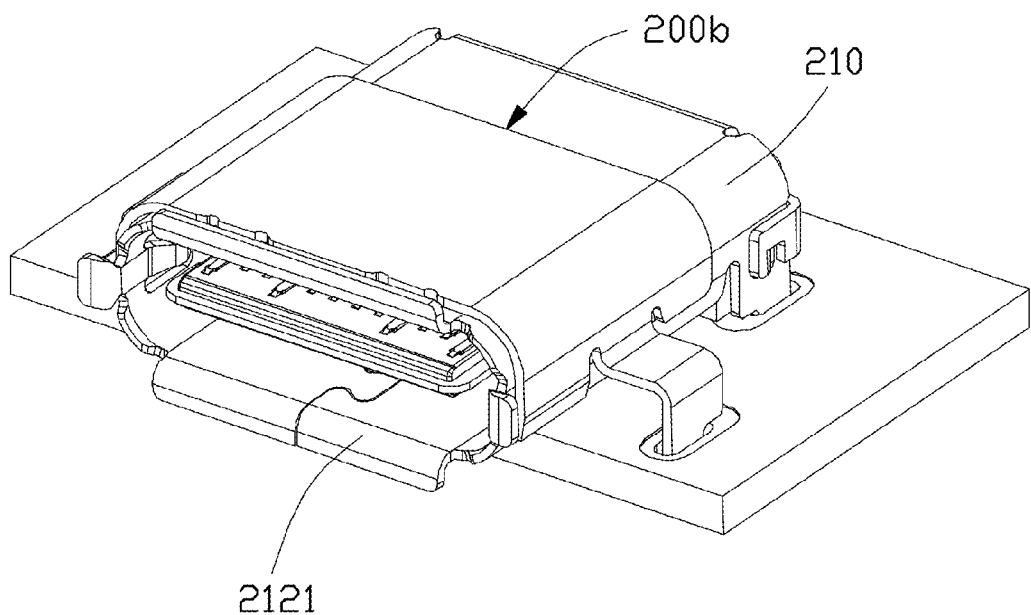
FIG. 22 is a front assembled perspective view of a fourth embodiment of the receptacle connector mounted to the printed circuit board.

FIG. 19-21 disclose third embodiment of the receptacle connector 200a essentially same as the previous second embodiment except the previous second embodiment is of a surface mount type while the current one is of the through hole type on the corresponding shield 210 and bracket structure 212. The shield 210 and the bracket 212 define tails 262a, 218a, 266a of surface mount type. Anyhow, both of these two embodiments are of the surface mount type contacts, the tails of the contacts of the upper and lower rows extend in opposite directions. The shielding plate 250 further defines two tails 255 from the rear shielding portion 253 thereof.

Figure 23:
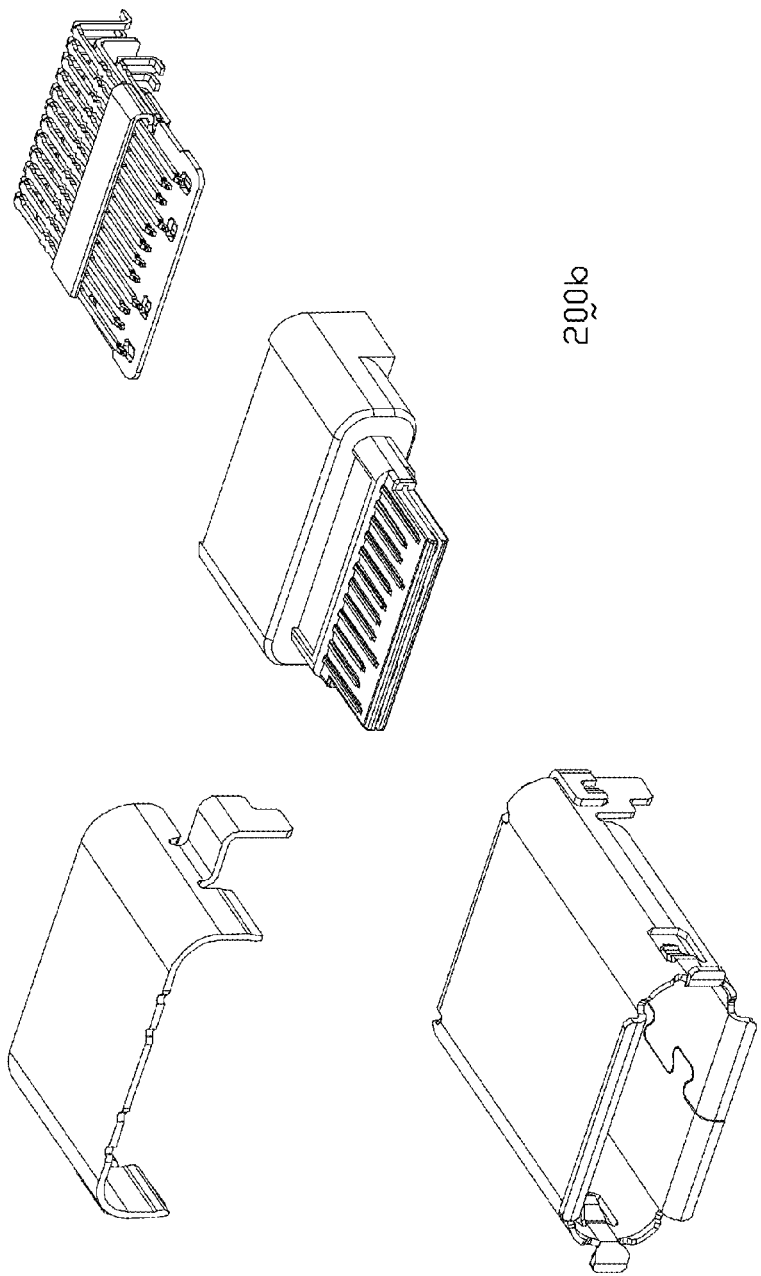
FIG. 23 is a further front partially exploded perspective view of the receptacle connector of FIG. 22.
Figure 24:
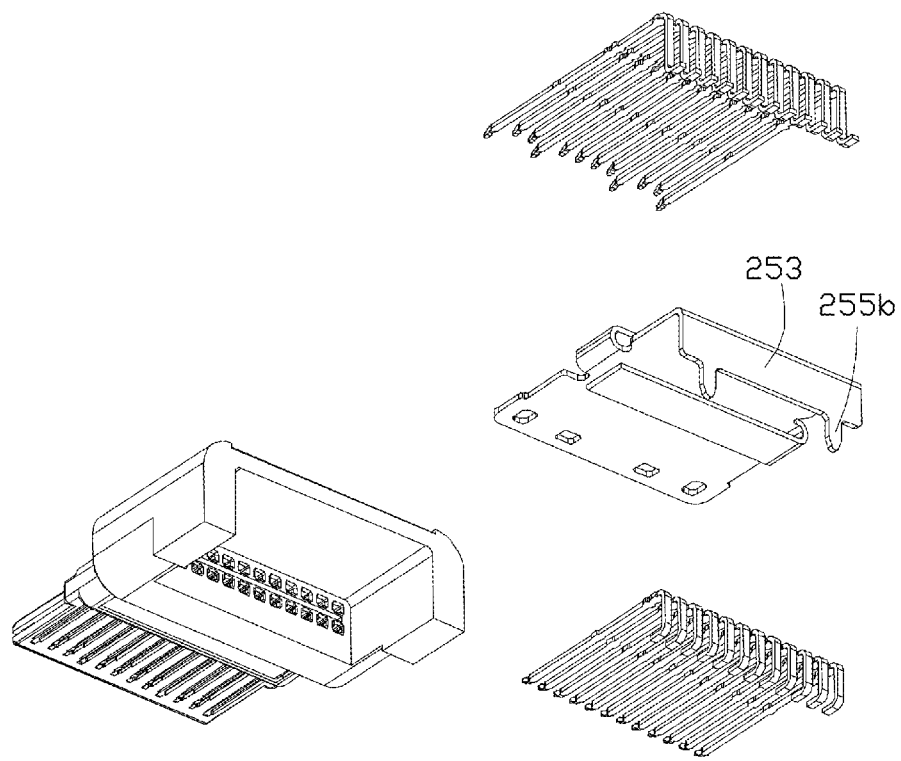
FIG. 24 is a further rear partially exploded perspective view of the receptacle connector of FIG. 23.
Figure 25A:
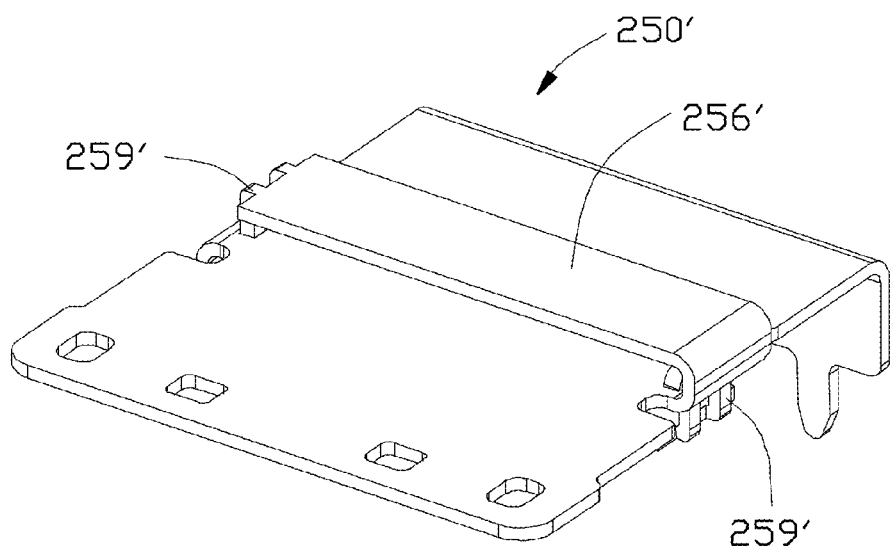
FIG. 25(A) is a front perspective view of the shielding plate in a final shape according to another embodiment of the receptacle connector of the invention.
Figure 25B:
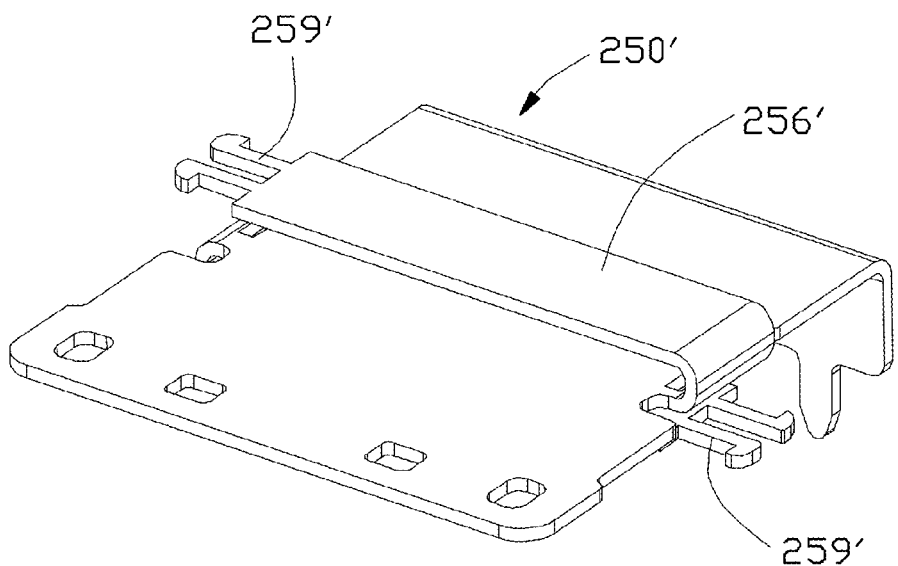
FIG. 25(B) is a front perspective view of the shielding plate of FIG. 25(a) in a semi-finished manner.
Figure 26:
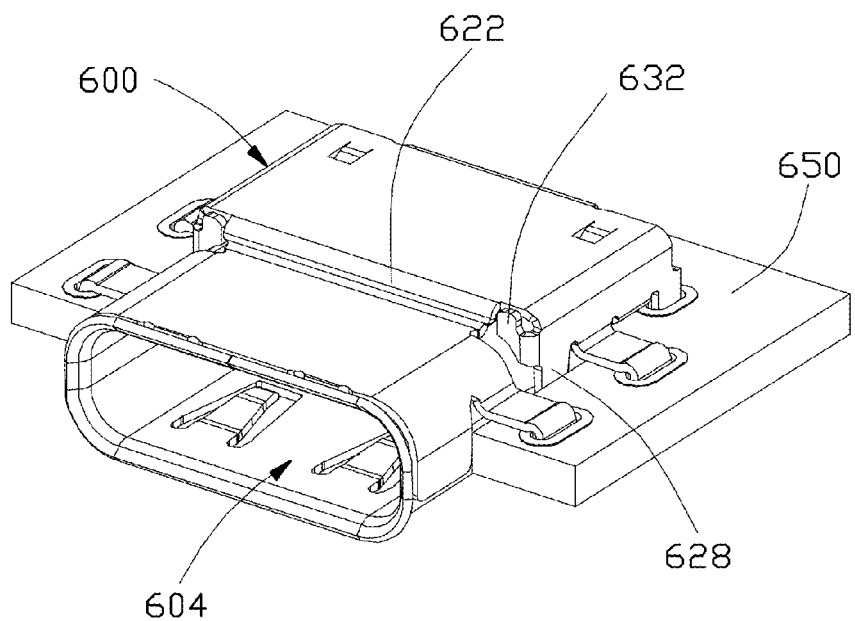
FIG. 26 is an assembled perspective view of a fifth embodiment of the receptacle connector mounted upon the printed circuit board of the invention.
Figure 27A:
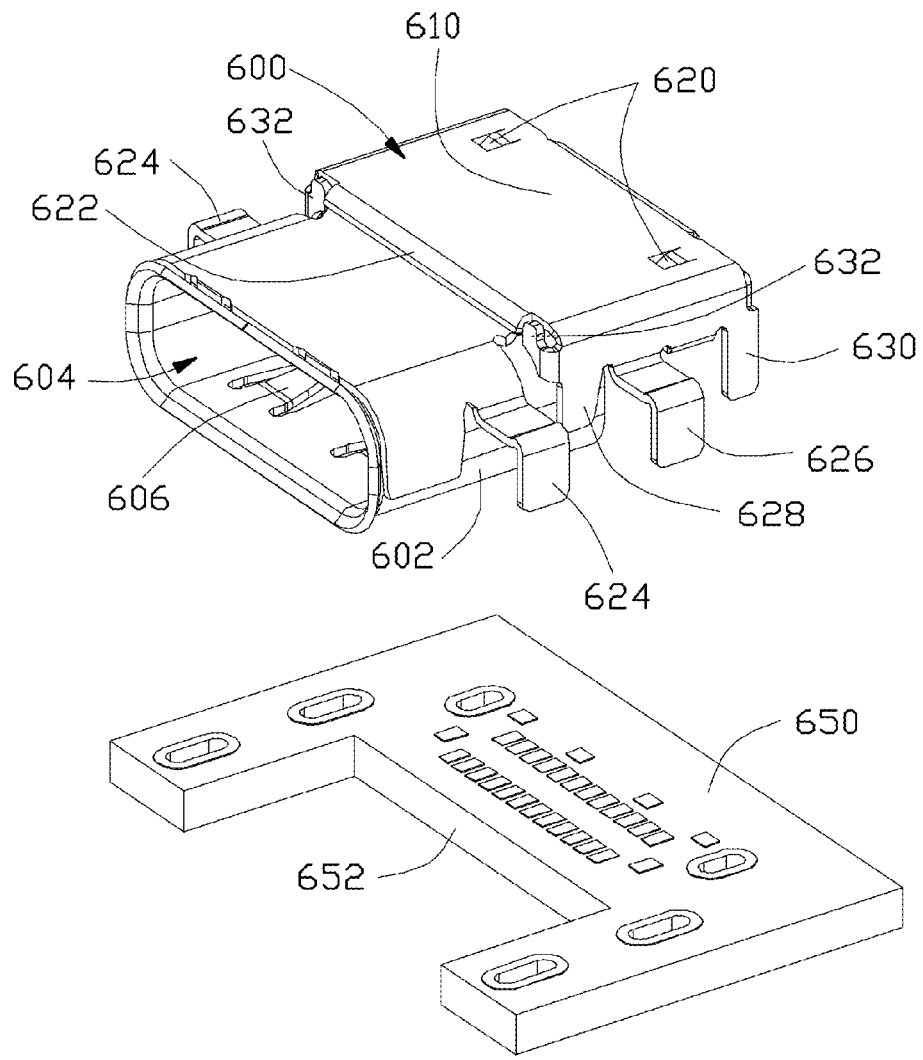
FIG. 27(A) is an assembled front perspective view of the receptacle connector taken away from the printed circuit board of FIG. 26.
Figure 27B:
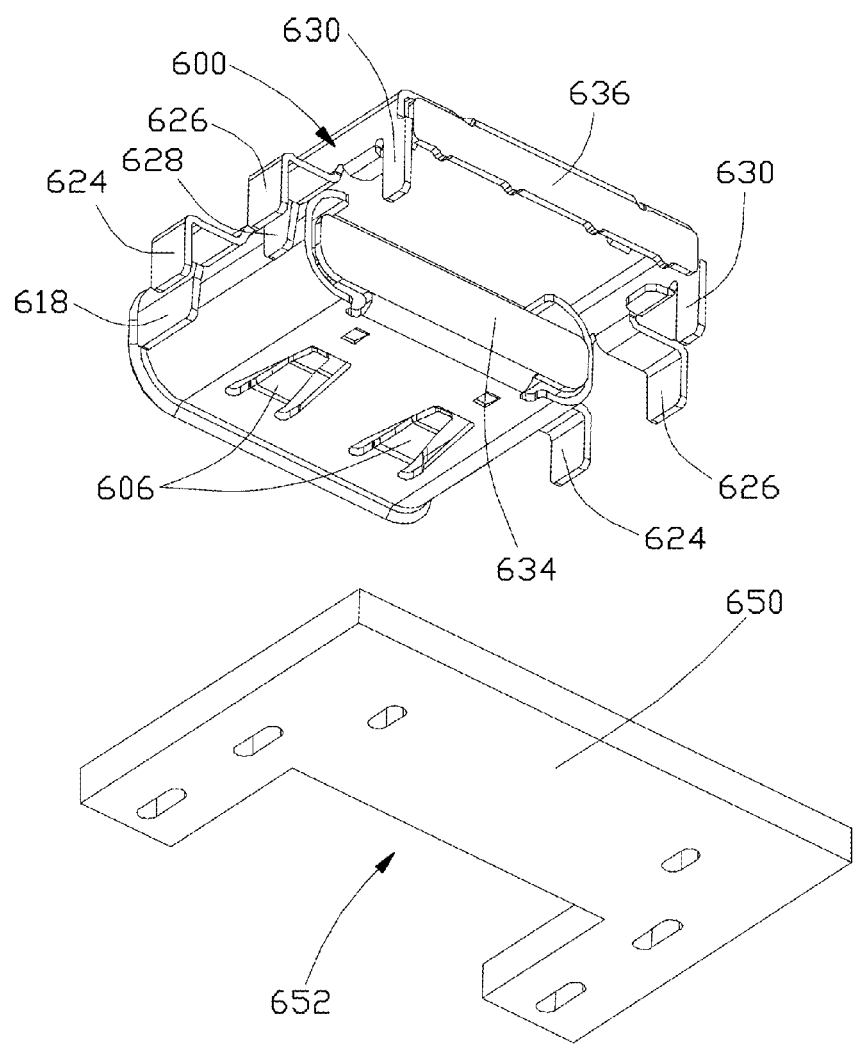
FIG. 27(B) is an assembled rear perspective view of the receptacle connector taken away from the printed circuit board of FIG. 26.
Figure 28A:
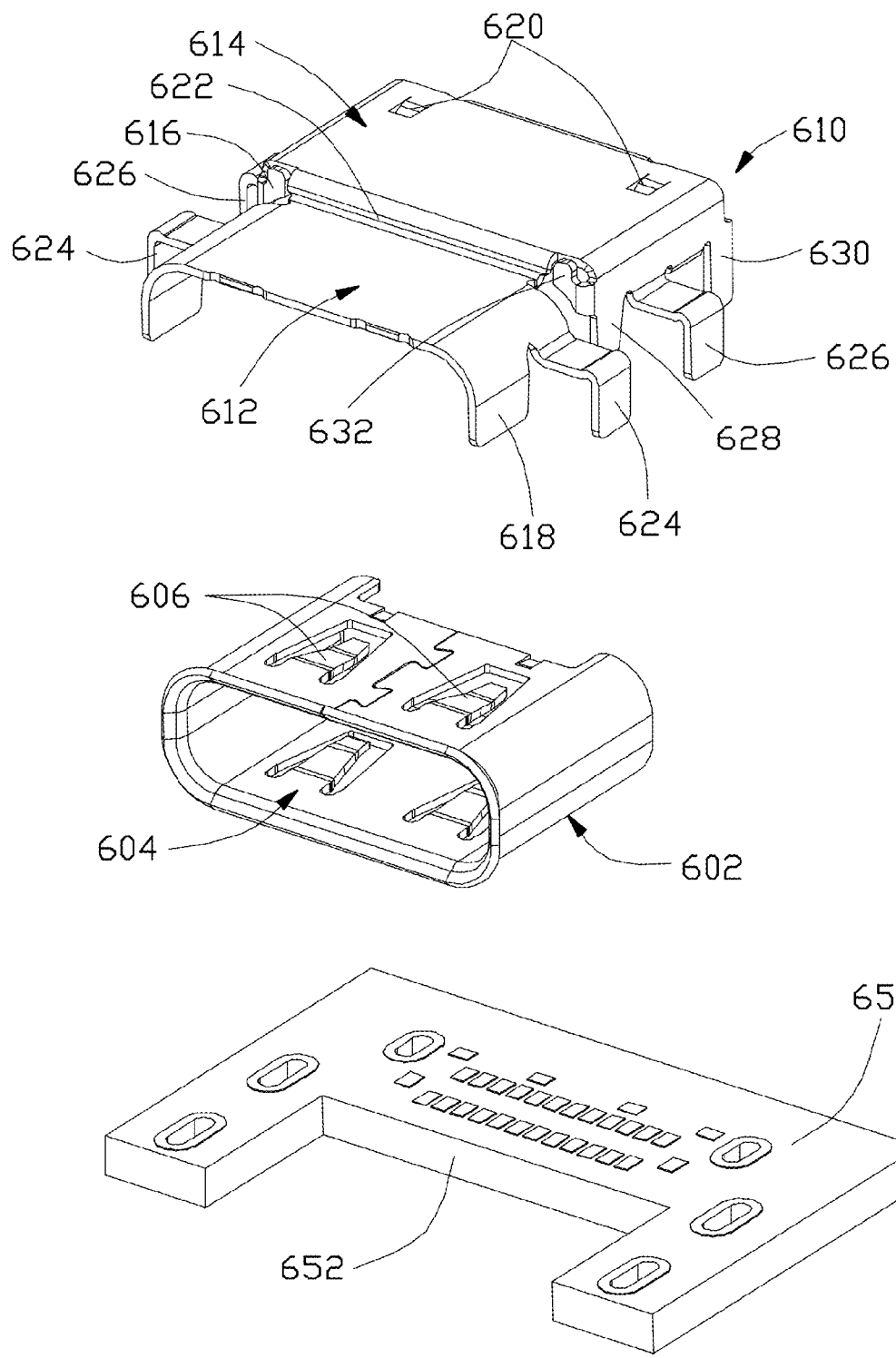
FIG. 28(A) is an exploded front perspective view of the receptacle connector taken away from the printed circuit board of FIG. 27(A).
Figure 28B:
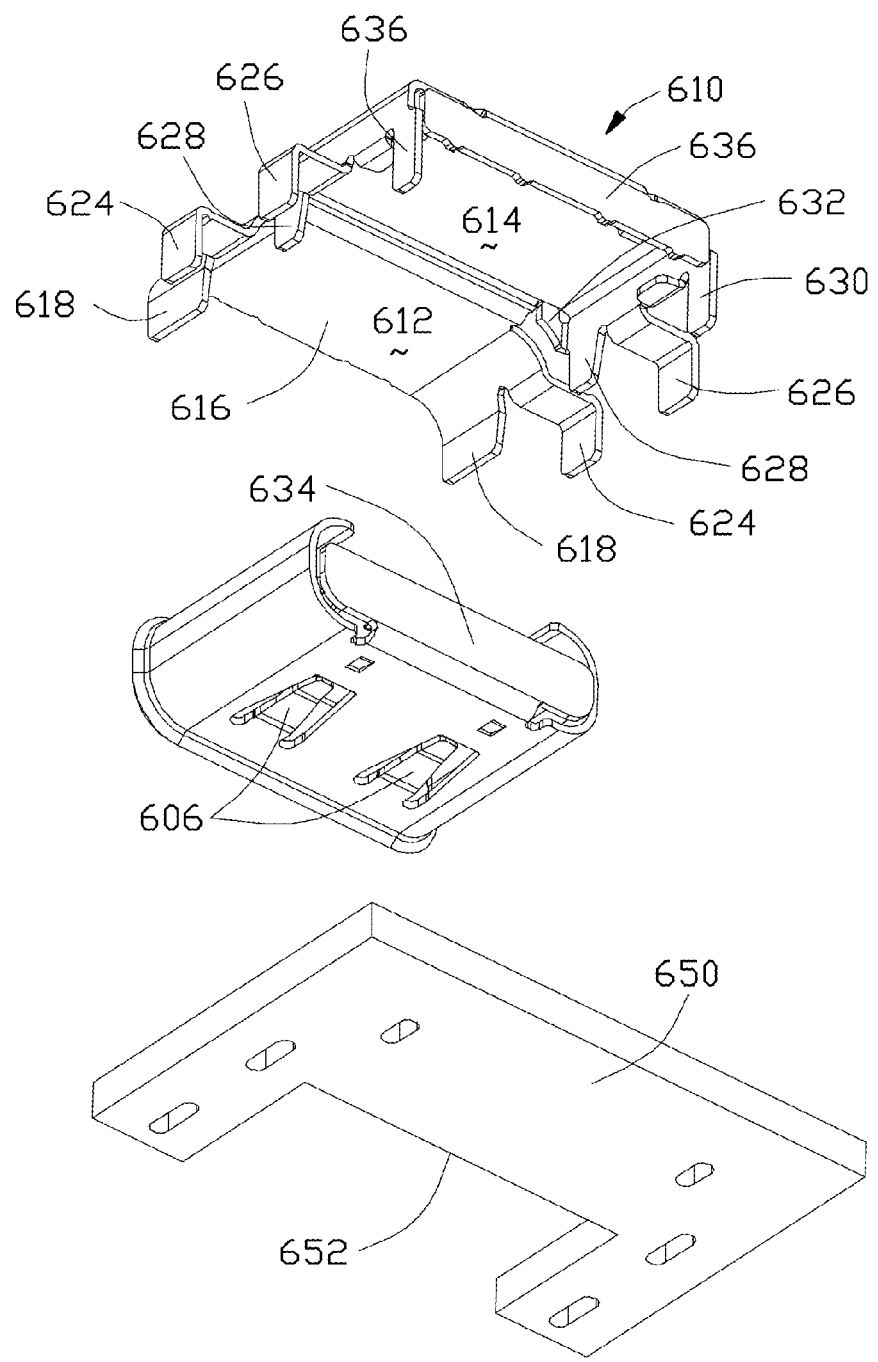
FIG. 28(B) is an assembled rear perspective view of the receptacle connector taken away from the printed circuit board of FIG. 27(A).
Figure 29A:
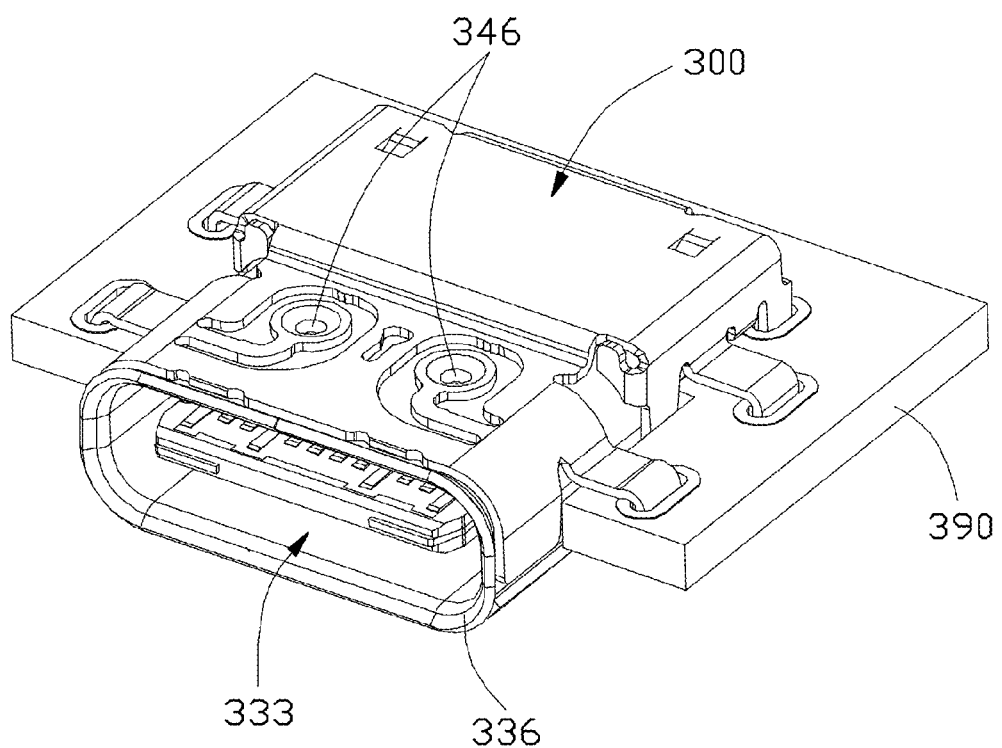
FIG. 29((A) is a front assembled perspective view of a sixth embodiment of the receptacle connector mounted upon a printed circuit board according to the invention.
FIG. 29(B) is a rear assembled perspective view of the receptacle connector mounted upon a printed circuit board of FIG. 29(A).
Figure 29B:
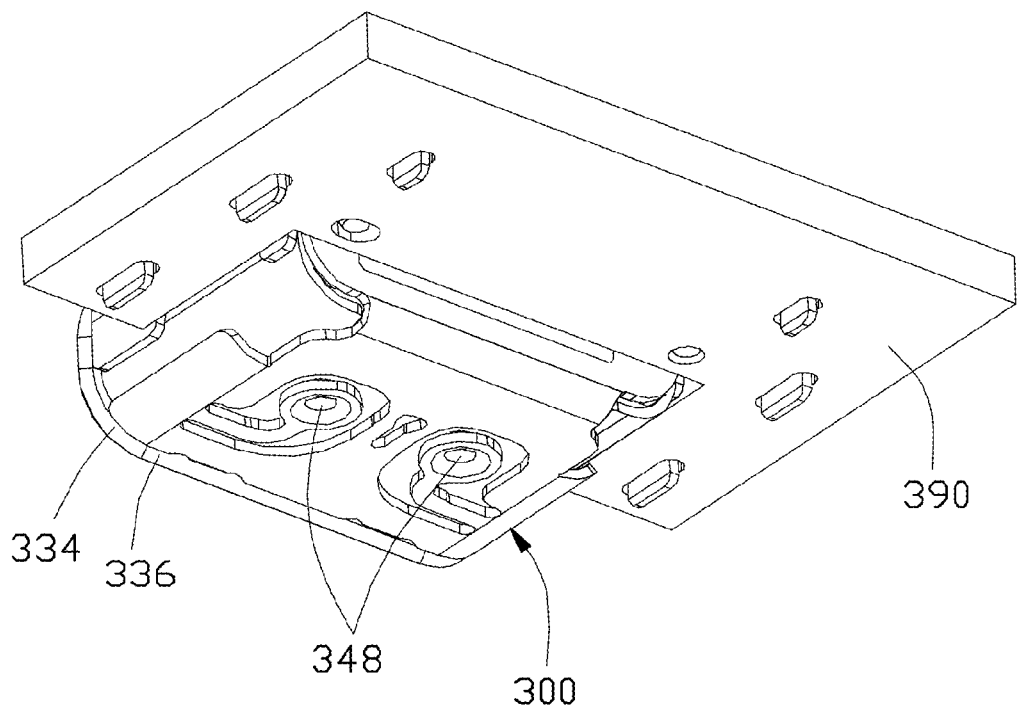
Figure 30A:
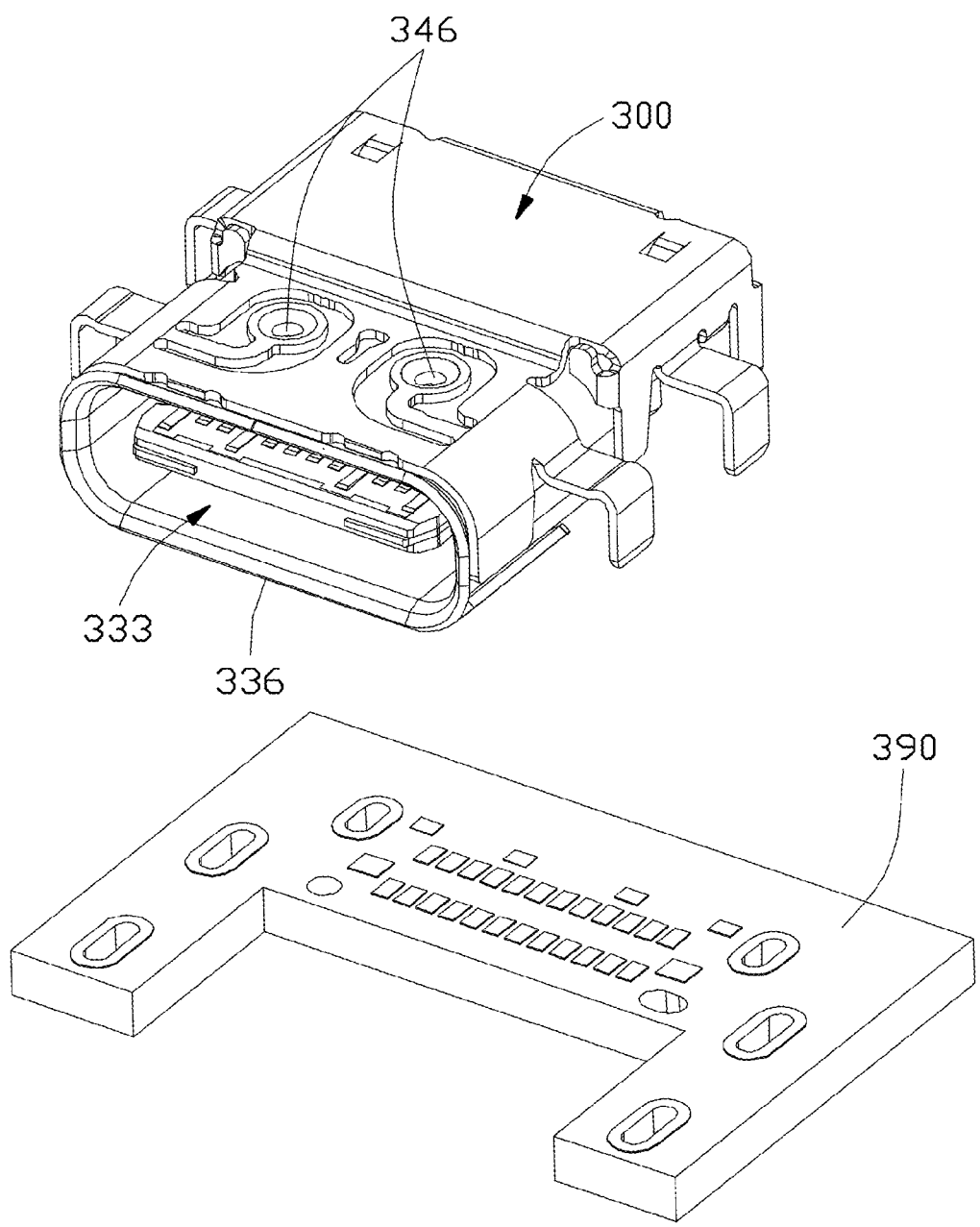
FIG. 30(A) is a front exploded perspective view of the receptacle connector taken away from the printed circuit board of FIG. 29(A).
Figure 30B:
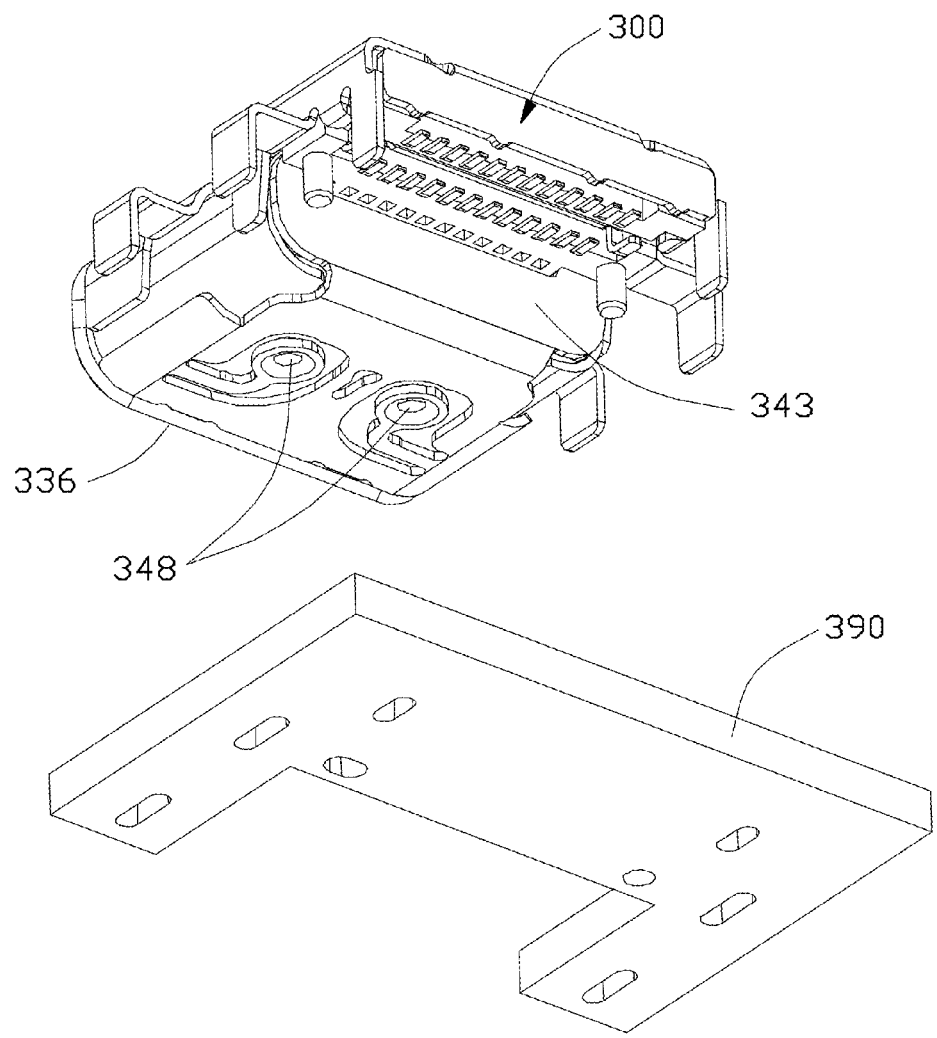
FIG. 30(B) is a rear exploded perspective view of the receptacle connector taken away from the printed circuit board of FIG. 29(B).
Figure 31A:
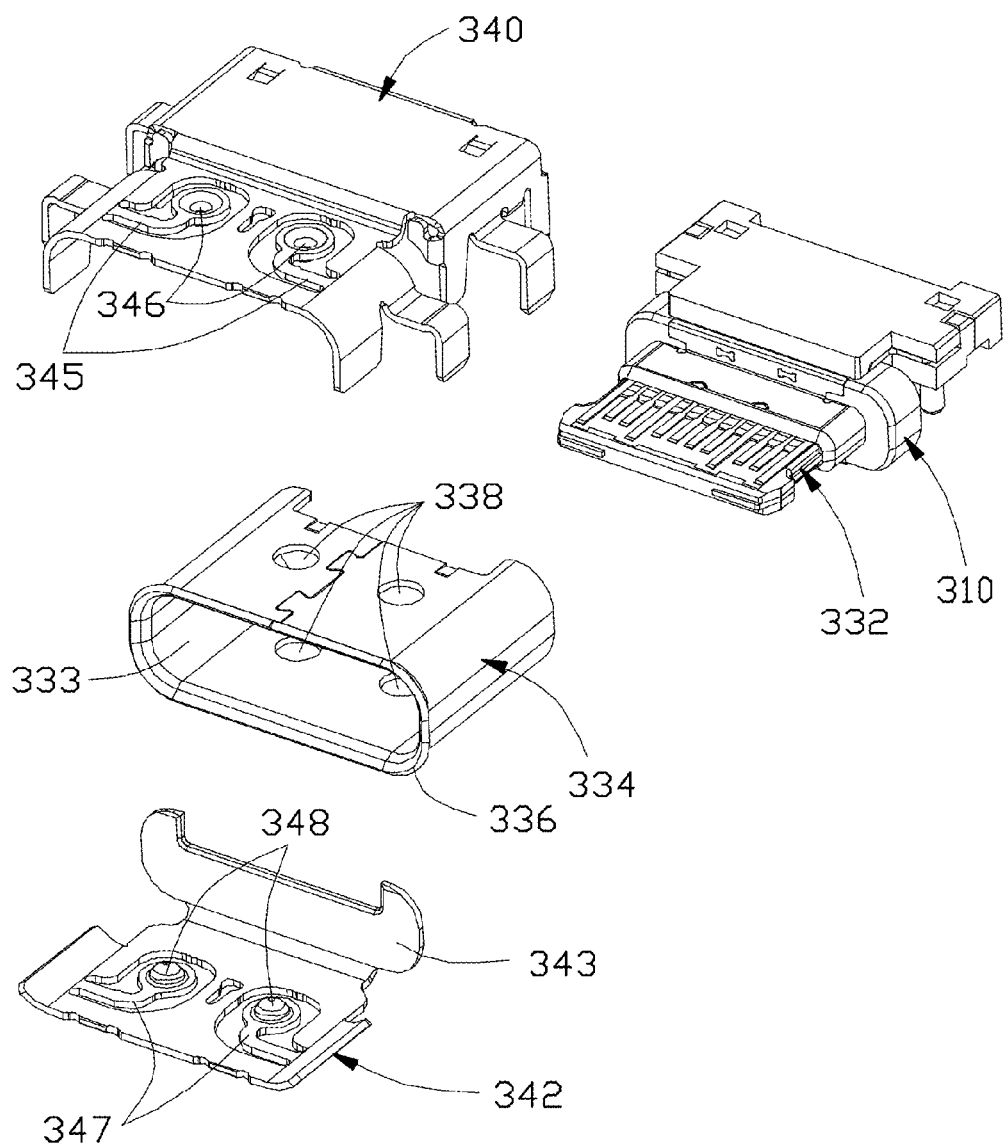
FIG. 31(A) is a further front exploded perspective view of the receptacle connector of FIG. 30(A).
Figure 31B:
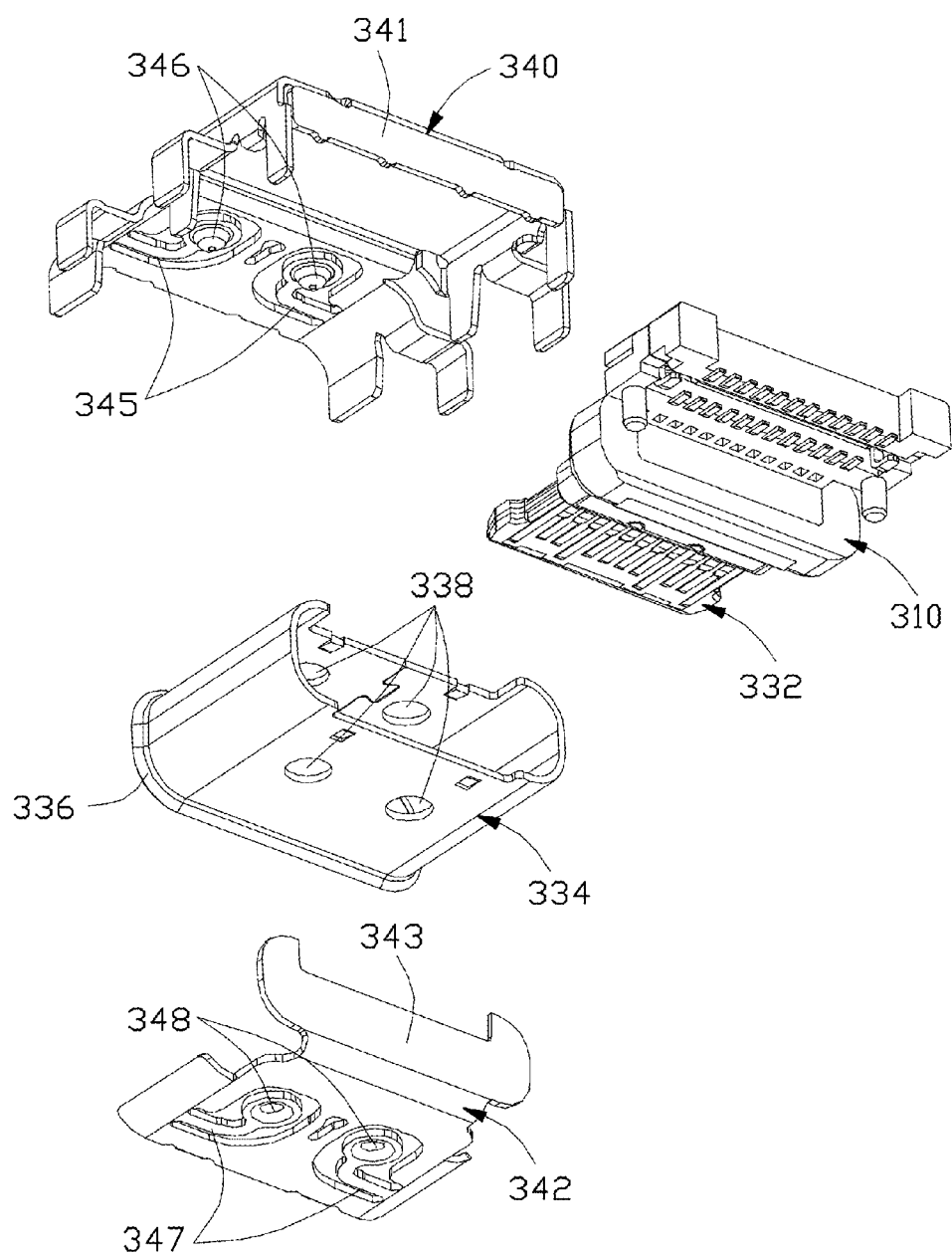
FIG. 31(B) is a further rear exploded perspective view of the receptacle connector of FIG. 30(B).
Figure 32A:
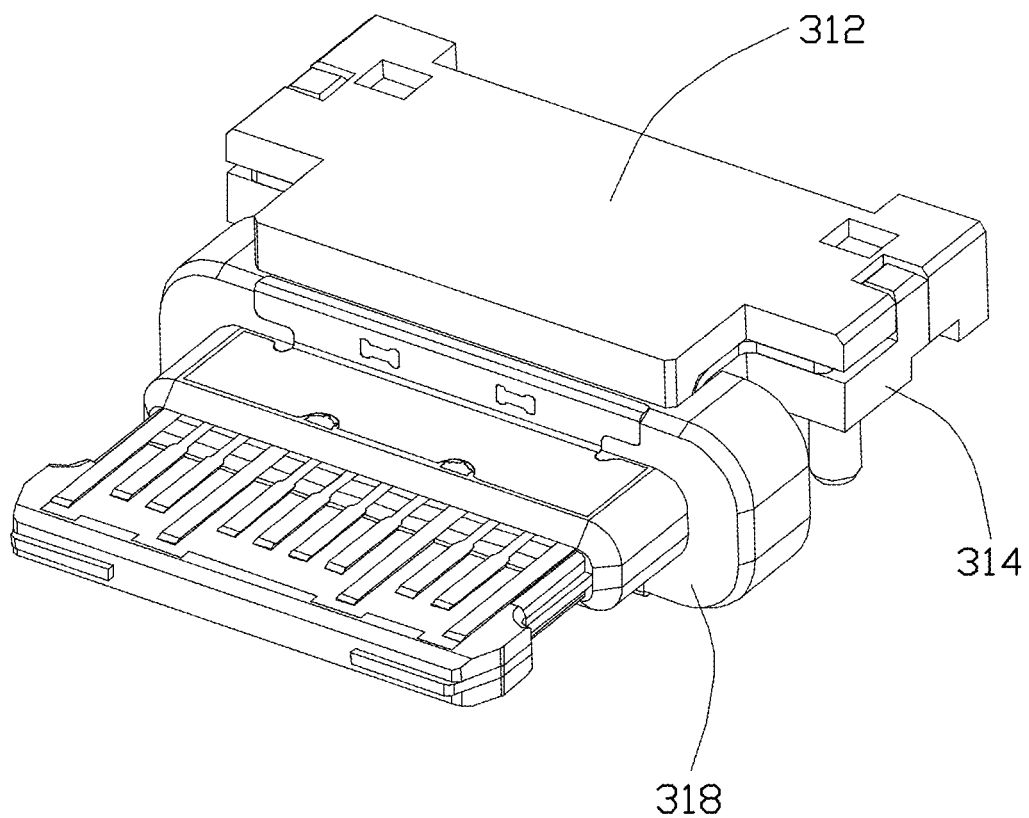
FIG. 32(A) is a front assembled perspective view of a terminal module assembly of the receptacle connector of FIG. 31(A).
Figure 32B:
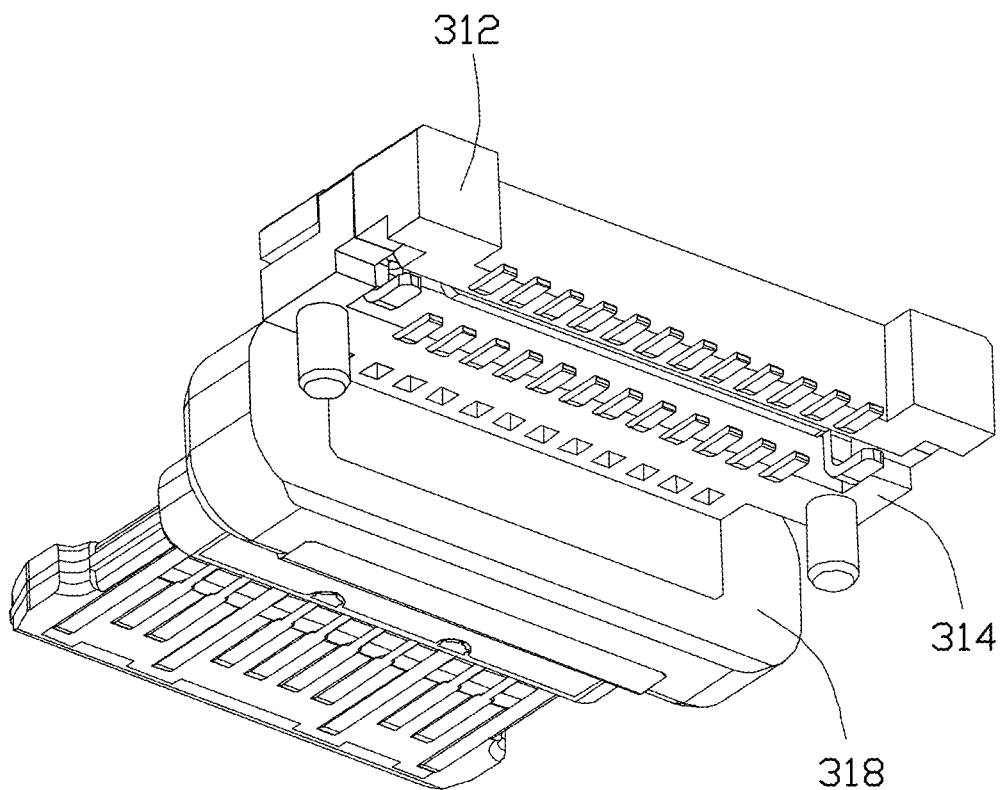
FIG. 32(B) is a front assembled perspective view of a terminal module assembly of the receptacle connector of FIG. 31(B).
Figure 33A:
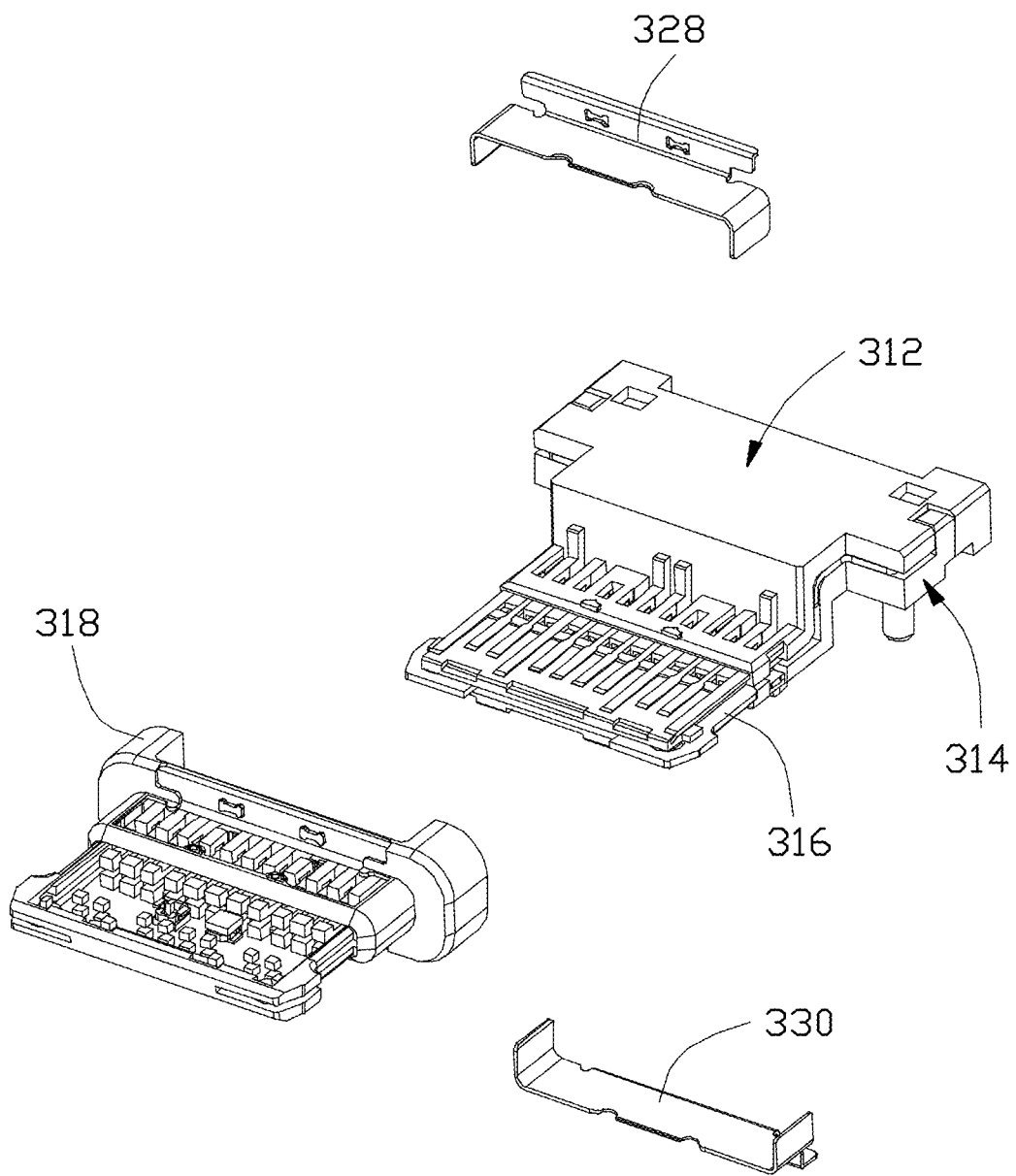
FIG. 33(A) is a front exploded perspective view of the terminal module of the receptacle connector of FIG. 32(A).
Figure 33B:
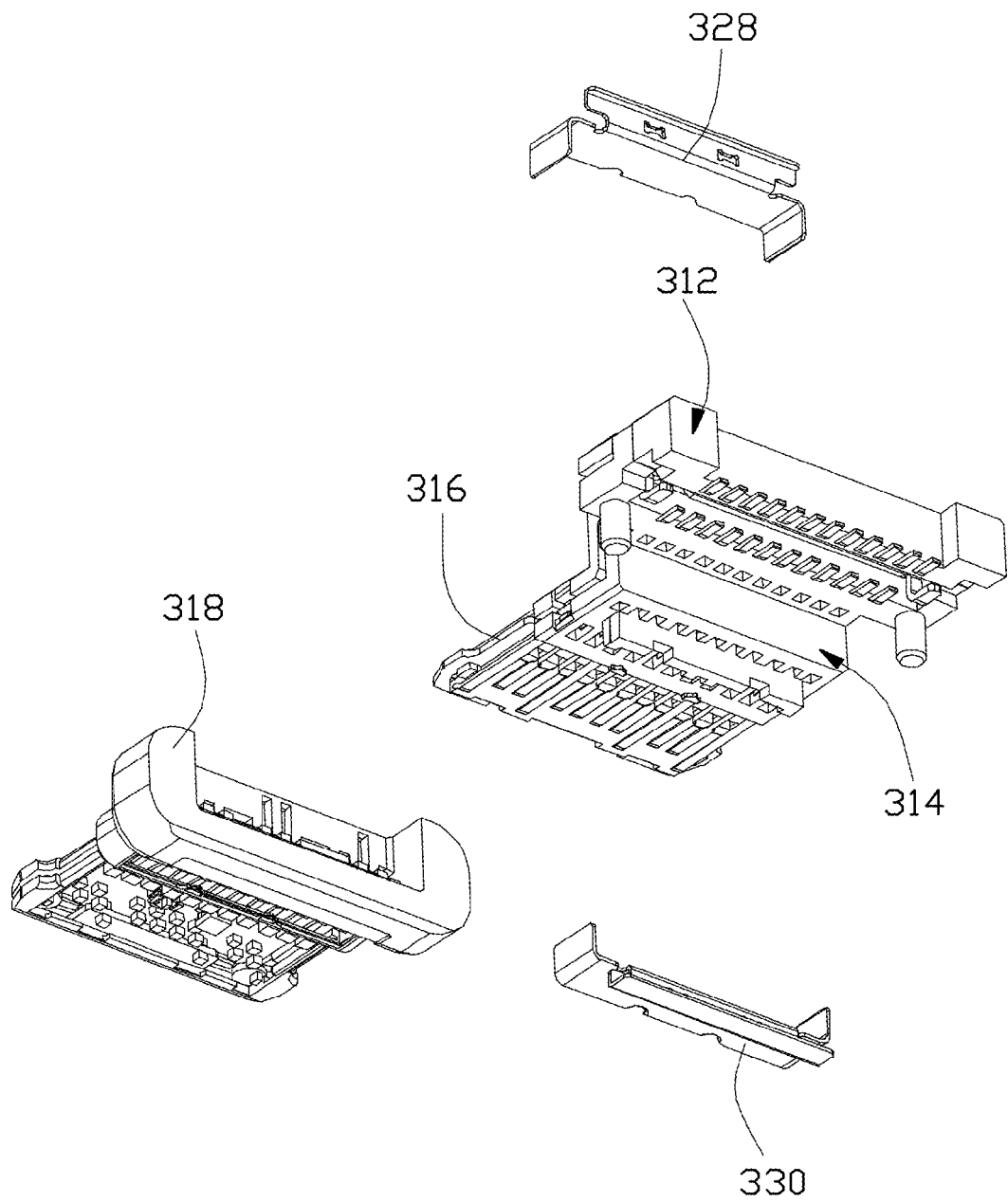
FIG. 33(B) is a rear exploded perspective view of the terminal module of the receptacle connector of FIG. 32(B).
Figure 34A:
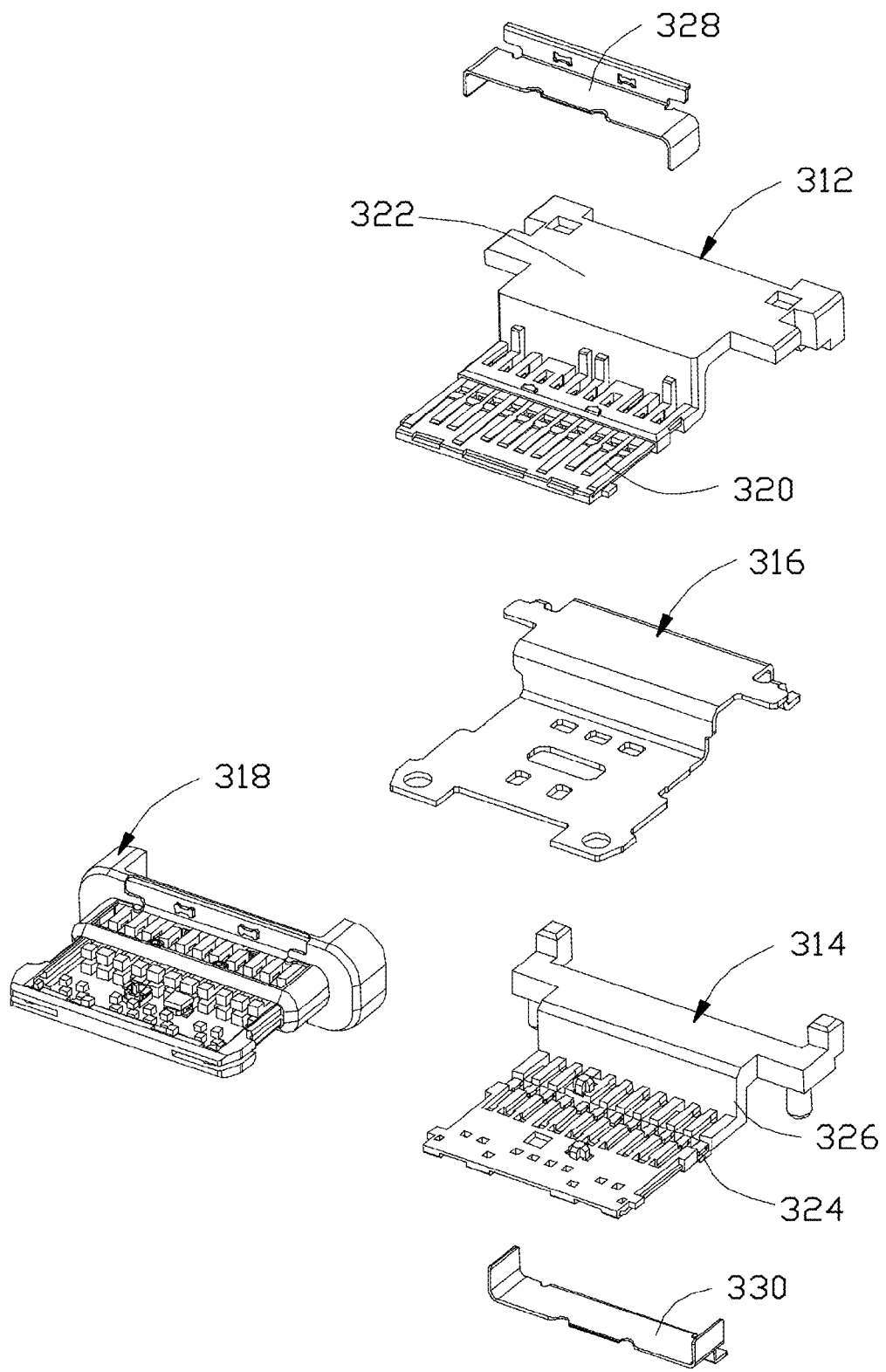
FIG. 34(A) is a further front exploded perspective view of the terminal module of the receptacle connector of FIG. 33(A).
Figure 34B:
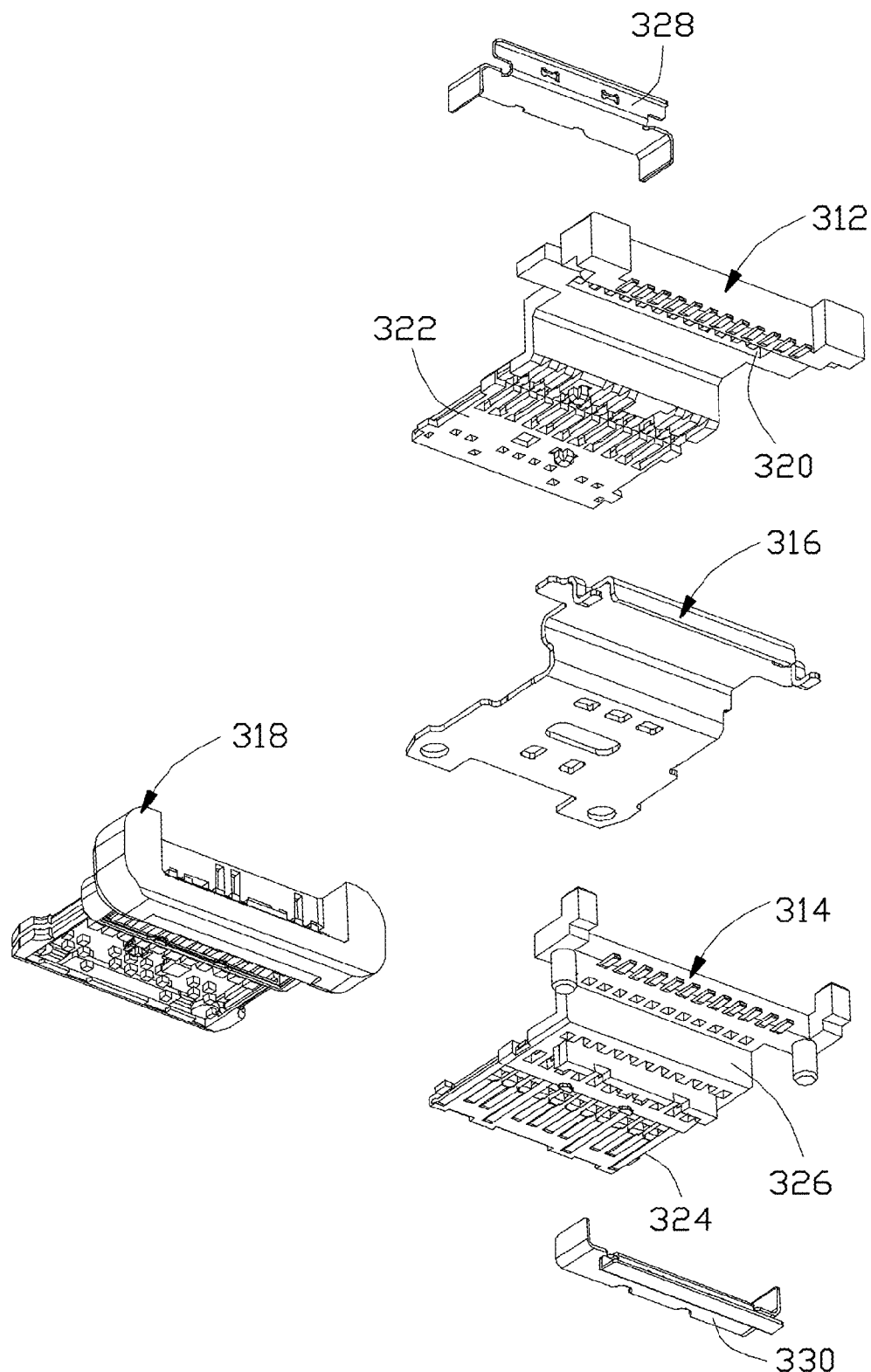
FIG. 34(B) is a further front exploded perspective view of the terminal module of the receptacle connector of FIG. 33(B).
Figure 35A:
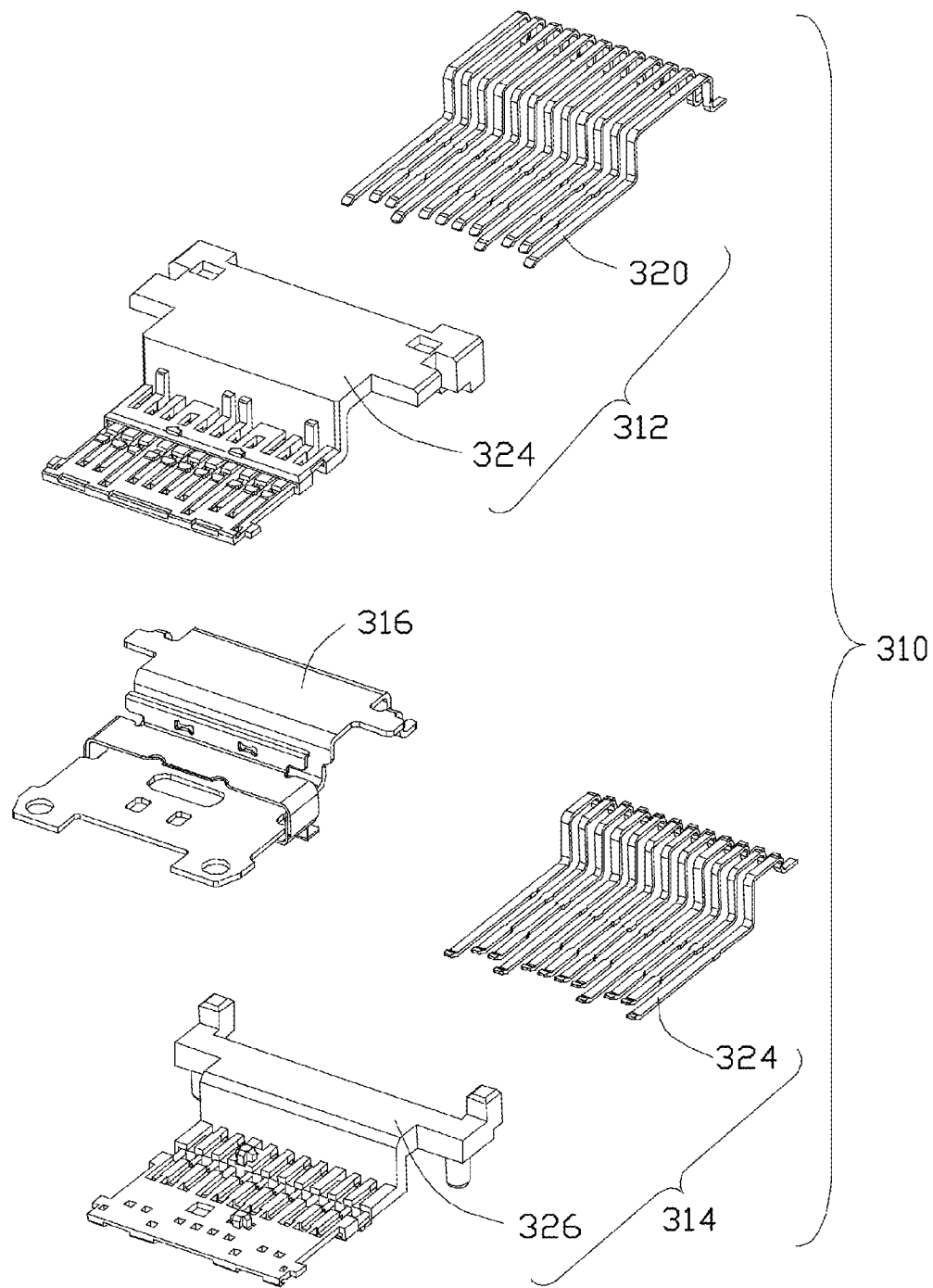
FIG. 35(A) is a further front exploded perspective view of the receptacle connector of FIG. 34(A).
Figure 35B:
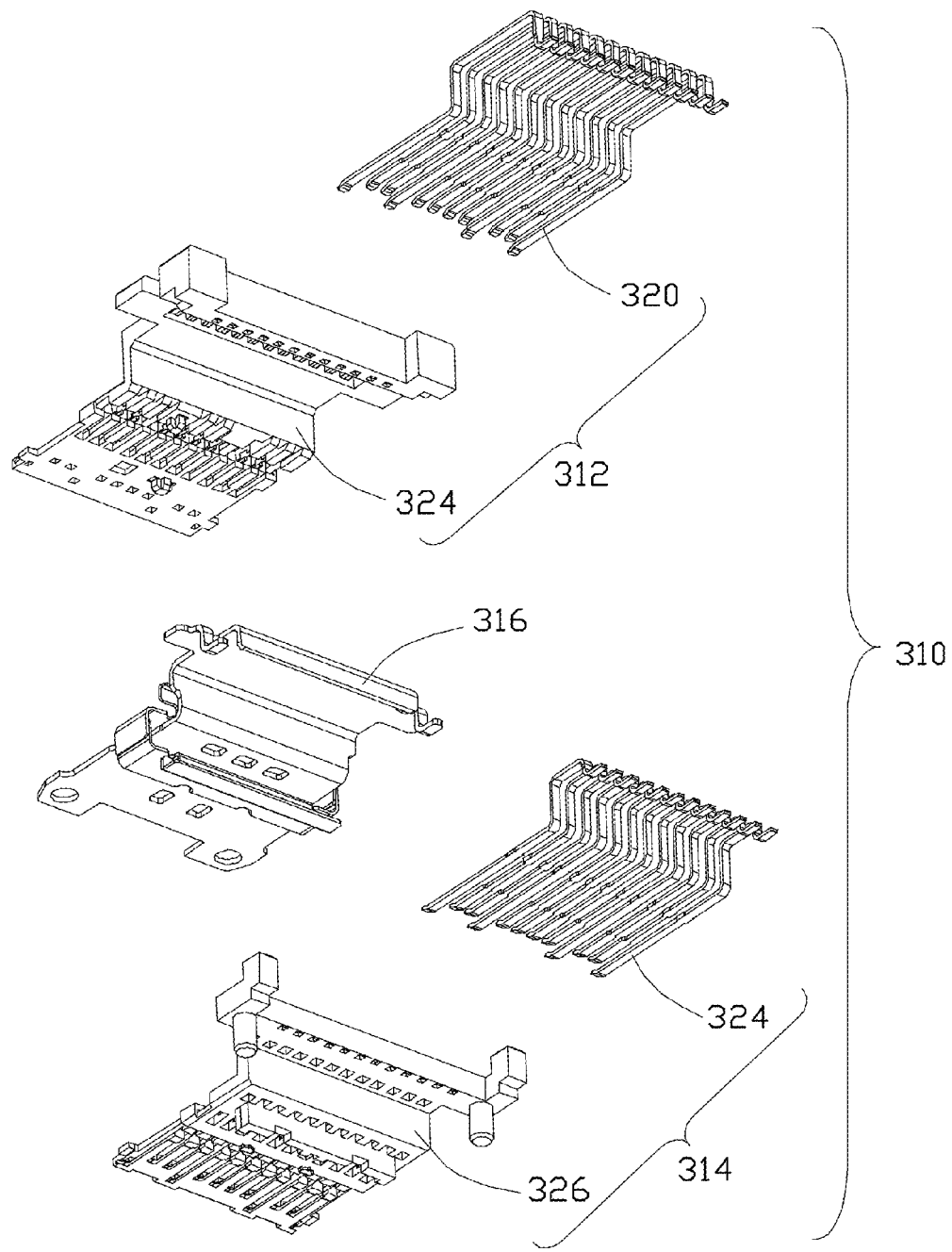
FIG. 35(B) is a further rear exploded perspective view of the receptacle connector of FIG. 34(B).
Figure 36:
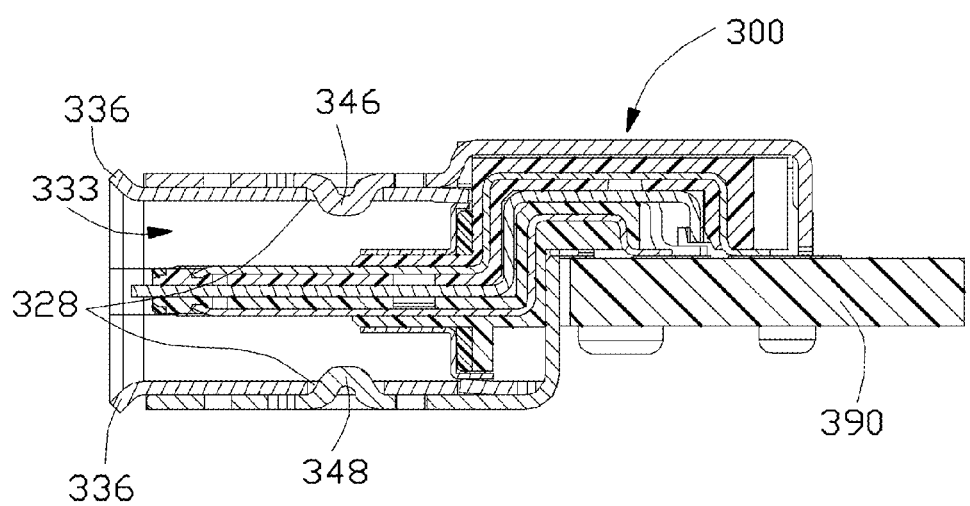
FIG. 36 is a cross-sectional view of the receptacle connector mounted on the printed circuit board of FIG. 29(A).
Figure 37:
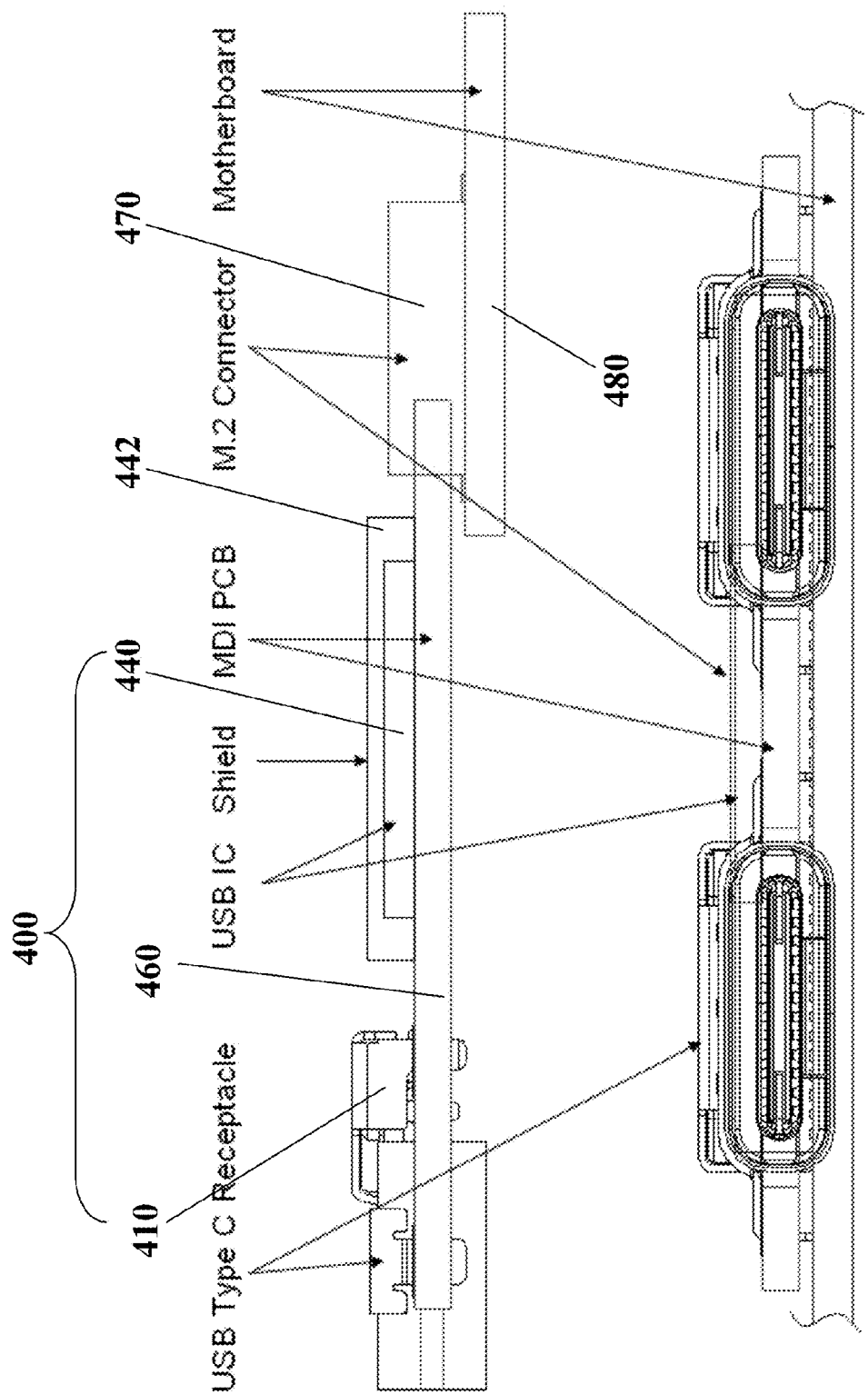
FIG. 37 is a side view and a front view of a system using a module, which includes a low cost PCB with a chip thereon and a flippable connector as an I/O connector, and a mother board having thereon a connector linked to said low cost PCB, of seventh embodiment.
Figure 38:
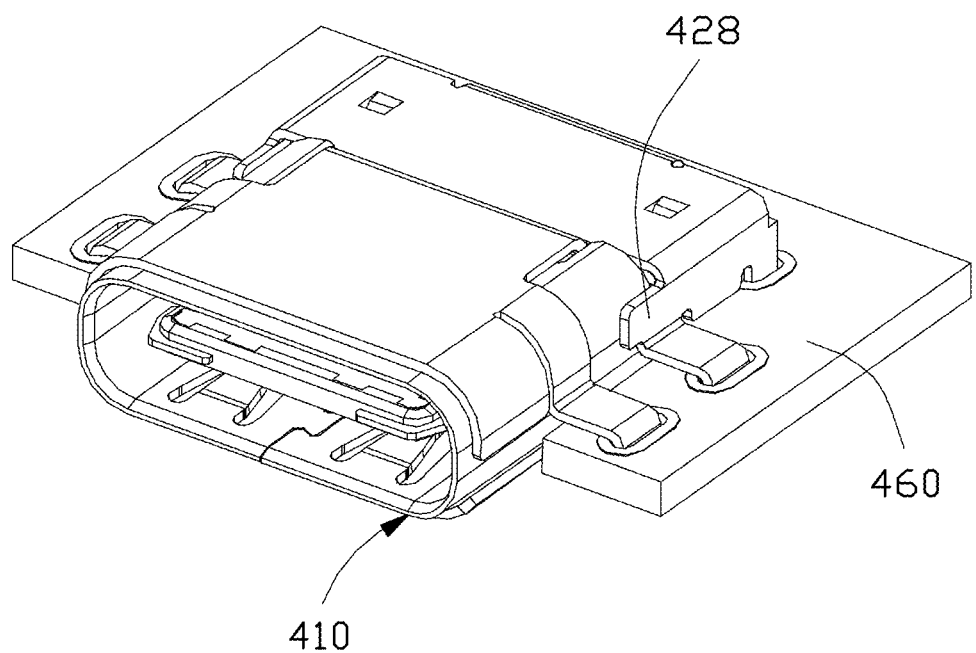
FIG. 38 is a perspective view of the receptacle connector mounted upon the low cost PCB derived from FIG. 37
Figure 39:
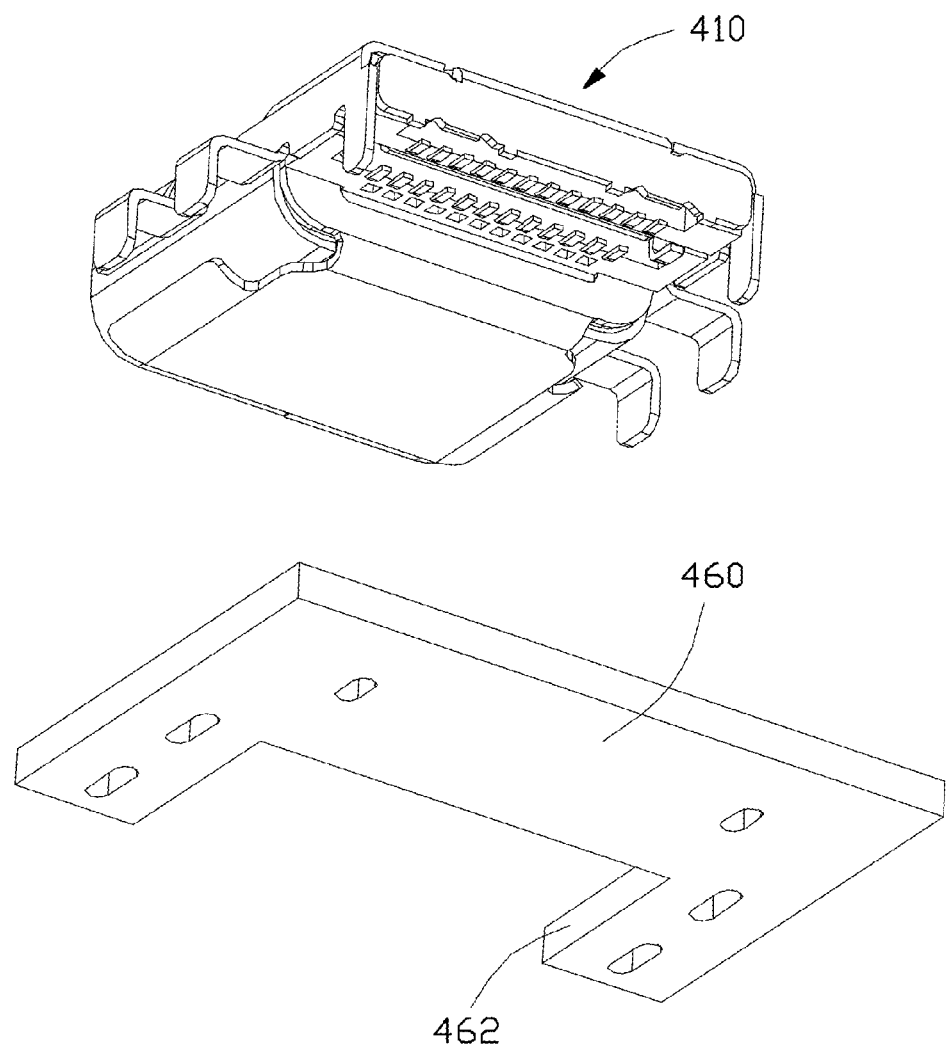
FIG. 39 is a rear exploded perspective view of the receptacle connector removed from the low cost PCB of FIG. 38.
Figure 40A:
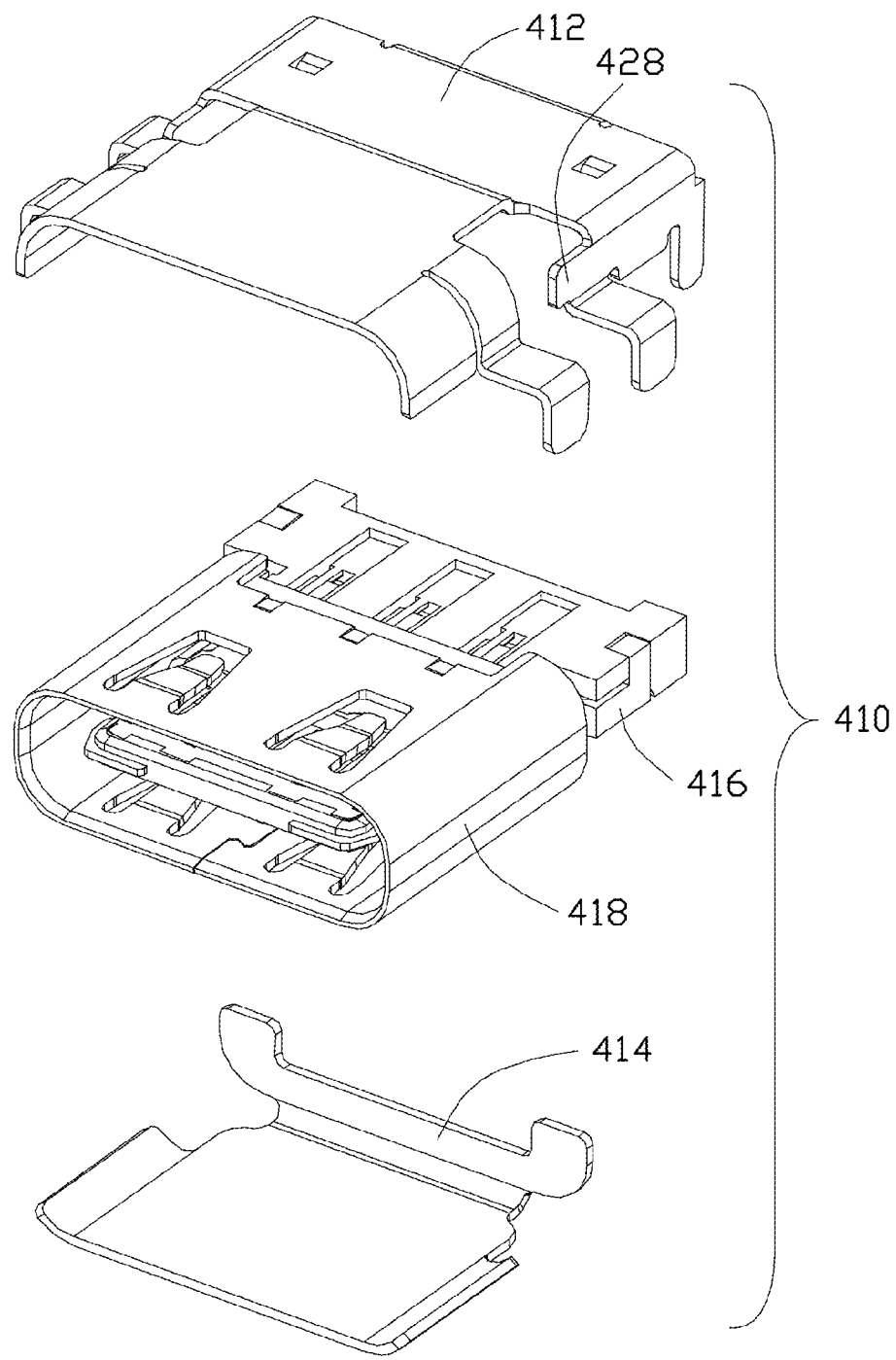
FIG. 40(A) is a further front exploded perspective view of the receptacle connector of FIG. 39.
Figure 40B:
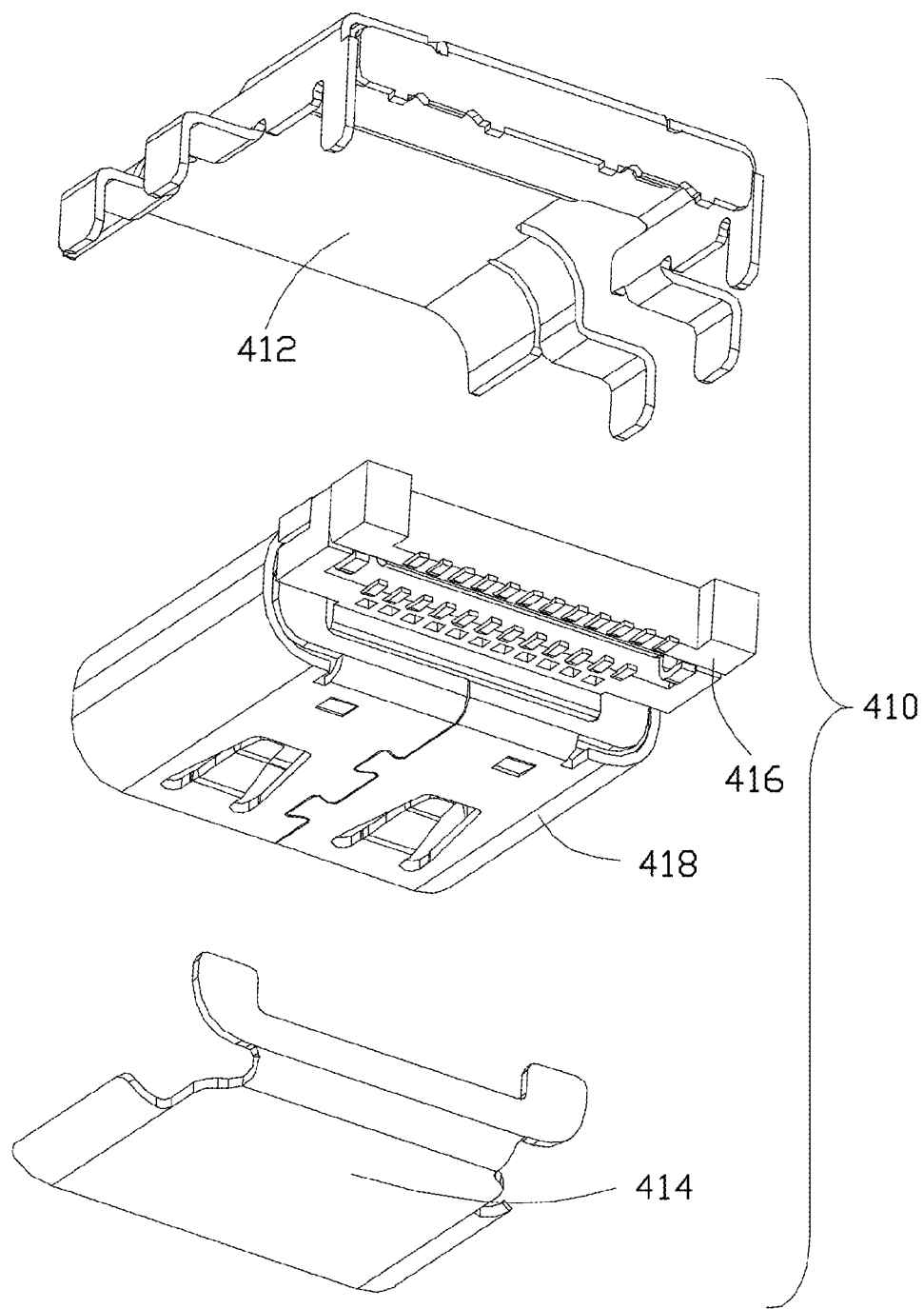
FIG. 40(B) is the rear perspective view of the receptacle connector of FIG. 40(A).
Figure 41:
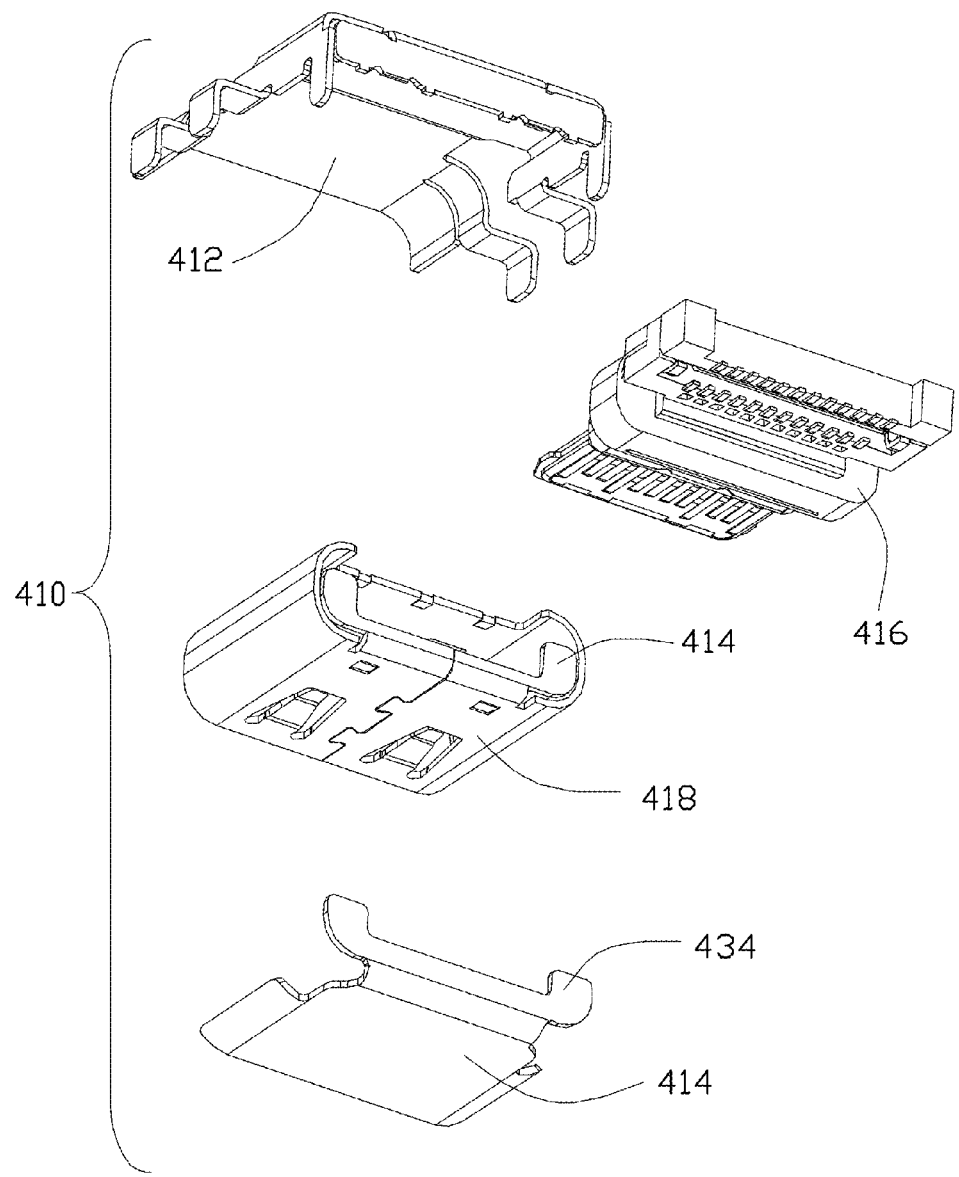
FIG. 41 is a rear assembled perspective view of the receptacle connector mounted upon a printed circuit board of FIG. 40(B).
Figure 42A:
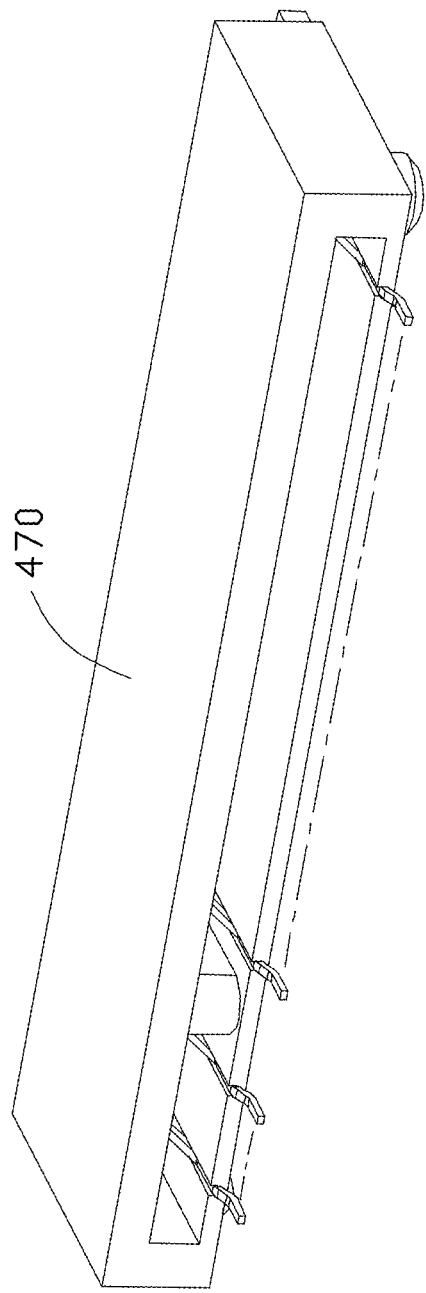
FIG. 42(A) is a front and top perspective view of the card edge connector of FIG. 37.
Figure 42B:
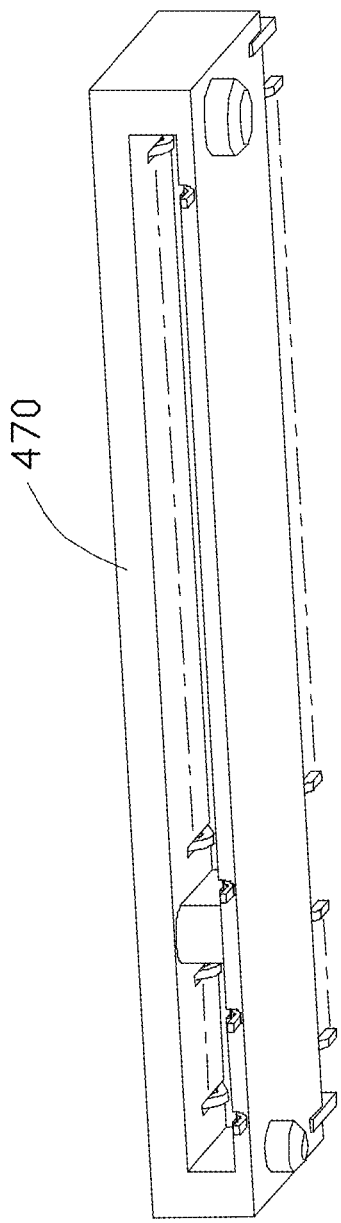
FIG. 42(B) is a front and bottom exploded perspective view of the card edge connector of FIG. 42(A).
Figure 42C:
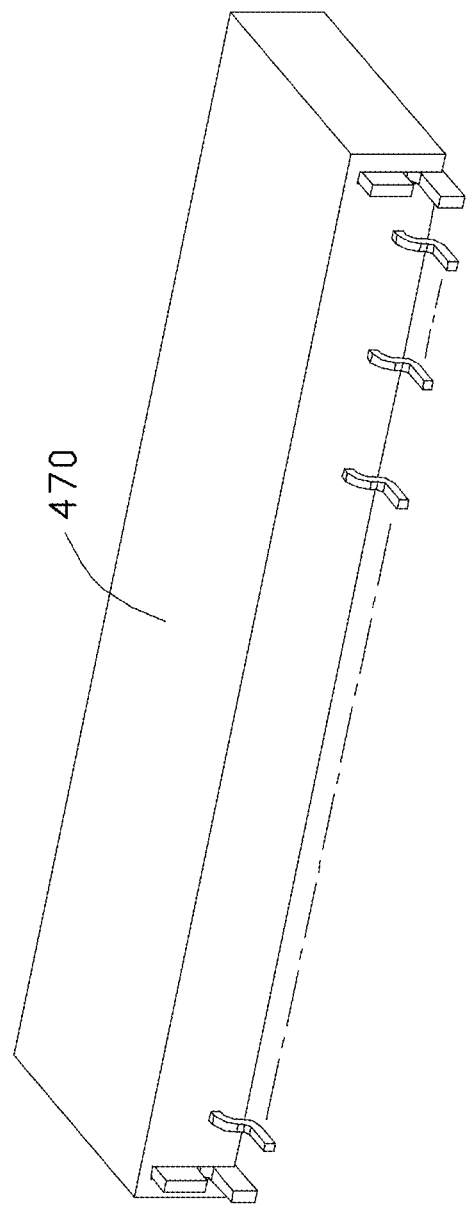
FIG. 42(C) is a rear and top perspective view of the card edge connector of FIG. 42(A).
Figure 43:
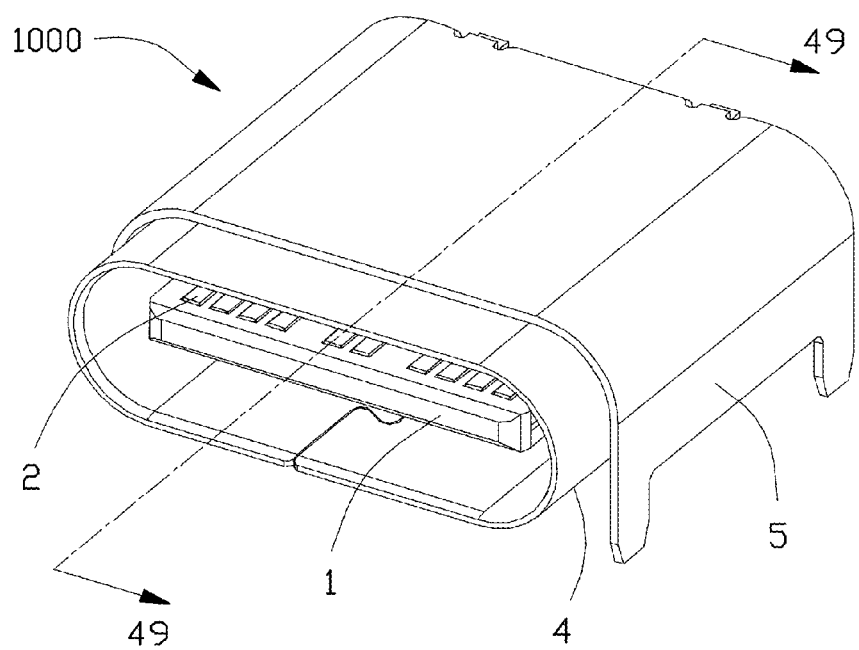
FIG. 43 is a front and top perspective view of a receptacle connector of an eighth embodiment of according to the invention.
Figure 44:
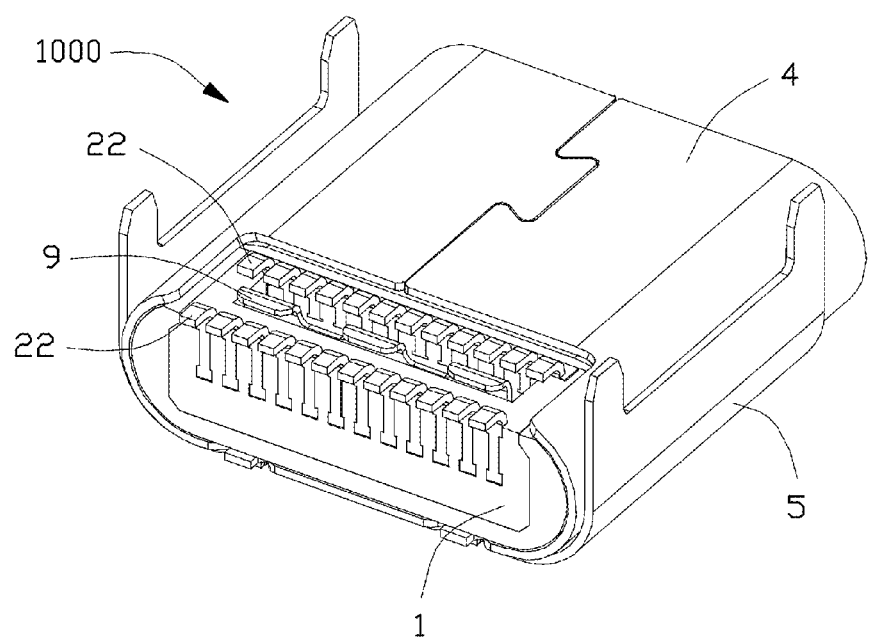
FIG. 44 is a rear and bottom perspective view of the receptacle connector of FIG. 43.
Figure 45:
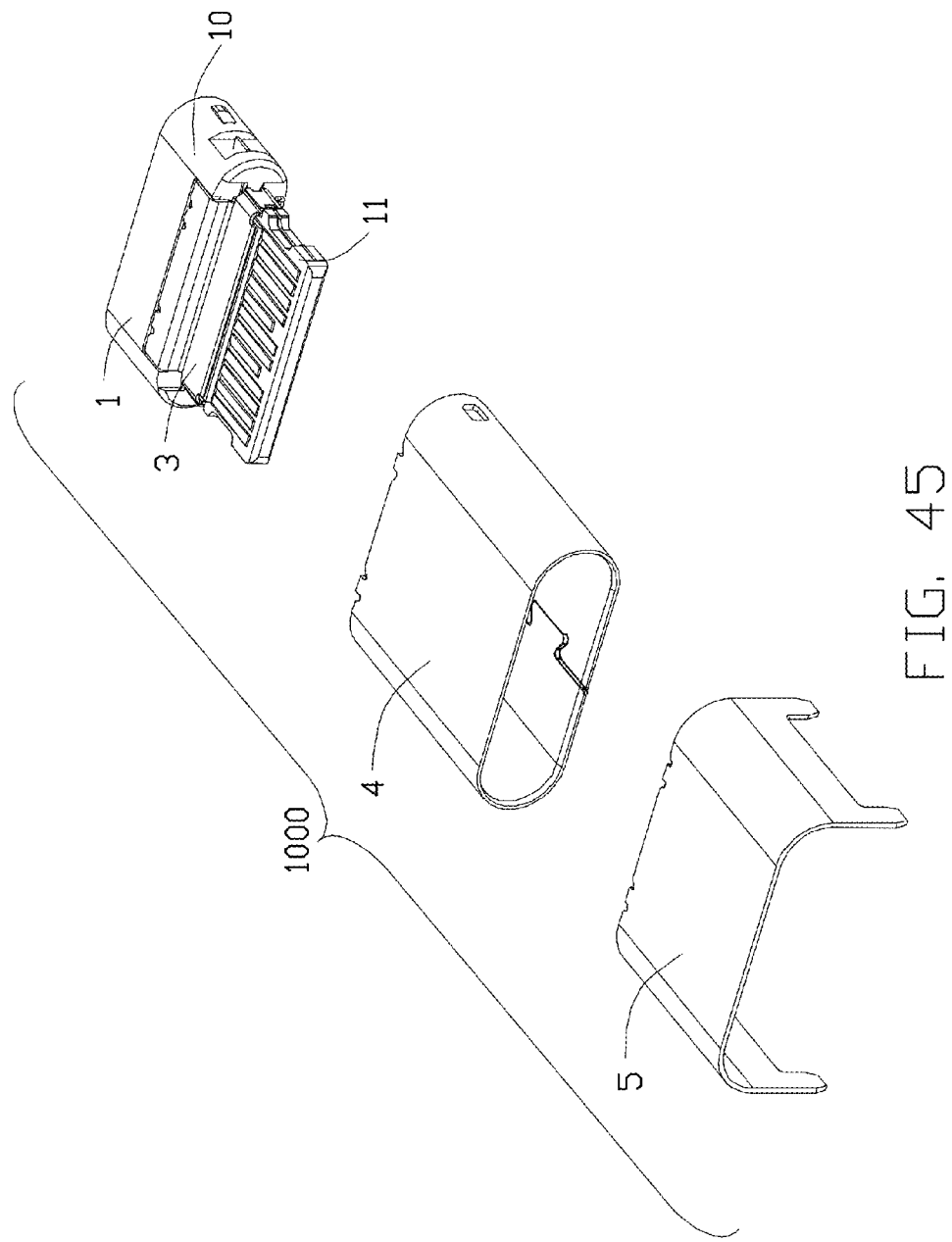
FIG. 45 is an exploded perspective view of the receptacle connector of FIG. 43.
Figure 46:
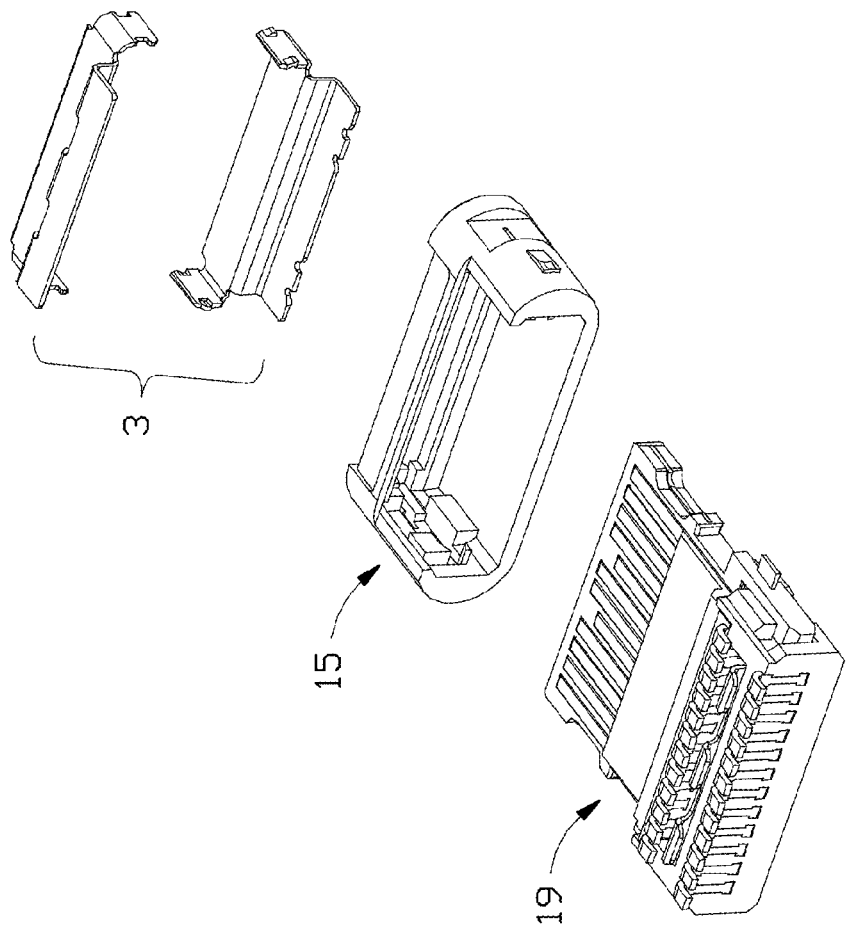
FIG. 46 is an exploded perspective view of the terminal module of the receptacle connector of FIG. 45.
Figure 47A:
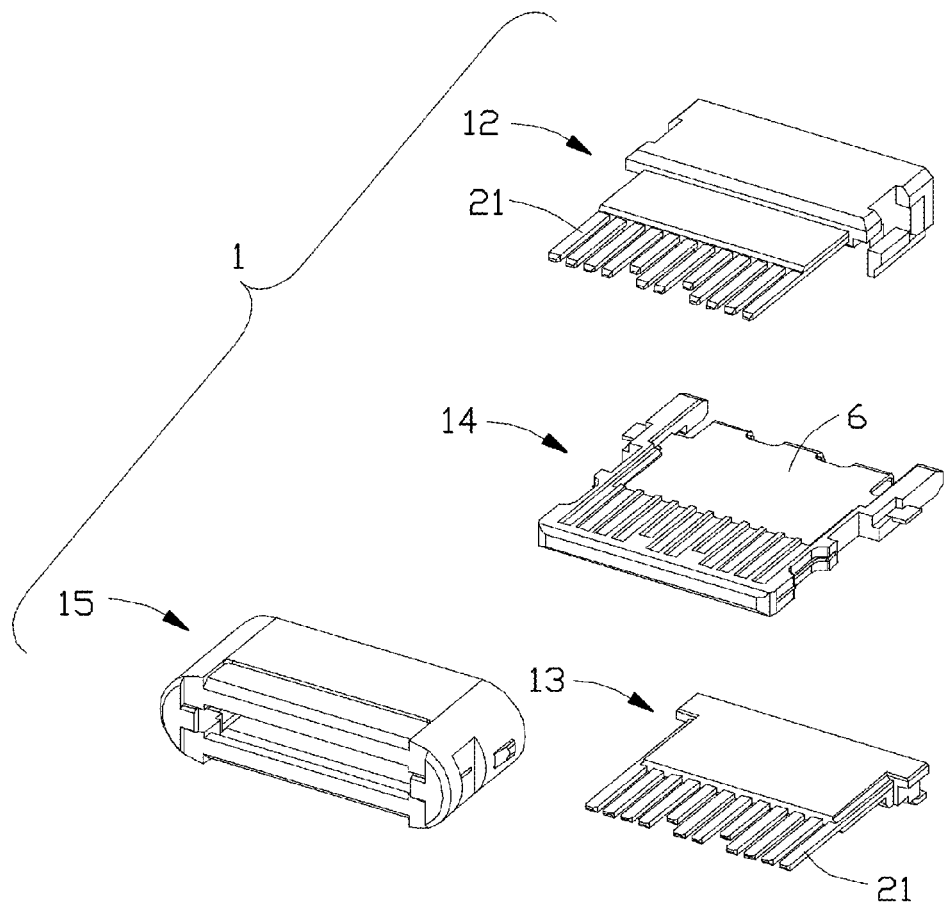
FIG. 47(A) is a front exploded perspective view of the terminal module without the grounding collars of the receptacle connector of FIG. 45.
Figure 47B:
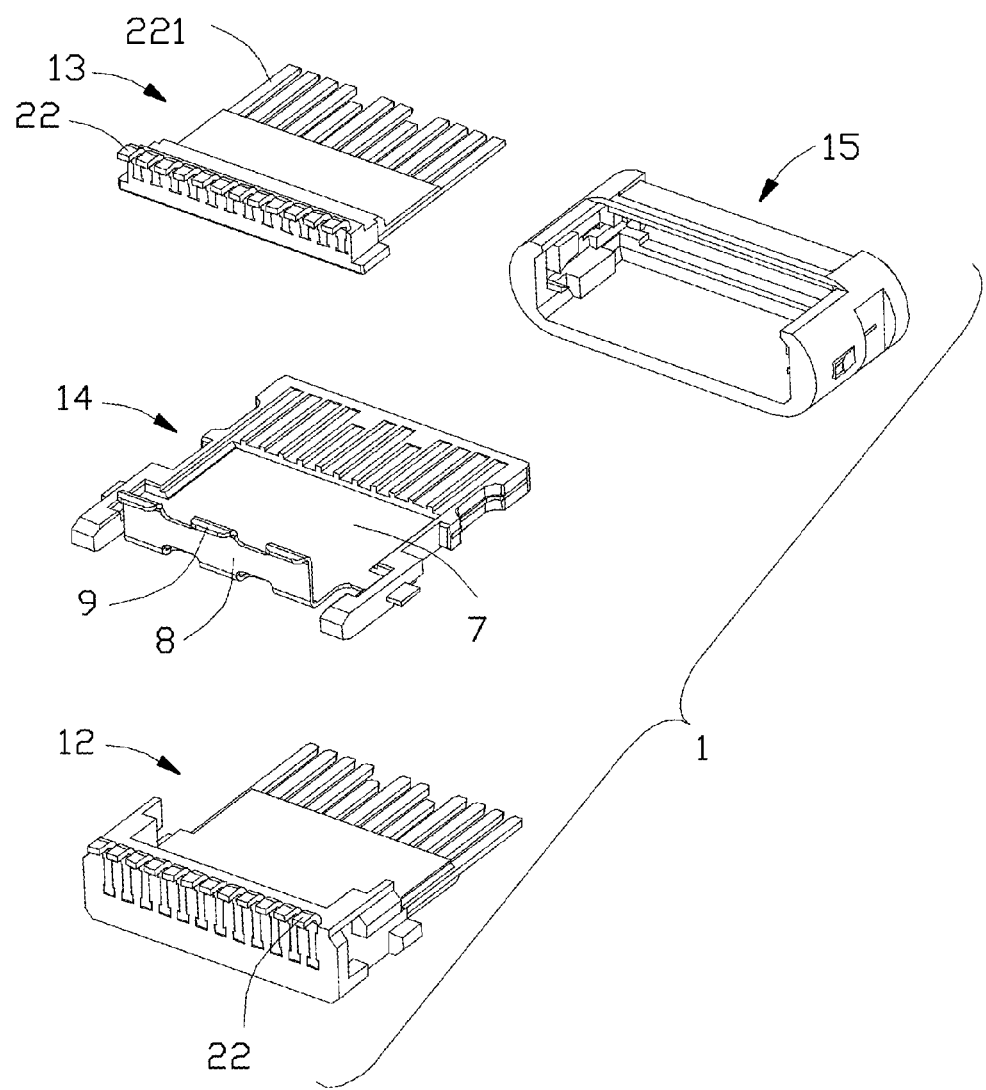
FIG. 47(B) is a rear exploded perspective view of the terminal module of the receptacle connector of FIG. 47(A).
Figure 48:
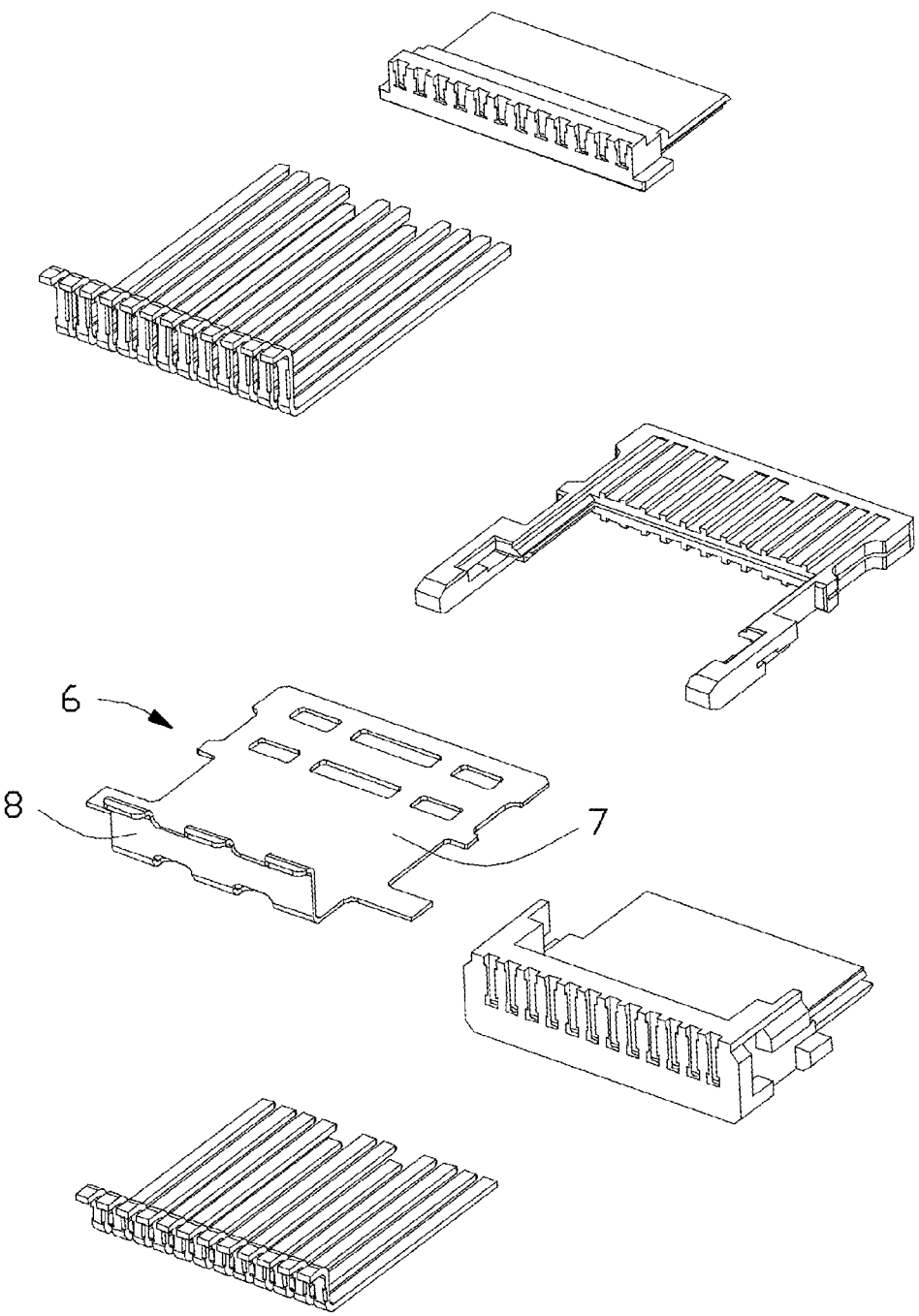
FIG. 48 is a further exploded perspective view of the terminal module of the receptacle connector of FIG. 47(B).
Figure 49:
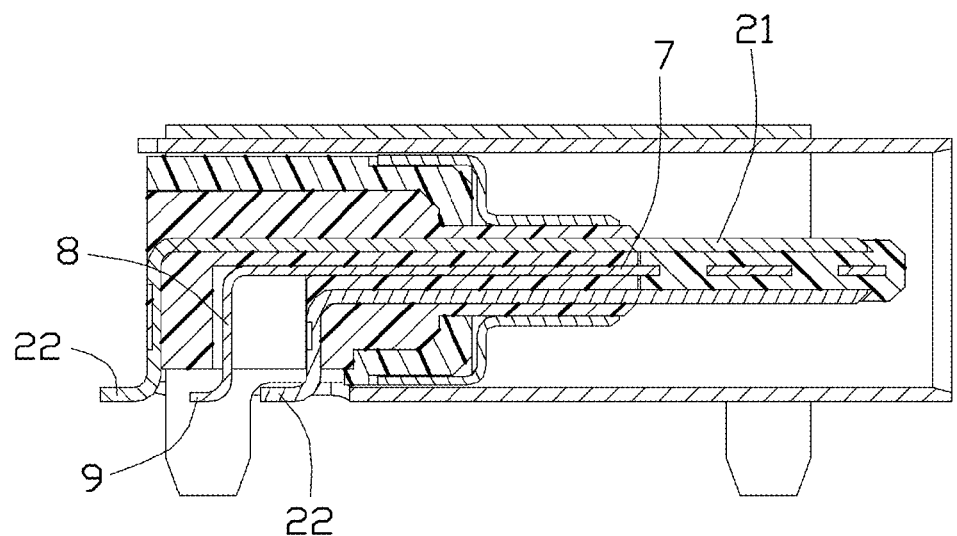
FIG. 49 is a cross sectional view of the receptacle connector taken along lines 49-49 in FIG. 43.

FIGS. 23-24 show a fourth embodiment of the receptacle connector 200b similar to the embodiment disclosed in FIGS. 19-21 with tiny differences wherein the front edge 2121 of the shield 210 is equipped with a plurality of flared flanges for easy insertion of the plug connector. The shielding plate 250 defines two tails 255b extending from the rear shielding portion 253. FIGS. 25(A) and 25(B) show another embodiment of the shielding plate 250' wherein the contacting regions 256' is equipped with a lance 259' at the tip to secured to the main body/the first shielding portion of the shielding plate 250' so as to prevent tilting of the contacting regions 256' relative to the shielding plate 250' during the high pressure insert molding process.

FIGS. 26-28(B) show a fifth embodiment of the receptacle connector 600 mounted upon and within a notch of the printed circuit board 650 wherein the receptacle connector 600 includes a terminal module or an insulative housing (not shown, which is similar to the previous embodiments) enclosed within a metallic shield 602 which forms a capsular mating cavity or mating port 604 and is equipped with a plurality of spring tangs 606 extending into the mating cavity 604 for retaining the plug connector therein. Different from the first embodiment disclosing the shield 50 forming both the front capsular section and the rear partially rectangular section, the shield 602 in this embodiment essentially only forms the front capsular section for easing manufacturing consideration. On the other hand, the bracket 95 in the first embodiment is attached to the bottom side of the shield 50, while in this embodiment the metallic bracket 610 is secured to a top side of the shield 602 and forms not only the partially capsular front section 612 to compliantly cover the upper portion of the shield 602 but also the partially rectangular rear section 614 to compliantly cover the upstanding housing (not shown). To efficiently secure to the shield 602, the top wall 616 and the side walls 618 of the front section 612 of the bracket 610 is welded to the shield 602, and the rear section 614 forms securing tabs 620 for engagement within corresponding recesses in the top face of the housing (not shown). One feature of this embodiment is that the bracket 610 forms a curved or S-shaped cross-sectional joint section 622 between the front section 612 and the rear section 614 for compensating minor variations regarding the position of the shield 602 in the height direction which is expected to be little adjustable relative to the printed circuit board 650. Notably, the relative position of the mating port 604 with regard to the printed circuit board 650 may be different according to the computer maker so the adjustability of the mating port in the vertical direction is desired. To efficiently support the whole connector 600 within the notch 652 and upon the printed circuit board 650, the front section 612 of the bracket 610 includes a pair of right angle legs 624, and the rear section 614 of the bracket 610 includes a pair of right angle legs 626 for mounting to the printed circuit board 650. The rear section 614 further includes a pair of securing arms 628 adjacent to the joint section 622 to be welded to the rear portion of the shield 610 for reinforcement of the whole connector structure around the joint section 622, and a pair of mounting legs 630 around the rear face to be mounted to the printed circuit board 650 for reinforcing securing among the bracket 610, the printed circuit board 650 and the housing (not shown) wherein the mounting legs 630 is closer to the securing tabs 620 which locks the housing (not shown). A pair of blocking tabs 632 are formed by two sides of the joint section 622 for preventing EMI invasion along the front-to-back direction. It is noted that the shield 602 has a rear wall 634 and the bracket has a rear wall 636 both for EMI protection along the front-to-back direction similar to the blocking tabs 632. Understandably, both the rear walls 634, 636 may be secured to the corresponding side walls via a pair of locking ears as shown in the previous embodiments. Understandably, the securing between the shield 602 and the bracket 610 via welding may be replaced with the mechanical latching tabs or similar mechanical means.

Referring to FIGS. 29(A)-36 showing a receptacle connector 300 of a sixth embodiment of this invention, the receptacle connector 300 mounted upon and within the notch of the printed circuit board 390, includes a terminal module 310 essentially composed of an upper part 312 and a lower part 314 commonly sandwiching a shielding plate 316 therebetween and further integrated together with a middle insulator 318. The upper part 312 includes a plurality of upper contacts 320 integrally formed within an upper insulator 322 via a first stage insert molding process, and the lower part 314 includes a plurality of lower contacts 324 integrally formed within a lower insulator 326 via another first stage insert molding process. The formed upper part 312 and the formed lower part 314 commonly sandwich the shielding plate 316 and integrally formed with the middle insulator 318 via a second stage insert molding process. Notably, the upper EMI collar 328 and the lower EMI collar 330 are integrally formed with the corresponding upper part 312 and lower part 314 via the middle insulator 318 at the second stage insert molding process. The terminal module 310 formed by two-stage insert molding process can be referred to the previous filed application 62/001,084. The terminal module 310 forms a mating tongue 332 on the front portion for mating with the corresponding plug connector.

A metallic shield 334 is attached to the front portion of the terminal module 310 to enclose the mating tongue 332 to form a mating cavity 333 wherein a continuously uninterrupted flared flange 336 is formed at the front edge of the shield 334 in front of the mating cavity 333 and plurality of through holes 338 are formed in the shield 334. The upper metallic bracket 340 is attached on an upper side of the shield 334 and the lower metallic bracket 342 is attached on a lower side of the shield 334. The upper bracket 340 includes an upper rear wall 341 to shield the upper rear upper portion of the terminal module 310 and the lower bracket 342 includes a lower rear wall 343 to shield the lower rear portion of the terminal module 310. The upper bracket 340 further includes a plurality of spring arms 345 with the engaging tips 346 extending through the corresponding through holes 338 into the mating cavity 333 for engagement with the plug connector. Similarly, the lower bracket 342 further includes a plurality of spring arms 347 with the engaging tips 348 extending through the corresponding through holes 338 into the mating cavity 333 for engagement with the plug connector. The feature of this embodiment is to provide the continuously uninterrupted flared flange on the front edge of the shield 334 not only to protectively hide the front edges of the upper bracket 340 and the lower bracket 342 but also provide superior shielding effect circumferentially, compared with the interrupted flared flange disclosed in the prior art.

It is also noted that because the fine pitch of the contacts of the receptacle connector, the traditional vias on the mother board are essentially unfit thereto, and the so-call micro vias are expected to be used for the fine pitch receptacle connector. Anyhow, the expense of the PCB construction using micro vias is twice the price as standard PCB's, and it is too expensive for the mother board size PCB's. An alternative way is presented here to have it done economically. Referring to FIGS. 37-42(C) showing a seventh embodiment of this invention, a system includes a module 400 where the receptacle connector 410 and a chipset 440 for the wired signal are both mounted upon a small/low cost PCB 460 which is suitable for micro vias.

The chipset 440 may be optionally covered by a metallic shell 442. A card edge connector 470 is mounted upon the mother board 480 to receive one edge of the small PCB 460 for connection therebetween. Understandably, the card edge connector 470 can be replaced with other type connector(s) or cable assemblies for connecting the small PCB 460 and the mother board 480. Understandably, even though two flippable receptacle connectors 410 are used with one chipset 440, other number combinations can be used, e.g., only one receptacle connector 410 cooperating with one chipset 440 as shown in FIGS. 37-42(C). The receptacle connector 410 includes a terminal module enclosed in the metallic shield 418 and further is equipped with the upper metallic bracket 412 and the lower metallic bracket 414 so as to efficiently shield the whole connector 410 in the three dimensional way for full EMI protection. Notably, in this embodiment, the receptacle connector 410 is mounted within a notch 462 of the small PCB 460 in a sinking type for performing a lower profile configuration. Similarly, the card edge connector 470 may be mounted within a notch of the mother board 480 in a similar way for lowering the profile of the whole assembly.

FIGS. 43 through 49 show a receptacle connector 1000 of an eighth embodiment, the receptacle connector 1000 includes an insulating housing 1 with a base portion 10 and a mating tongue 11, and contacts 2 and a pair of grounding piece 3, a metallic shield 4 and an upper bracket 5. The insulating housing 1 includes an upper parts 12 loaded with an upper row of the contacts, a lower part 13 loaded with a lower row of contacts and a middle part 14 loaded with a shielding plate 6, the shielding plate is inserted molded with the middle parts. Said three parts is vertically stacked with each other to for a sub-assembly and then the sub-assembly is inserted molded with an insulating base 15. Therefore, the insulative housing or terminal module is formed. The pair of grounding pieces 3 are assembled to the root of the mating tongue.

The shielding plate 6 defines a front shielding portion 7 embedded in the mating tongue 11 and disposed between the contacts portions 21 of the upper and lower rows of the contacts 2 and a rear shielding portion 8 disposed between the tails 22 of the upper and lower rows of the contacts. Tails 9 extend from the rear shielding portion 8 to be mounted on a printed circuit board. Please notes, the insulating base 15 is only form the base portion of the insulating housing, the mating tongue 11 is formed by the middle part 14, the contacting portions 21 of the contacts 2 are inserted in the terminal grooves defined on the mating tongue of the middle part.

Figure 50:
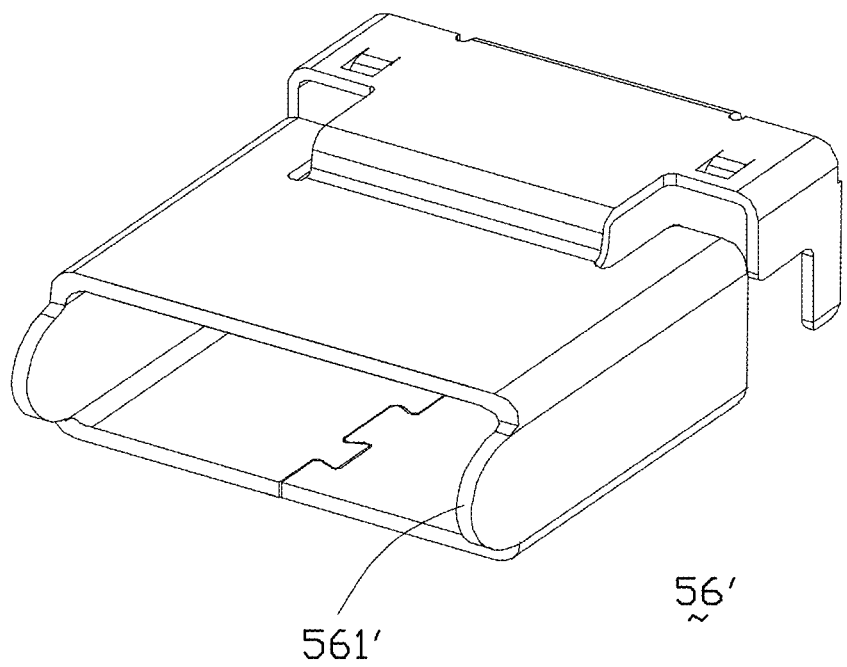
FIG. 50 is a perspective view of a metallic shell of the receptacle connector according to another embodiment.

Referring to FIG. 50, according to another embodiment similar to the first embodiment, to comply with the contour of the case in which the flippable receptacle connector is retained, the front edge of the metallic shield 56' may be no longer a straight line extending along a vertical direction but a curved structure 561', in a side view, with at least one rearwardly recessed portion on either the upper or lower side. Anyhow, the distance measured from the outermost point of the curved front edge structure may be still same as that of the original one disclosed in the first embodiment without such the rearwardly recessed portion.

Figure 51:
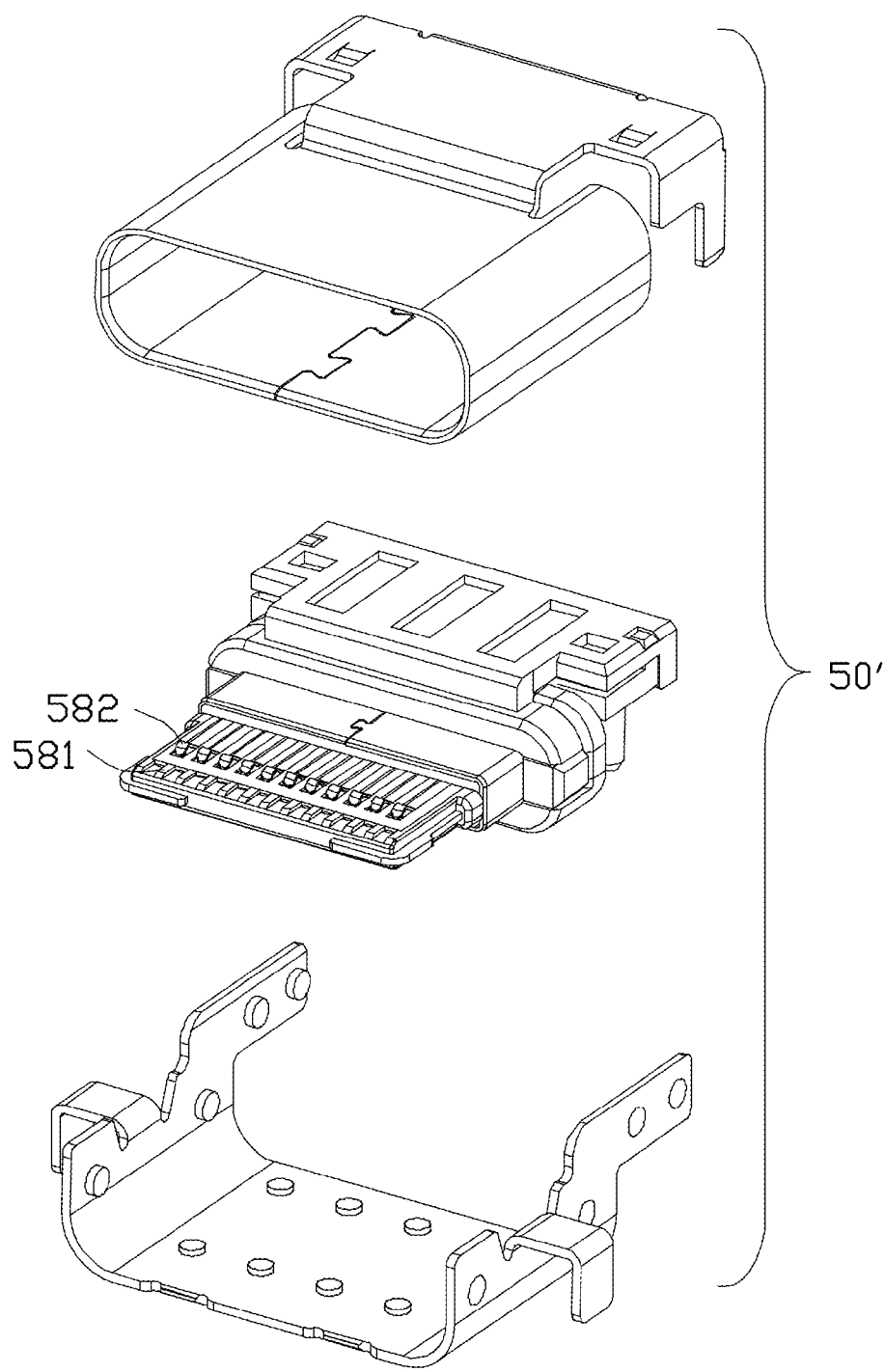
FIG. 51 is a perspective view of the receptacle connector according to another embodiment.

FIG. 51 shows another embodiment of the flippable receptacle connector 50' wherein the contacts on each face of the mating tongue include a plurality of stationary contacts 581 in the front row and a plurality of deflectable contacts 582 in the rear row. The detailed structure may be referred to U.S. Pat. No. 7,614,887.

Figure 52:
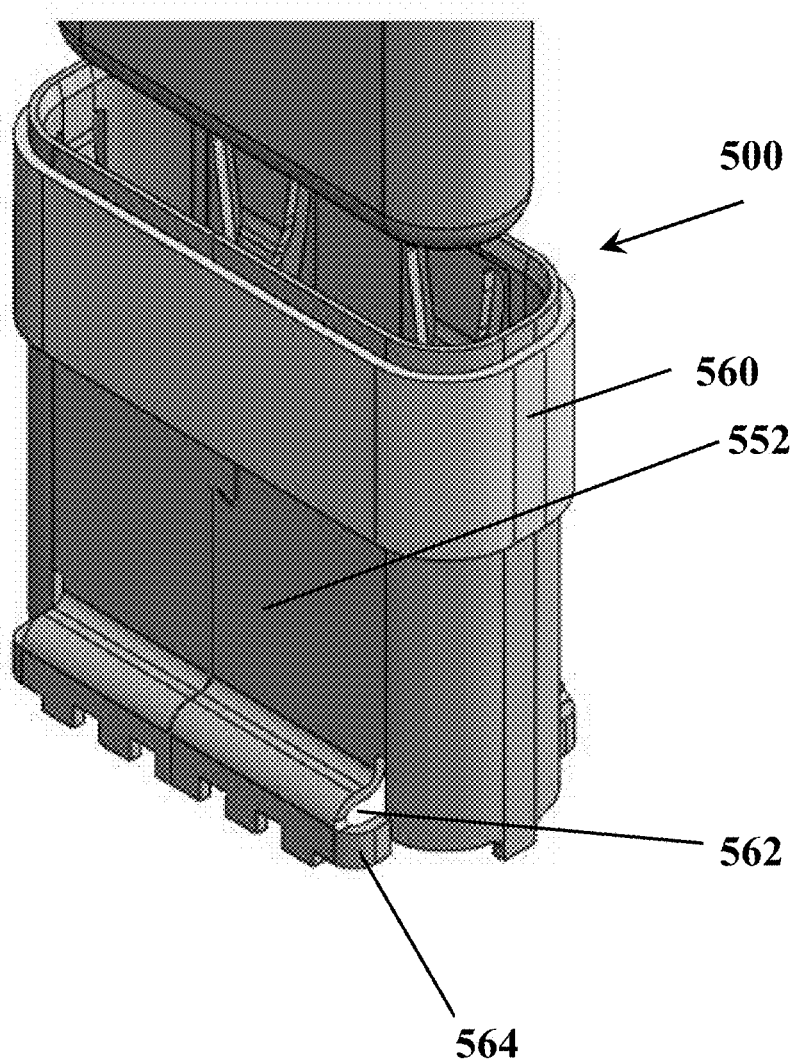
FIG. 52 is a perspective view of a metallic shell with an external bracket thereon, of a ninth embodiment of a vertical type receptacle connector according to the invention.
Figure 53:
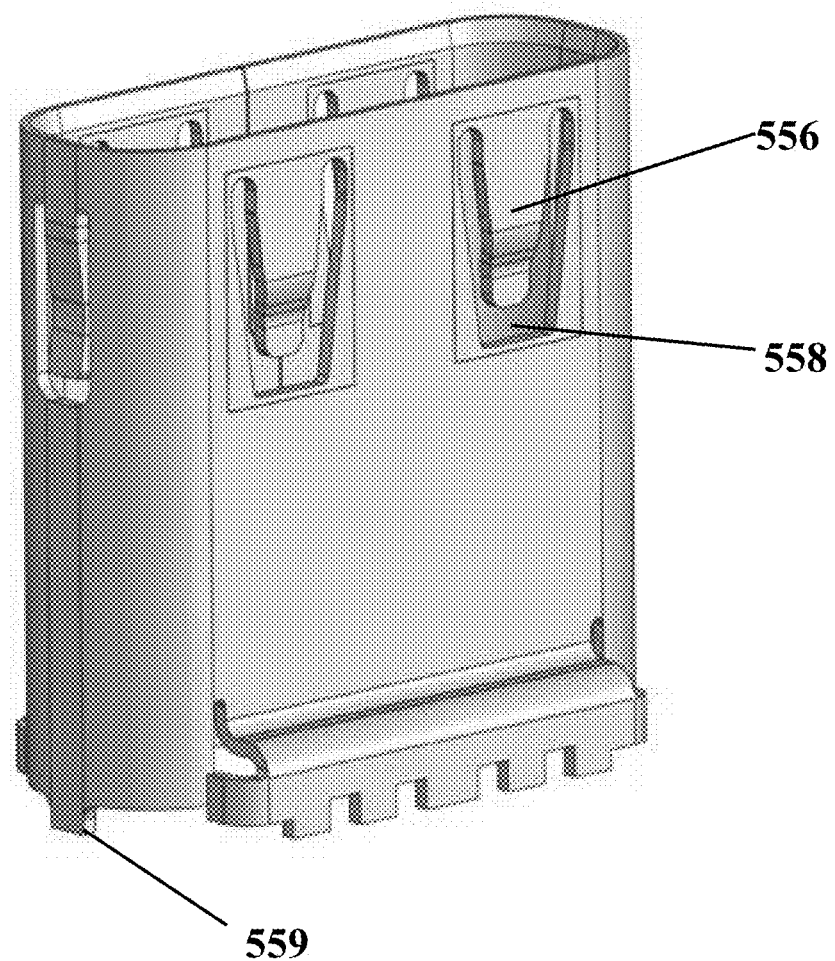
FIG. 53 is a perspective view of the shell of FIG. 50.

Referring to FIGS. 52-53, according to an ninth embodiment of the invention, the vertical receptacle connector 500 is directly mounted upon the printed circuit board in an upstanding manner and includes a metallic shield 552 enclosing an insulative housing wherein the shield 552 forms a plurality of spring tangs 556 via corresponding cutouts 558. A metallic bracket 560 surrounds the shield 552 and covers the spring tangs 556 and the corresponding cutouts 558. The bottom portion of the shield 552 is split to outwardly extend for increasing the mounting area of the receptacle connector 550 so as to form a relative large gap 562 exposing the inner housing. A horizontal extension 564 is unitarily formed on the bottom portion to cover the gap mostly. Understandably, both the bracket 560 and the horizontal extension 564 are to cover the corresponding cutout 558 and gap 562 for preventing EMI. On the other hand, the bracket 560 also aids in strength and waterproofing and the horizontal extension 564 helps on stability of the receptacle connector 500 on the printed circuit board. On the other hand, each of the lateral end side of the shield 552 is equipped with two grounding legs 559 instead of one to enhance the EMI protection.

However, the disclosure is illustrative only, changes may be made in detail, especially in matter of shape, size, and arrangement of parts within the principles of the invention.

What is claimed is:

1. A receptacle connector for use with a plug, comprising:
an insulative housing defining a base with a mating tongue forwardly extending therefrom in a front-to-back direction;
a plurality of contacts disposed in the housing with contacting sections exposed from the mating tongue and categorized with signal contacts, power contacts and grounding contacts;
a metallic shield enclosing the housing to define a capsular mating cavity in which said mating tongue is disposed and a metallic bracket positioned on the metallic shield; and
a metallic shielding plate embedded within said mating tongue;
wherein the shielding plates defines a pair of lateral edge sections configured to be adapted to be locked with a latch of the plug;
wherein the shielding plate is assembled with the mating tongue via an insert molding process while the contacts are configured to be forwardly assembled to corresponding passageways in the housing, and a tip of each of said contacts is inwardly tilted toward the shielding plate and protectively with a corresponding recession in the mating tongue;
wherein the tip of each of said contacts is further covered by a protection flange formed on the mating tongue;
wherein said contacts are arranged in two rows, and rear tails of the contacts in one row are laterally offset from corresponding front contacting sections and split into two groups while those of the contacts in the other row are aligned with the corresponding contacting sections in the front-to-back direction so as to have the tails of the contacts in said two rows are arranged in a staggered manner;
wherein the metallic shielding plate further unitarily forms a pair of contacting regions spaced therefrom in a parallel relation; and a pairs of spring arms located on two lateral sides thereof and
wherein the metallic bracket defines tabs to retain on the metallic shield.

2. The receptacle connector as claimed in claim 1, wherein the shield further includes a rear wall with two ears latched to two opposite sides of the shield.

3. The receptacle connector as claimed in claim 1, wherein the tails of the contacts in one row and those of the contacts in the other row extend in opposite directions.

4. A receptacle connector for use with a plug, comprising:
an insulative housing defining a base with a mating tongue forwardly extending therefrom in a front-to-back direction;
two rows of contacts disposed in the housing with contacting sections exposed upon the mating tongue and tails extending from the insulative housing;
a metallic shielding plate embedded within the insulative housing and defining a pair of lateral side edge sections configured to be adapted to be locked with a latch of the plug;
wherein the metallic shielding plate comprises a first shielding portion disposed in the mating tongue and between the contacting sections of the two rows of contacts, and a second shielding portion between the tails of the two rows of contacts; the pair of lateral side edge sections is defined on the first shielding portion;
wherein the shielding plate further unitarily forms a pair of contacting regions spaced therefrom in a parallel relation;
wherein the shielding plate further unitarily forms a pair of spring arms located on two lateral sides thereof and running across corresponding recesses defined in the base of housing to mechanically housing to mechanically and electrically connect to a shield surrounding the insulating housing;
wherein the receptacle connector further comprising a metallic shield surrounding the insulating housing and a metallic bracket positioned on the metallic shield, wherein the metallic shield defines a plurality of spring tangs at a first sidewall thereof and a plurality of dimples at a second sidewall opposite to the first sidewall for holding the plug, connector, the bracket is attached to the first sidewall of the shield to cover the spring tangs and seal the metallic shield; and
wherein the metallic bracket defines tabs to retain on the metallic shield.

5. The receptacle connector as claimed in claim 4, wherein each of the spring arms slantwise extends rearwards.

6. The receptacle connector as claimed in claim 4, wherein rear tails of the contacts in one row are laterally offset from corresponding front contacting sections and split into two groups while those of the contacts in the other row are aligned with the corresponding contacting sections in the front-to-back direction so as to have the tails of the contacts in said two rows are arranged in a staggered manner.

7. The receptacle connector as claimed in claim 4, wherein the tails of the contacts in one row and those of the contacts in the other row extend in opposite directions.

8. The receptacle connector as claimed in claim 4, further comprising a metallic shield surrounding the insulating housing, wherein the shield further includes a rear wall with two ears latched to two opposite sides of the shield.

9. The receptacle connector as claimed in claim 4, further comprising a metallic shield surrounding the insulating housing, wherein the shield further includes a rear wall with a surface mounting type tail bending forwards.

* * * * *